US007212434B2

US 7,212,434 B2

(12) United States Patent
Umezawa

(10) Patent No.: US 7,212,434 B2
(45) Date of Patent: May 1, 2007

(54) SEMICONDUCTOR MEMORY DEVICE WITH MOS TRANSISTORS, EACH INCLUDING A FLOATING GATE AND A CONTROL GATE, AND A MEMORY CARD INCLUDING THE SAME

(75) Inventor: Akira Umezawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 52 days.

(21) Appl. No.: 11/087,831

(22) Filed: Mar. 24, 2005

(65) Prior Publication Data

US 2005/0243602 A1    Nov. 3, 2005

(30) Foreign Application Priority Data

Apr. 28, 2004   (JP) .............................. 2004-134672

(51) Int. Cl.
*G11C 16/04* (2006.01)
(52) U.S. Cl. ..................... 365/185.01; 365/185.17; 365/189.01; 365/230.06
(58) Field of Classification Search ............ 365/185.01
See application file for complete search history.

(56) References Cited

U.S. PATENT DOCUMENTS

2003/0198083 A1* 10/2003 Akaogi et al. .......... 365/185.09
2005/0111288 A1*  5/2005 Shibata et al. ............... 365/232

FOREIGN PATENT DOCUMENTS

JP         2001-93288         4/2001

OTHER PUBLICATIONS

Kenichi Imamiya, et al. "A 125-mm² 1-Gb NAND Flash Memory With 10-MByte/s Program Speed", IEEE Journal of Solid-State Circuits, vol. 37, No. 11, Nov. 2002, pp. 1493-1501.

Wei-Hua Liu, et al. "A 2-Transistor Source-select (2TS) Flash EEPROM for 1.8V-Only Applications", Non-Volatile Semiconductor Memory Workshop 4.1, 1997, pp. 1-3.

(Continued)

*Primary Examiner*—Thong Q. Le
(74) *Attorney, Agent, or Firm*—Oblon, Spivak, McClelland, Maier & Neustadt, P.C.

(57) ABSTRACT

A semiconductor memory device includes memory cells, a memory cell array, word lines, latch circuits, first row decoders, second row decoders, first isolating transistors, and second isolating transistors. The memory cell includes a memory cell transistor having a floating gate and a control gate. The memory cell array includes the memory cells arranged in a matrix. The word line connects in common the control gates of the memory cell transistors in a same row. The first row decoder applies a positive voltage to the word lines in a write operation and in an erase operation. The second row decoder applies a negative voltage to the word lines in a write operation and in an erase operation. The first isolating transistor switches between the first row decoder and the word line. The second isolating transistor switches between the second row decoder and the word line.

17 Claims, 61 Drawing Sheets

OTHER PUBLICATIONS

Ken Takeuchi, et al. "A Negative Vth Cell Architecture for Highly Scalable, Excellently Noise Immune and Highly Reliable NAND Flash Memories", 1998 Symposium on VLSI Circuits Digest of Technical Papers, pp. 234-235.

Do Dormans, et al. "High-Density Low-Voltage Byte-Erasable EEPROM Memory Based on a 2T-FNFN Flash Cell"; IEEE NVSMW 2003; Feb. 17, 2003; pp. 21-22.

Ton Ditewig, et al. "An Embedded 1.2V-Read Flash Memory Module in a 0.18 μm Logic Process"; Digest of Technical Papers/ ISSCC 2001/ Session 2/ Non-Volatile Memories/ 2.4; Feb. 5, 2001; 3 pages.

* cited by examiner

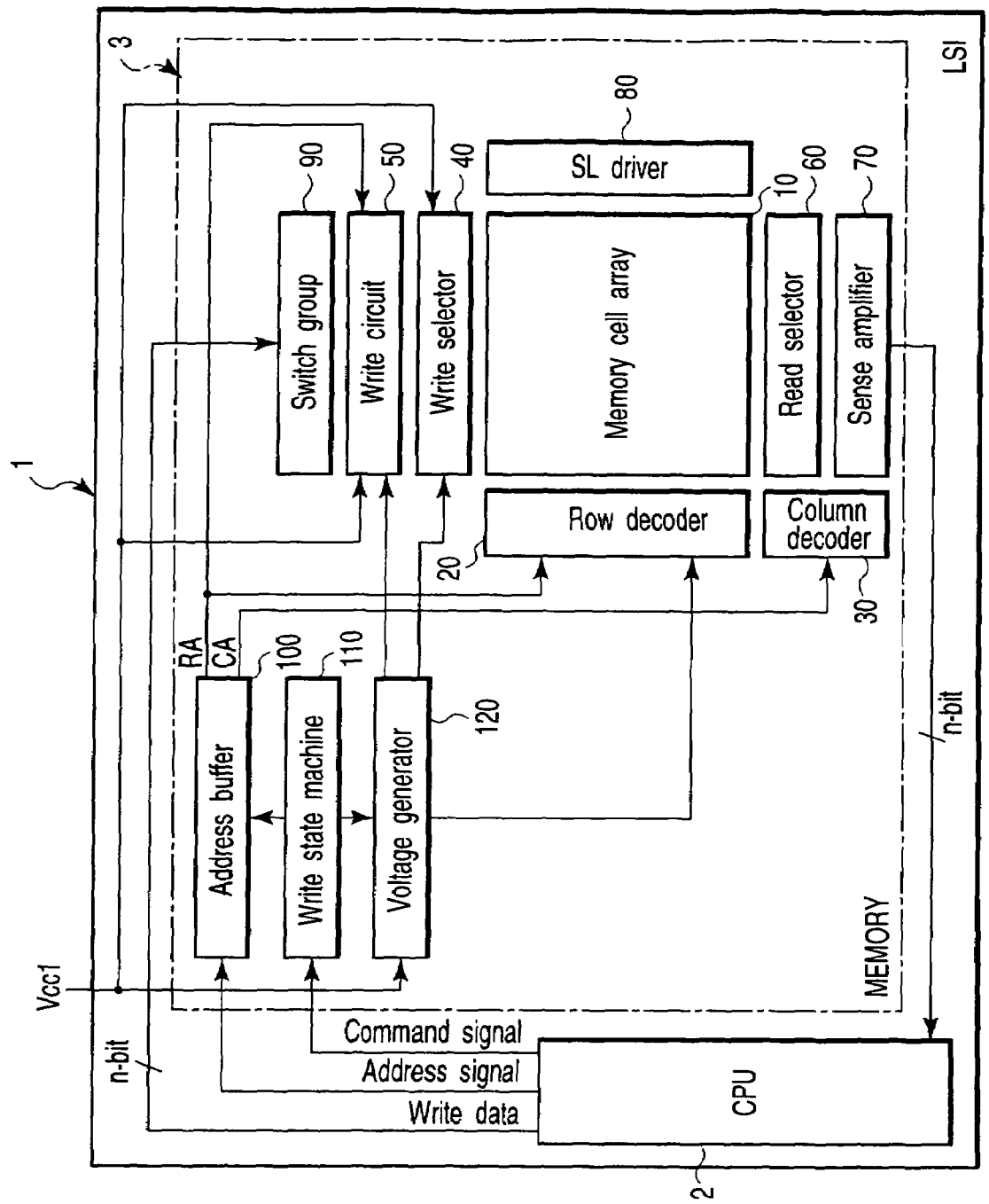
F I G. 1

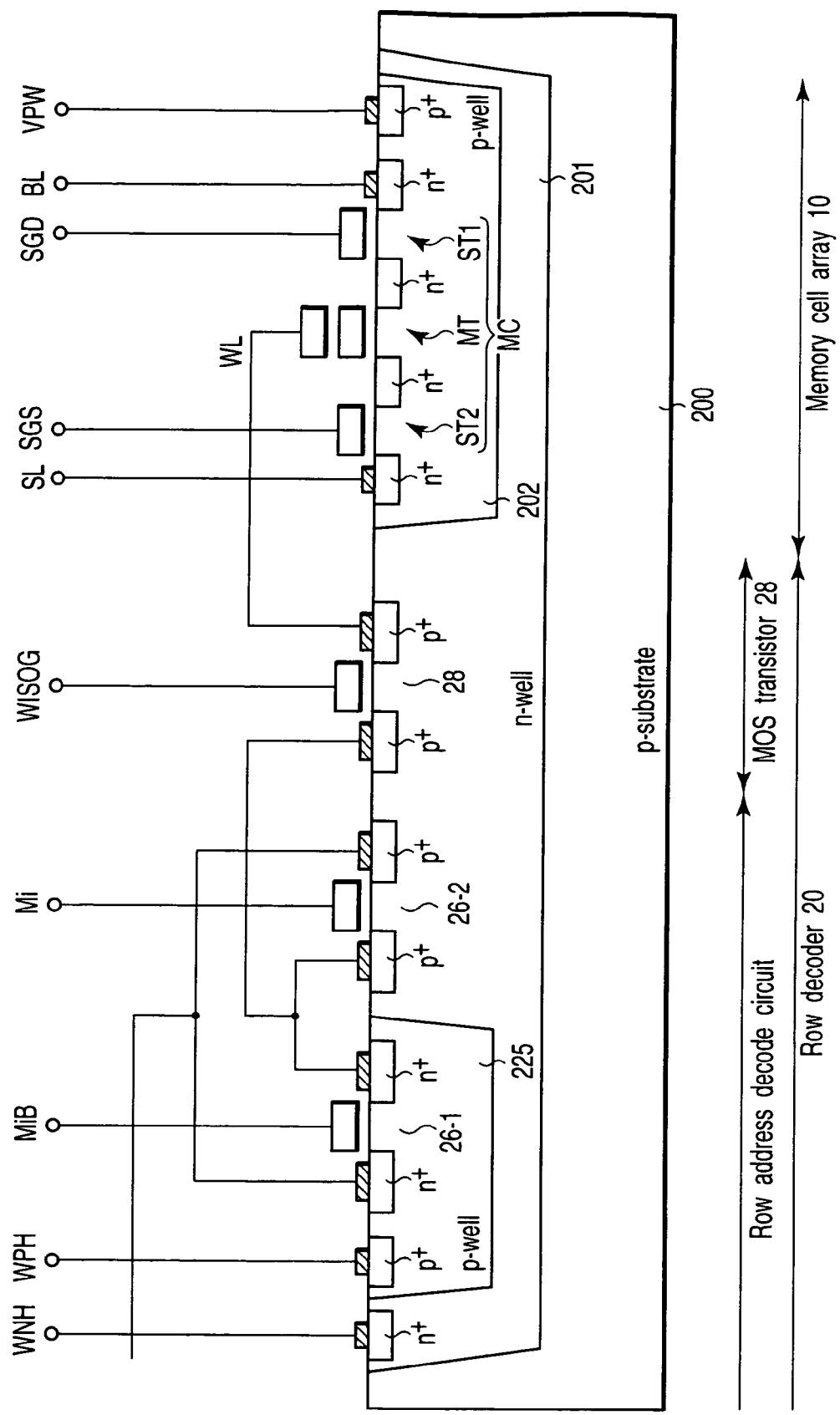
F I G. 9

|  |  | BL | WL | SGD | SGS | VPW |
|---|---|---|---|---|---|---|
| ERASE | Selected | 12V | -8V | 12V | 12V | 12V |
|  | Unselected | 12V | 3V | 12V | 12V | 12V |
| WRITE | Selected | -6V | 11V | -3.5V | -6V | -6V |
|  | Unselected(column) | -3.5V | 11V | -6V | -6V | -6V |
|  | Unselected(row) | -6V | FL | -6V | -6V | -6V |
|  | Unselected | -3.5V | FL | -6V | -6V | -6V |

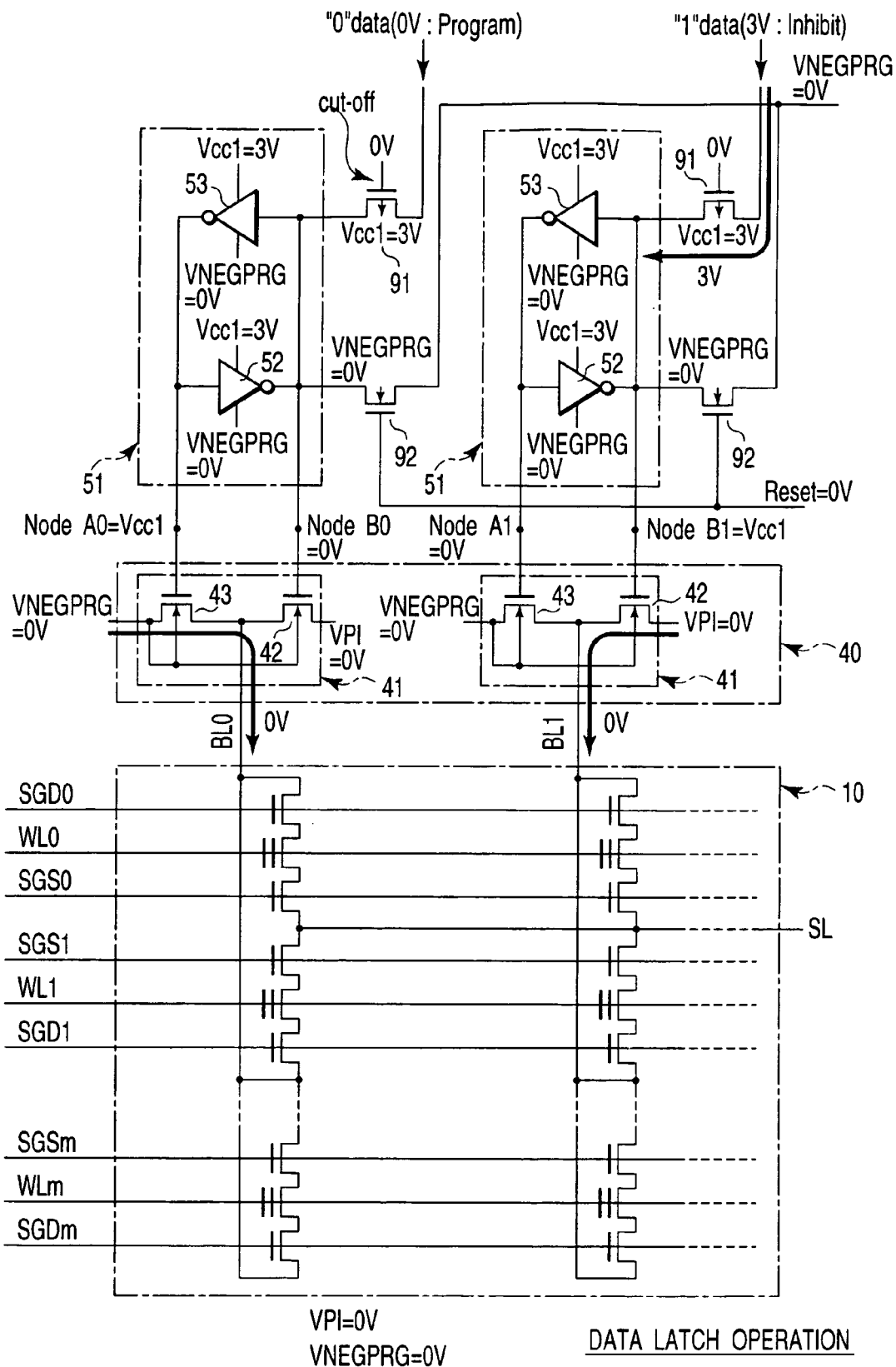
F I G. 14

READ OPERATION

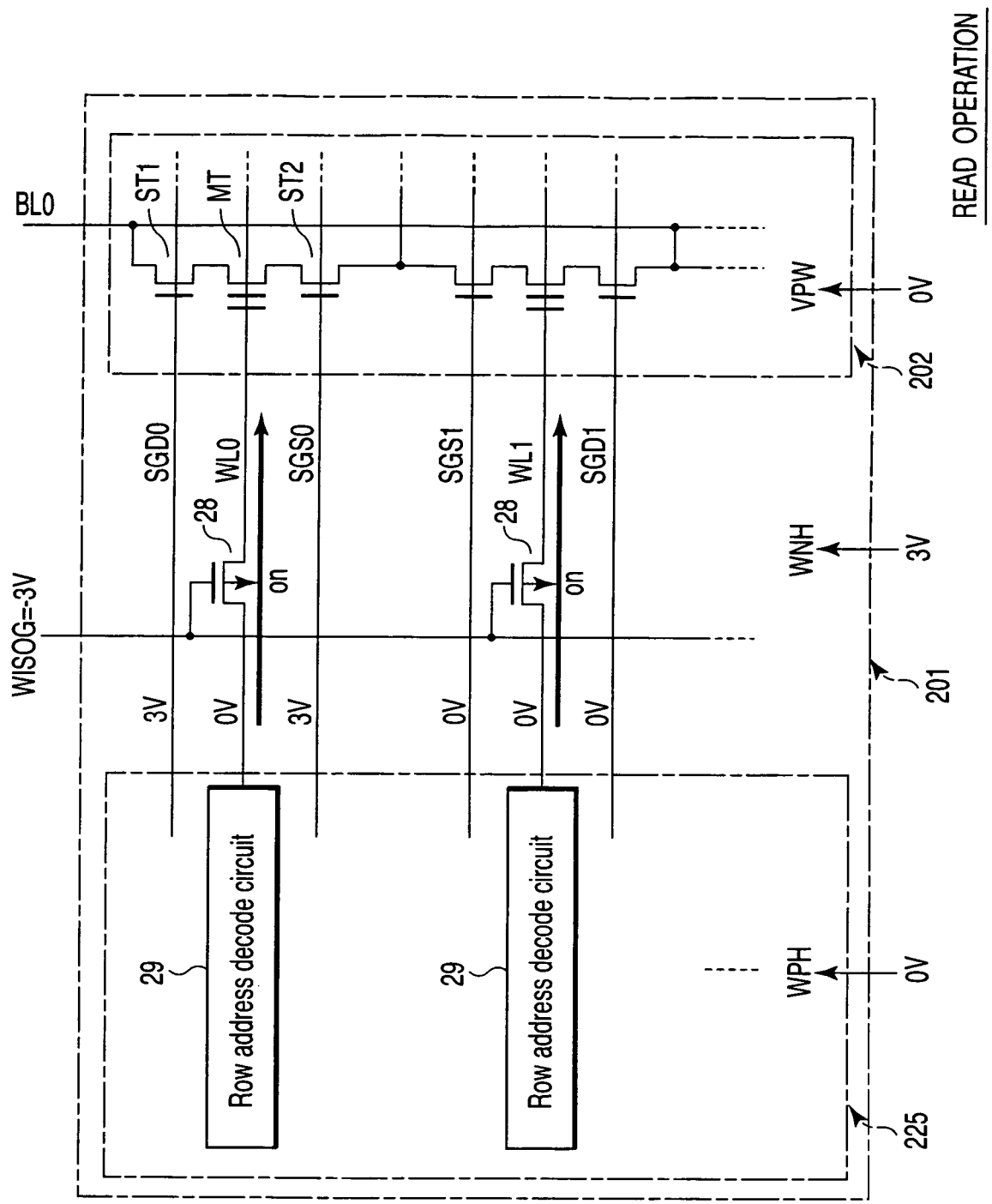
F I G. 20

Lg1=1.2μm＞Lg2=0.7μm
Gox1=400Å＞Gox2=150～170Å

|  |  | BL | WL | SGD | SGS | VPW |
|---|---|---|---|---|---|---|
| ERASE | Selected | 12V | -8V | 12V | 12V | 12V |
|  | Unselected | 12V | 12V | 12V | 12V | 12V |
| WRITE | Selected | -6V | 11V | -3.5V | -6V | -6V |
|  | Unselected(column) | -3.5V | 11V | -6V | -6V | -6V |
|  | Unselected(row) | -6V | -6V | -6V | -6V | -6V |
|  | Unselected | -3.5V | -6V | -6V | -6V | -6V |

FIG. 28

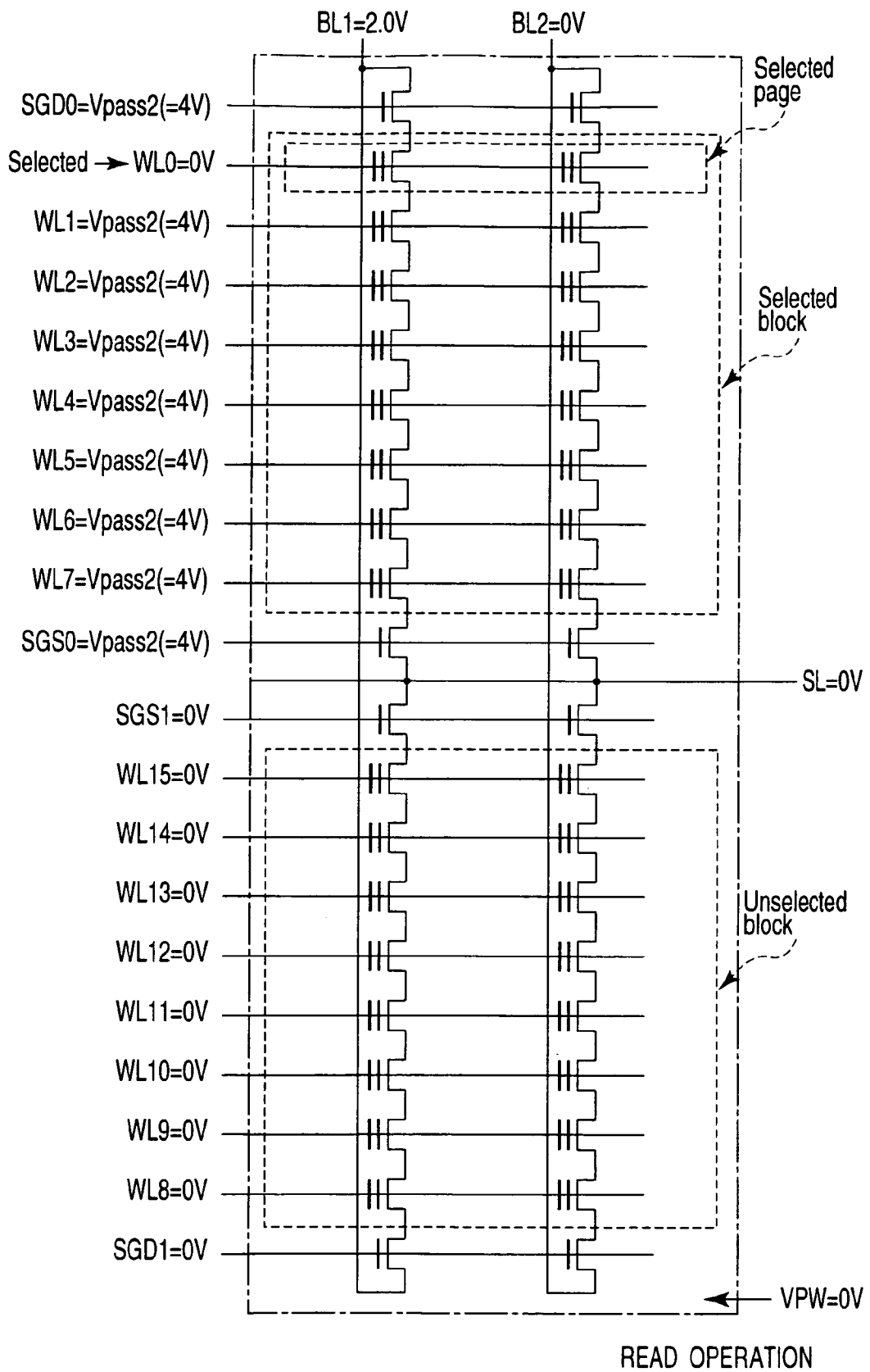
F I G. 46

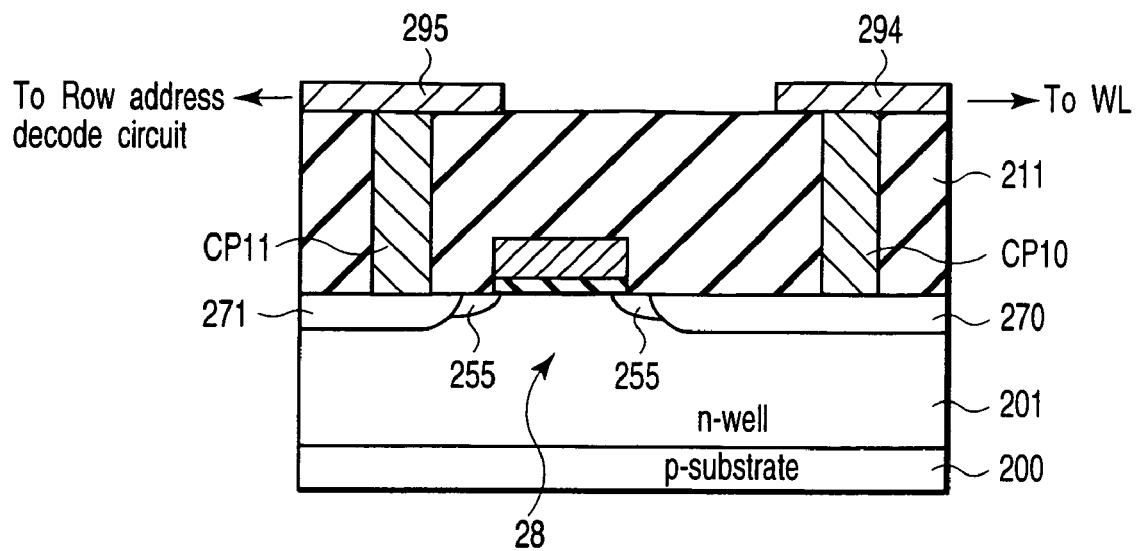
F I G. 6 0
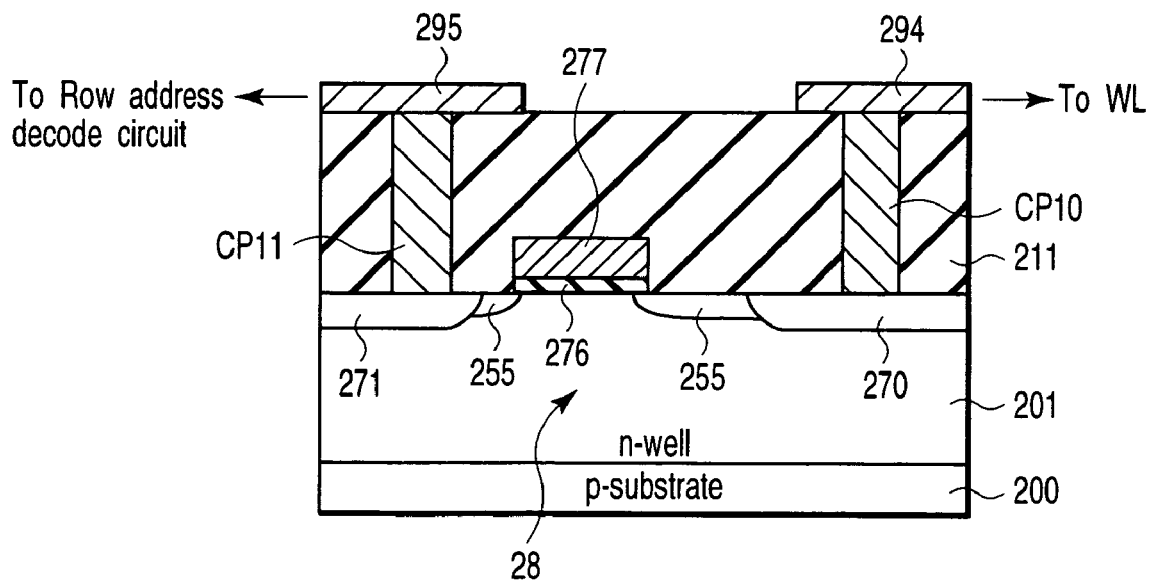
F I G. 6 1

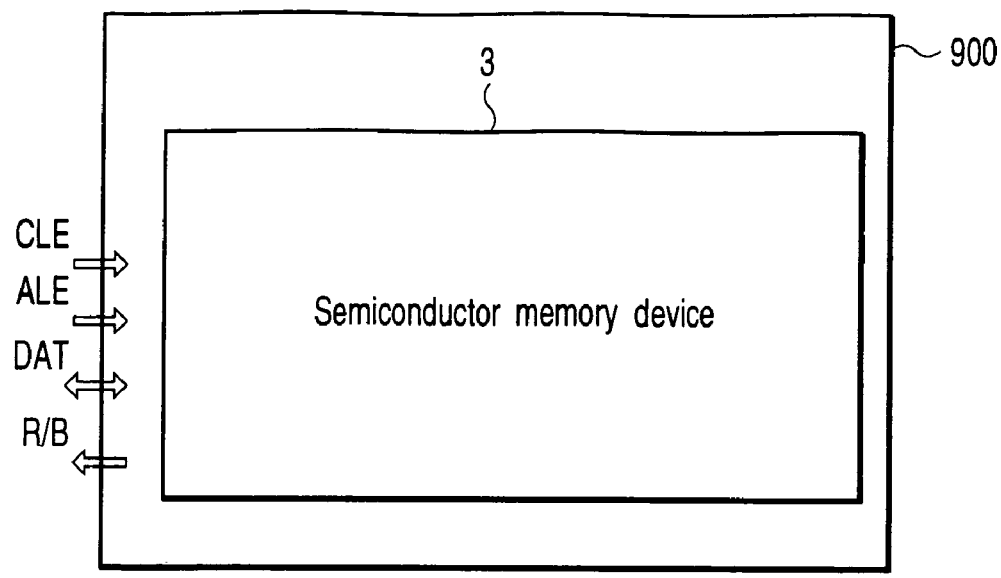
F I G. 6 3
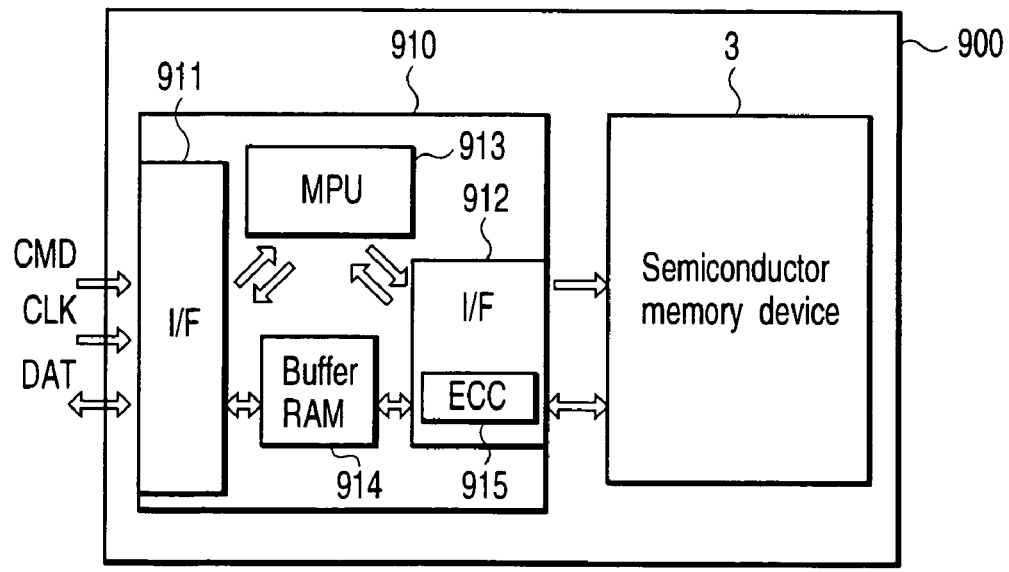
F I G. 6 4

SEMICONDUCTOR MEMORY DEVICE WITH MOS TRANSISTORS, EACH INCLUDING A FLOATING GATE AND A CONTROL GATE, AND A MEMORY CARD INCLUDING THE SAME

CROSS-REFERENCE TO RELATED APPLICATIONS

This application is based upon and claims the benefit of priority from prior Japanese Patent Application No. 2004-134672, filed Apr. 28, 2004, the entire contents of which are incorporated herein by reference.

BACKGROUND OF THE INVENTION

1. Field of the Invention

This invention relates to a semiconductor memory device with MOS transistors, each including a floating gate and a control gate, and to a memory card including the semiconductor memory device. More particularly, this invention relates to a nonvolatile semiconductor memory device, such as a flash memory.

2. Description of the Related Art

Various types of flash memories have been proposed for a variety of uses.

For instance, a NAND flash memory has been known as a data storage memory for use in a digital camera or the like. A NAND flash memory has been described in, for example, Imamiya K., et al., "A 125-mm/sup 2/1-Gb NAND Flash Memory With 10-Mbytes/s Program Speed," IEEE Journal of Solid-State Circuits, Vol. 37, No. 11, November, 2002, pp. 1493–1501.

Another known flash memory is a NOR flash memory which writes and erases data by using FN tunneling. A NOR flash memory has one memory cell transistor and two select transistors (hereinafter, referred to as a 3Tr-NAND flash memory). A 3Tr-NAND flash memory has been written in, for example, Ditewig T., et al., "An Embedded 1.2-V Read Flash Memory Module in a 0.18-μm Logic Process," Solid-State Circuits Conference, 2001 Digest of Technical Papers ISSCC. 2001 IEEE International 5–7, February, 2001, pp. 34–35, 425.

Furthermore, in recent years, a flash memory combining the features of the NOR flash memory and the NAND flash memory has been proposed. A flash memory of this type has memory cells, each including one memory cell transistor and one select transistor (hereinafter, referred to as a 2Tr flash memory). A 2Tr flash memory has been disclosed in, for example, Wei-Hua Liu, "A 2-Transistor Source-select (2TS) Flash EEPROM for 1.8-V-Only Application," Non-Volatile Semiconductor Memory Workshop 4.1, 1997.

With the recent progress in the processing technology, the memory cells are being miniaturized more in the above flash memories. However, it has been difficult to reduce the size of the peripheral circuits around the memory cell array, particularly the size of the decoder circuits.

BRIEF SUMMARY OF THE INVENTION

According to an aspect of the present invention, there is provided a semiconductor memory device comprising: memory cells which include memory cell transistors, each of the transistors having a floating gate and a control gate; a memory cell array in which the memory cells are arranged in a matrix; bit lines each of which connects in common the drains of the memory cell transistors in a same column electrically; word lines each of which connects in common the control gates of the memory cell transistors in a same row; latch circuits which are provided for the bit lines in a one-to-one correspondence and which hold write data; a voltage generator which generates a negative voltage and a positive voltage; first row decoders which are provided for the word lines in a one-to-one correspondence and which apply the positive voltage generated by the voltage generator to the word lines in a write operation and in an erase operation; second row decoders which are provided for the word lines in a one-to-one correspondence and which apply the negative voltage generated by the voltage generator to the word lines in a write operation and in an erase operation; first isolating transistors which are provided for the word lines in a one-to-one correspondence and which switch between the first row decoders and the word lines; and second isolating transistors which are provided for the word lines in a one-to-one correspondence and which switch between the second row decoders and the word lines.

According to another aspect of the present invention, there is provided a memory card which comprises a semiconductor memory device comprising: memory cells which include memory cell transistors, each of the transistors having a floating gate and a control gate; a memory cell array in which the memory cells are arranged in a matrix; bit lines each of which connects in common the drains of the memory cell transistors in a same column electrically; word lines each of which connects in common the control gates of the memory cell transistors in a same row; latch circuits which are provided for the bit lines in a one-to-one correspondence and which hold write data; a voltage generator which generates a negative voltage and a positive voltage; first row decoders which are provided for the word lines in a one-to-one correspondence and which apply the positive voltage generated by the voltage generator to the word lines in a write operation and in an erase operation; second row decoders which are provided for the word lines in a one-to-one correspondence and which apply the negative voltage generated by the voltage generator to the word lines in a write operation and in an erase operation; first isolating transistors which are provided for the word lines in a one-to-one correspondence and which switch between the first row decoders and the word lines; and second isolating transistors which are provided for the word lines in a one-to-one correspondence and which switch between the second row decoders and the word lines.

BRIEF DESCRIPTION OF THE SEVERAL VIEWS OF THE DRAWING

FIG. 1 is a block diagram of a system LSI according to a first embodiment of the present invention;

FIG. 9 is a sectional view taken in the row direction of the 3Tr-NAND flash memory in the first embodiment;

FIG. 14 is a circuit diagram of the memory cell array, write selector, write circuit, and switch group in a data latch operation of the 3Tr-NAND flash memory of the first embodiment;

FIG. 20 is a circuit diagram of the memory cell array and row decoder in a read operation of the 3Tr-NAND flash memory of the first embodiment;

FIG. 28 shows the relationship between voltages in an erase operation and in a write operation of the 3Tr-NAND flash memory in the second embodiment;

FIG. 46 is a circuit diagram of the memory cell array in a read operation of the NAND flash memory of the third embodiment;

FIG. 60 is a sectional view of an isolating transistor included in a flash memory according to a second modification of the first to sixth embodiments;

FIG. 61 is a sectional view of an isolating transistor included in a flash memory according to a third modification of the first to sixth embodiments;

FIG. 63 is a block diagram of a memory card including a flash memory according to the first to sixth embodiments;

FIG. 64 is a block diagram of a memory card including a flash memory according to the first to sixth embodiments;

DETAILED DESCRIPTION OF THE INVENTION

Figure 2:
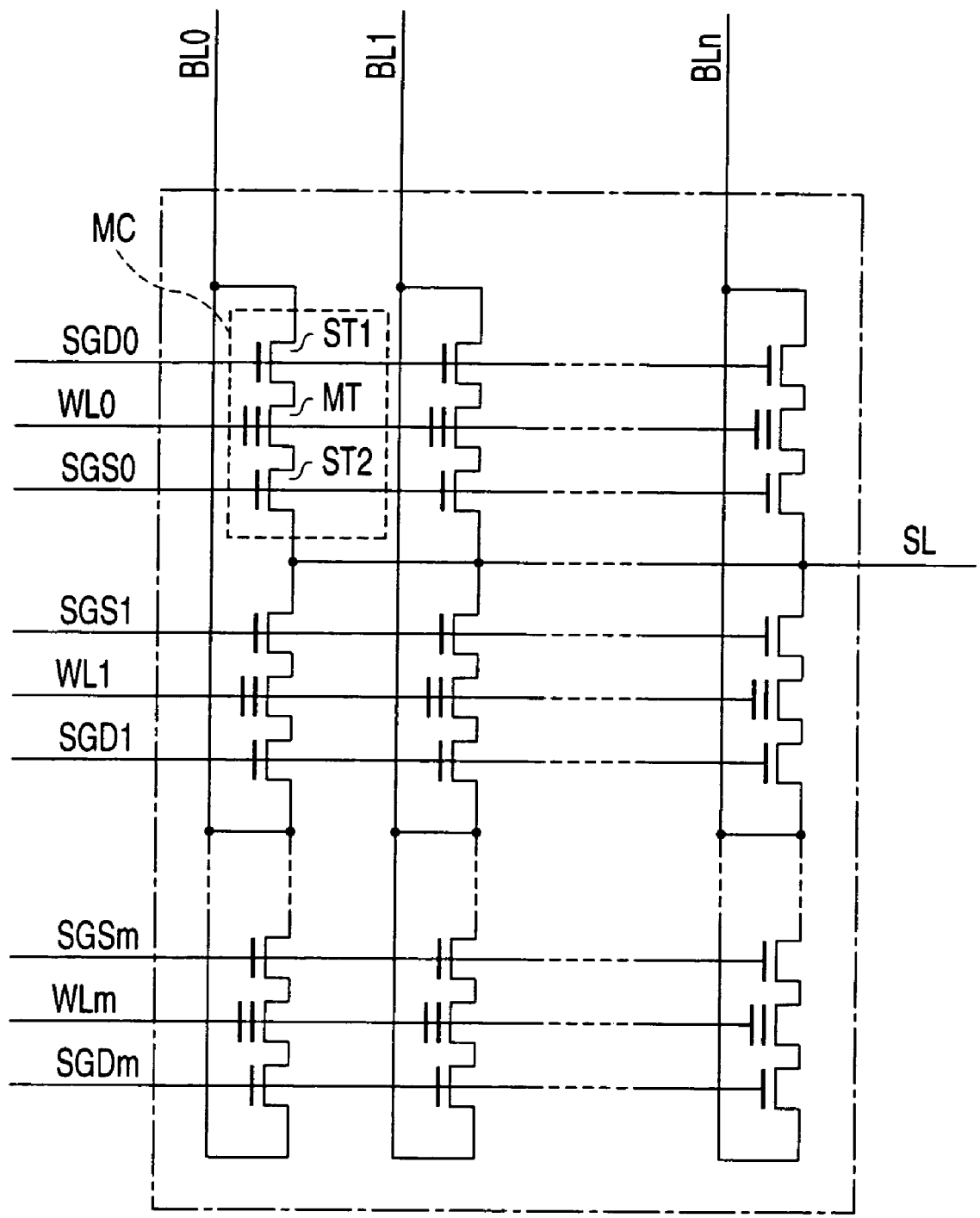
FIG. 2 is a circuit diagram of a memory cell array of a 3Tr-NAND flash memory according to the first embodiment.

A semiconductor memory device according to a first embodiment of the present invention will be explained by reference to FIG. 1.

FIG. 1 is a block diagram of a system LSI according to the first embodiment.

As shown in FIG. 1, the system LSI 1 comprises a CPU 2 and a 3Tr-NAND flash memory 3. The CPU 2 exchanges data with the flash memory 3. The flash memory 3 comprises a memory cell array 10, a row decoder 20, a column decoder 30, a write selector 40, a write circuit 50, a read selector 60, a sense amplifier 70, a source line driver 80, a switch group 90, an address buffer 100, a write state machine 110, and a voltage generator 120. A voltage of Vcc1 (about 3V) is externally applied to the LSI 1. The voltage Vcc is applied to the voltage generator 120, write circuit 50, and write selector 40.

The memory cell array 10 has a plurality of memory cells arranged in a matrix. The configuration of the memory cell array 10 will be explained by reference to FIG. 2. FIG. 2 is a circuit diagram of a part of the memory cell array 10.

As shown in FIG. 2, the memory cell array 10 has a plurality of ((m+1)×(n+1)) memory cells MCs (m and n are natural numbers) arranged in a matrix. Each of the memory cell MCs includes a memory cell transistor MT and select transistors ST1, ST2, which have their current paths connected in series with one another. The current path of the memory cell transistor MT is connected between the current paths of the select transistors ST1, ST2. The memory cell transistor MT has a stacked gate structure that includes a floating gate formed above a semiconductor substrate with a gate insulating film interposed therebetween and a control gate formed on the floating gate with an inter-gate insulating film interposed therebetween. The source region of the select transistor ST1 is connected to the drain region of the memory cell transistor MT. The source region of the memory cell transistor MT is connected to the drain region of the select transistor ST2. Memory cells adjoining each other in the column direction share the drain region of the select transistor ST1 or the source region of the select transistor ST2.

The control gates of the memory cell transistors MTs of the memory cells MCs in a same row are connected in common to any one of the word lines WL0 to WLm. The gates of the select transistors ST1 of the memory cells in a same row are connected in common to any one of select gate lines SGD0 to SGDm. The gates of the select transistors ST2 of the memory cells in a same row are connected in common to any one of select gate lines SGS0 to SGSm. The drain regions of the select transistors ST1 of the memory cells MCs in a same column are connected in common to any one of bit lines BL0 to BLn. The sources of the select transistors ST2 of the memory cells MCs are connected in common to a source line SL and then connected to the source line driver 80.

Referring to FIG. 1, the explanation of the LSI 1 will be continued.

Figure 3:
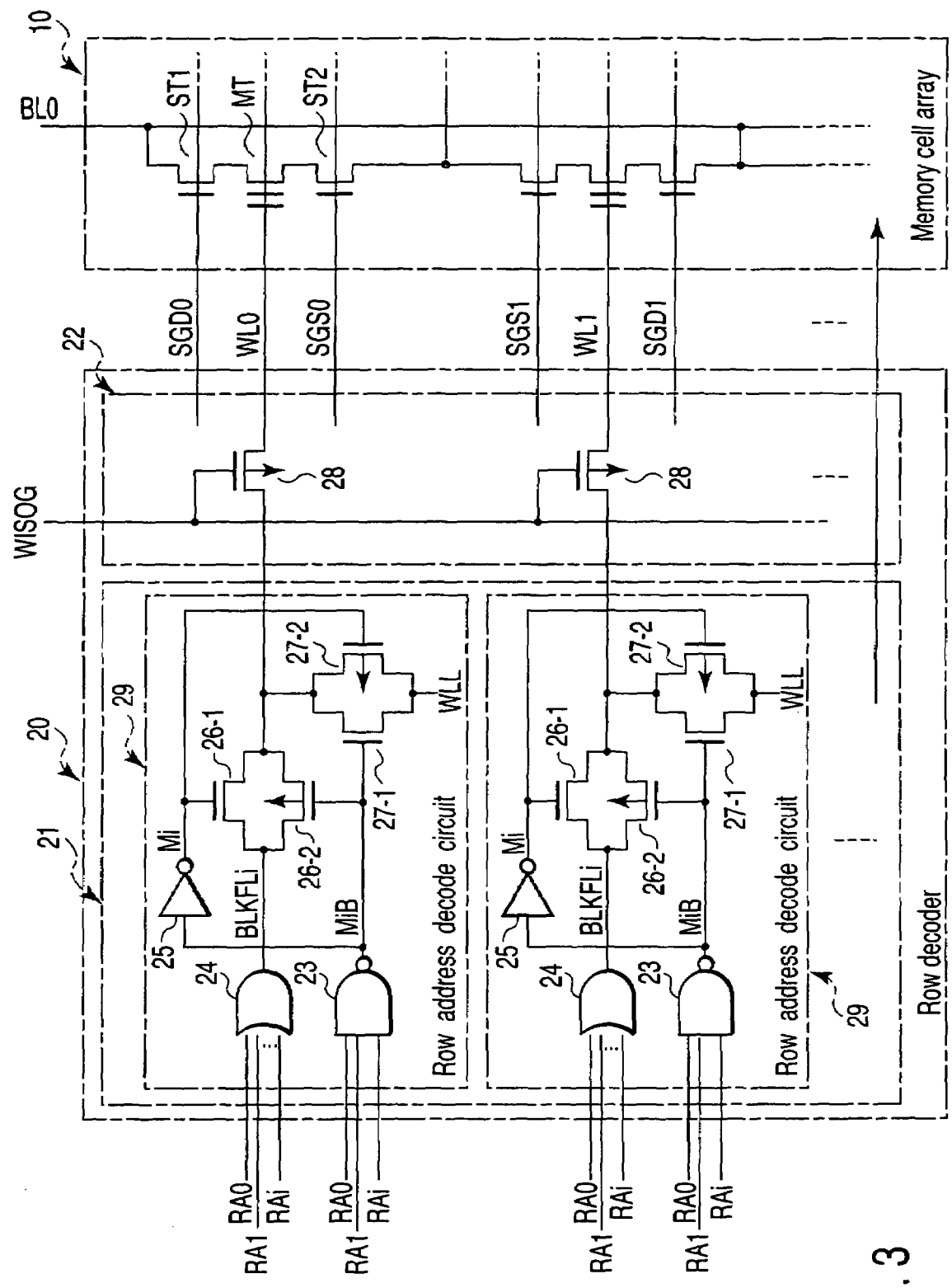
FIG. 3 is a circuit diagram of a memory cell array and a row decoder included in the 3Tr-NAND flash memory of the first embodiment.

The row decoder 20 decodes a row address signal, thereby producing a row address decode signal. Then, the row decoder 20 selects any one of the word lines WL0 to WLm and select gate lines SGS0 to SGDm and SGD0 to SGDm. The configuration of the row decoder 20 will be explained by reference to FIG. 3, particularly centering on the configuration related to the selection of word lines. FIG. 3 is a circuit diagram of the row decoder 20.

As shown in FIG. 3, the row decoder 20 includes a row address decode circuit group 21 and a switch element group 22. The row address decode circuit group 21 has row address decode circuits 29 provided for the word lines in a one-to-one correspondence. Each of the row address decode circuits 29 includes a NAND gate 23, an OR gate 24, an inverter 25, n-channel MOS transistors 26-1, 27-1, and p-channel MOS transistors 26-2, 27-2. The NAND gate 23 performs NAND operation on an (i+1)-bit row address signal. Hereinafter, the result of the NAND operation is referred to as the MiB signal. The OR gate 24 performs OR operation on the row address signal. Hereinafter, the result of the OR operation is referred to as the BLKFLi signal. The inverter 25 inverts the MiB signal. Hereinafter, the inverted MiB signal is referred to as the Mi signal. One end of the current path of the MOS transistor 26-1 is connected to one end of the current path of the MOS transistor 26-2. The other ends of the MOS transistors 26-1, 26-2 are connected to each other. The BLKFLi signal is input to the common one end of the current paths. The Mi signal is input to the gate of the MOS transistor 26-1. The MiB signal is input to the gate of the MOS transistor 26-2. The common other end of the current paths makes the output of the row address decode circuit 29. One end of the current path of the MOS transistor 27-1 is connected to one end of the current path of the MOS transistor 27-2. The other ends of the MOS transistors 27-1, 27-2 are connected to each other. The common one end of the current paths is connected to the common other end of the current paths of the MOS transistors 26-1, 26-2. The MiB signal is input to the gate of the MOS transistor 27-1. The Mi signal is input to the gate of the MOS transistor 27-2. The other end of the current path of the MOS transistors 27-1 and 27-2 is connected to node WLL. A negative potential, a positive potential, or 0V is applied to node WLL.

Specifically, when the MiB signal is high (at "H" level), the MOS transistors 26-1, 26-2 are off and the MOS transistors 27-1, 27-2 are on, with the result that the output of the row address decode circuit 29 is the same as the potential at node WLL. In addition, when the MiB signal is low (at "L" level), the MOS transistors 26-1, 26-2 are on and the MOS transistors 27-1, 27-2 are off, with the result that the output of the row address decode circuit 29 is at BLKFLi.

The switch group 22 has p-channel MOS transistors 28 provided for the word lines in a one-to-one correspondence. The gates of a plurality of MOS transistors 28 are connected in common to node WISOG. The sources of the MOS transistors 28 are connected to the corresponding row address decode circuits 29. The drains of the MOS transistors 28 are connected to the corresponding word lines. Hereinafter, the MOS transistors 28 are referred to as the isolating transistors.

The row address decode circuit 29 applies a voltage of VPW to a p-well region in which the memory cell array 10 is formed.

Referring to FIG. 1, the explanation of LSI 1 will be continued.

The column decoder 30 decodes a column address signal, thereby producing a column address decode signal.

The read selector 60 selects any one of the bit lines BL0 to BLn on the basis of the column address decode signal in a read operation.

The sense amplifier 70 amplifies the data read from the memory cell MC selected by the row decoder 20 and column decoder 30.

The write circuit 50 latches write data.

The write selector 40 applies a write voltage to the selected bit line and a write inhibit voltage to the unselected bit lines.

The switch group 90 transfers the write data supplied from the CPU 2 to the write circuit 50.

Figure 4:
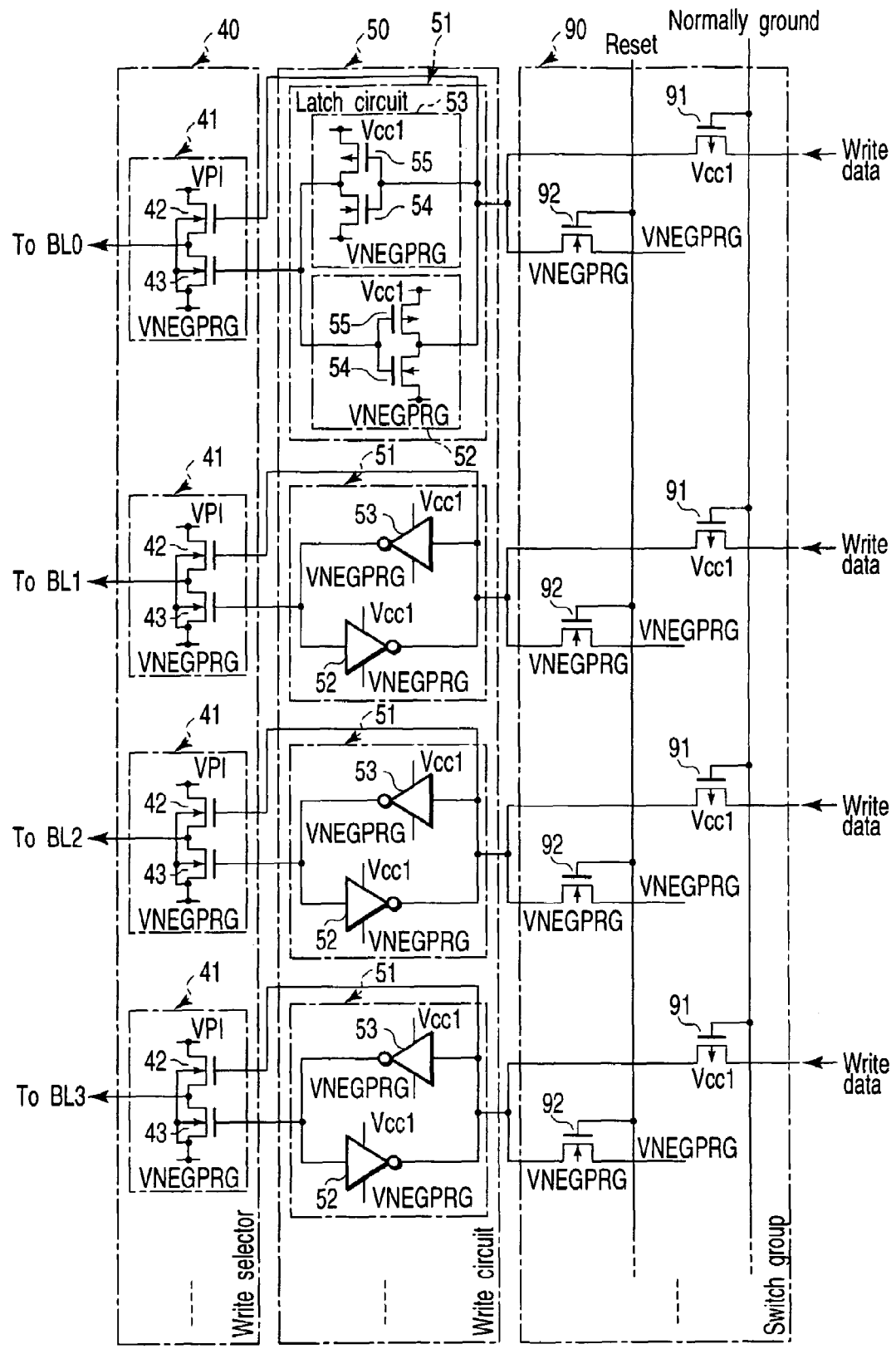
FIG. 4 is a circuit diagram of a write selector, a write circuit, and a switch group included in the 3Tr-NAND flash memory of the first embodiment.

The configuration of the write circuit 50, write selector 40, and switch group 90 will be explained by reference to FIG. 4. FIG. 4 is a circuit diagram of the write circuit 50, write selector 40, and switch group 90.

First, the write selector 40 will be explained. The write selector 40 has select circuits 41 provided for the bit lines BL0 to BLn in a one-to-one correspondence. Each of the select circuits 41 includes two n-channel MOS transistors 42, 43. A write inhibit voltage of VPI is applied to the source of the n-channel MOS transistor 42. The drain of the n-channel MOS transistor 42 is connected to the corresponding bit line. A write voltage of VNEGPRG is applied to the source of the n-channel MOS transistor 43. The drain of the n-channel MOS transistor 43 is connected to the corresponding bit line and to the drain of the n-channel MOS transistor 42. The write voltage VNEGPRG is applied to the back gates of the n-channel MOS transistors 42, 43.

Next, the write circuit 50 will be explained. The write circuit 50 has latch circuits 51 provided for the bit lines BL0 to BLn in a one-to-one correspondence. Each of the latch circuits 51 includes two inverters 52, 53. The input terminal of the inverter 52 is connected to the output terminal of the inverter 53. The output terminal of the inverter 52 is connected to the input terminal of the inverter 53. The junction node of the input terminal of the inverter 52 and the output terminal of the inverter 53, which makes the output node of the latch circuit 51, is connected to the corresponding bit line. Each of the inverters 52, 53 includes an n-channel MOS transistor 54 and a p-channel MOS transistor 55 whose current paths are connected in series with each other. The write voltage VNEGPRG is applied to the source of the n-channel MOS transistor 54. Vcc1 (=3V constant) is applied to the source of the p-channel MOS transistor 55. That is, the inverters 52, 53 operate using Vcc1 and VNEGPRG as a low-voltage-side and high-voltage-side power-supply voltages, respectively. The gate of the n-channel MOS transistor 54 and the gate of the p-channel MOS transistor 55 are connected to each other. The junction node of the drain of the p-channel MOS transistor 55 and the drain of the n-channel MOS transistor 54 in the inverter 53 is connected to the junction node of the gate of the p-channel MOS transistor 55 and the gate of the n-channel MOS transistor 54 in the inverter 52 and is further connected to the corresponding bit line. The junction node of the drain of the p-channel MOS transistor 55 and the drain of the n-channel MOS transistor 54 in the inverter 52 is connected to the junction node of the gate of the p-channel MOS transistor 55 and the gate of the n-channel MOS transistor 54 in the inverter 53. The junction node makes the input node of the latch circuit 51.

The switch group 90 has p-channel MOS transistors 91 and n-channel MOS transistors 92 (hereinafter, the MOS transistors 92 are referred to as the reset transistors) provided for the latch circuits 51 in a one-to-one correspondence. Write data is input to one end of the current path of each of the p-channel MOS transistors 91. The other end of the current path is connected to the input node of the corresponding latch circuit 51. The gate of the MOS transistor 91 is constantly grounded. Vcc1 is applied to the back gate of the MOS transistor 91. The write voltage VNEGPRG is applied to one end of the current path of the reset transistor and its back gate. The other end of the current path of the reset transistor is connected to the input node of the corresponding latch circuit and to the other end of the current path of the p-channel MOS transistor 91. The gates of all the reset transistors 92 are connected to one another and supplied with a reset signal Reset. One-end-sides of the current paths of the reset transistors 92 are connected to one another and applied with VNEGPRG simultaneously.

Referring to FIG. 1, the explanation of LSI 1 will be continued.

The source line driver 80 supplies a voltage to the source line SL.

The address buffer 100 holds an address signal supplied from the CPU 2. Then, the address buffer 100 supplies a column address signal CA to the column decoder 30 and a row address signal RA to the row decoder 20 and to the write circuit 50.

The write state machine 110 controls the operation of each circuit included in the flash memory 3 on the basis of a command signal supplied from the CPU 2, thereby performing timing control in writing, erasing, or reading data, and executing a specific algorithm determined for each operation.

Figure 5:
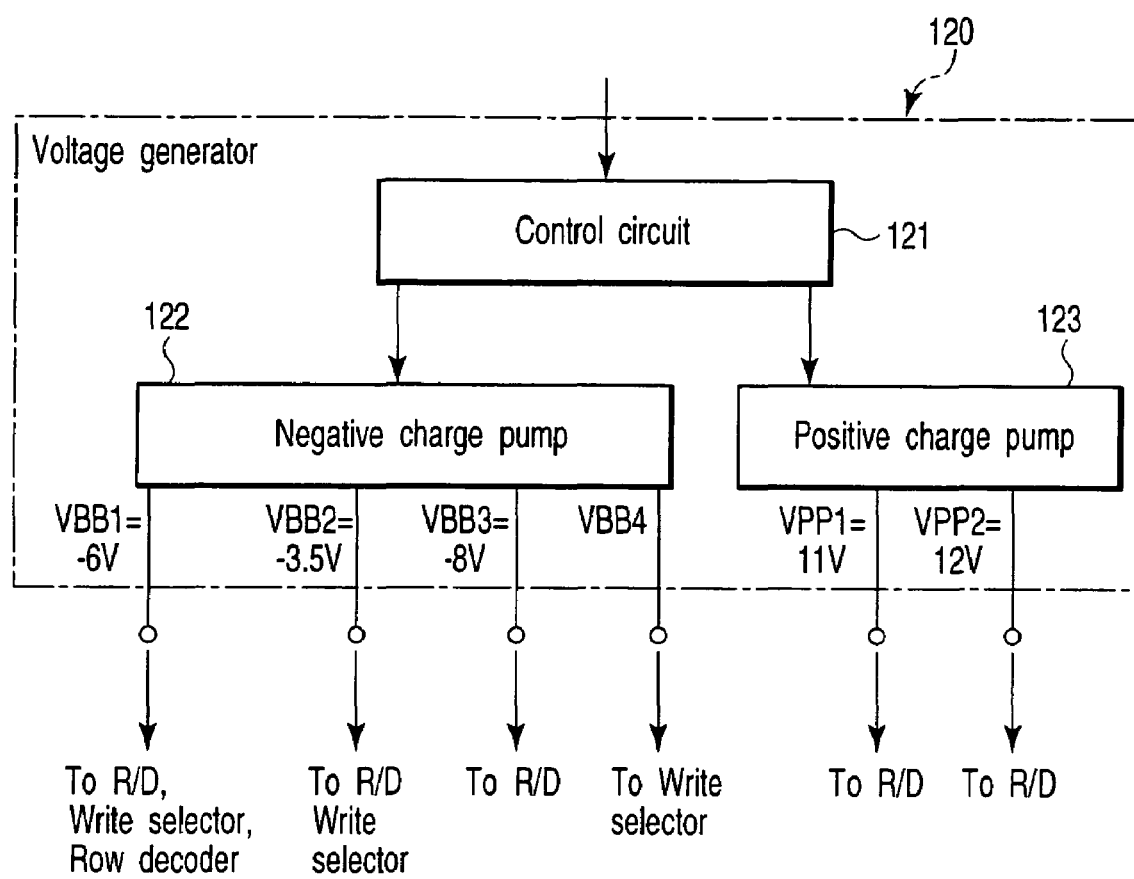
FIG. 5 is a block diagram of a voltage generator included in the 3Tr-NAND flash memory of the first embodiment.

The voltage generator 120 generates a plurality of internal voltages on the basis of the voltage Vcc1 externally input. FIG. 5 is a circuit diagram of the voltage generator 120. As shown in FIG. 5, the voltage generator 120 includes a control circuit 121, a negative charge pump circuit 122, and a positive charge pump circuit 123. The control circuit 121 controls the charge pump circuits 122, 123. The charge pump circuit 122 generates negative voltages of VBB1 (=−6V), VBB2 (=−3.5V), VBB3 (=−8V), and VBB4. The charge pump circuit 123 generates positive voltages of VPP1 (=11V) and VPP2 (=12V). The negative voltages VBB1 to VBB3 and the positive voltages VPP1 and VPP2 are supplied to the row decoder 20. The negative voltages VBB1, VBB2, and VBB4 are supplied to the write selector 40. The negative voltage VBB1 is also supplied to the write circuit 50.

Figure 6:
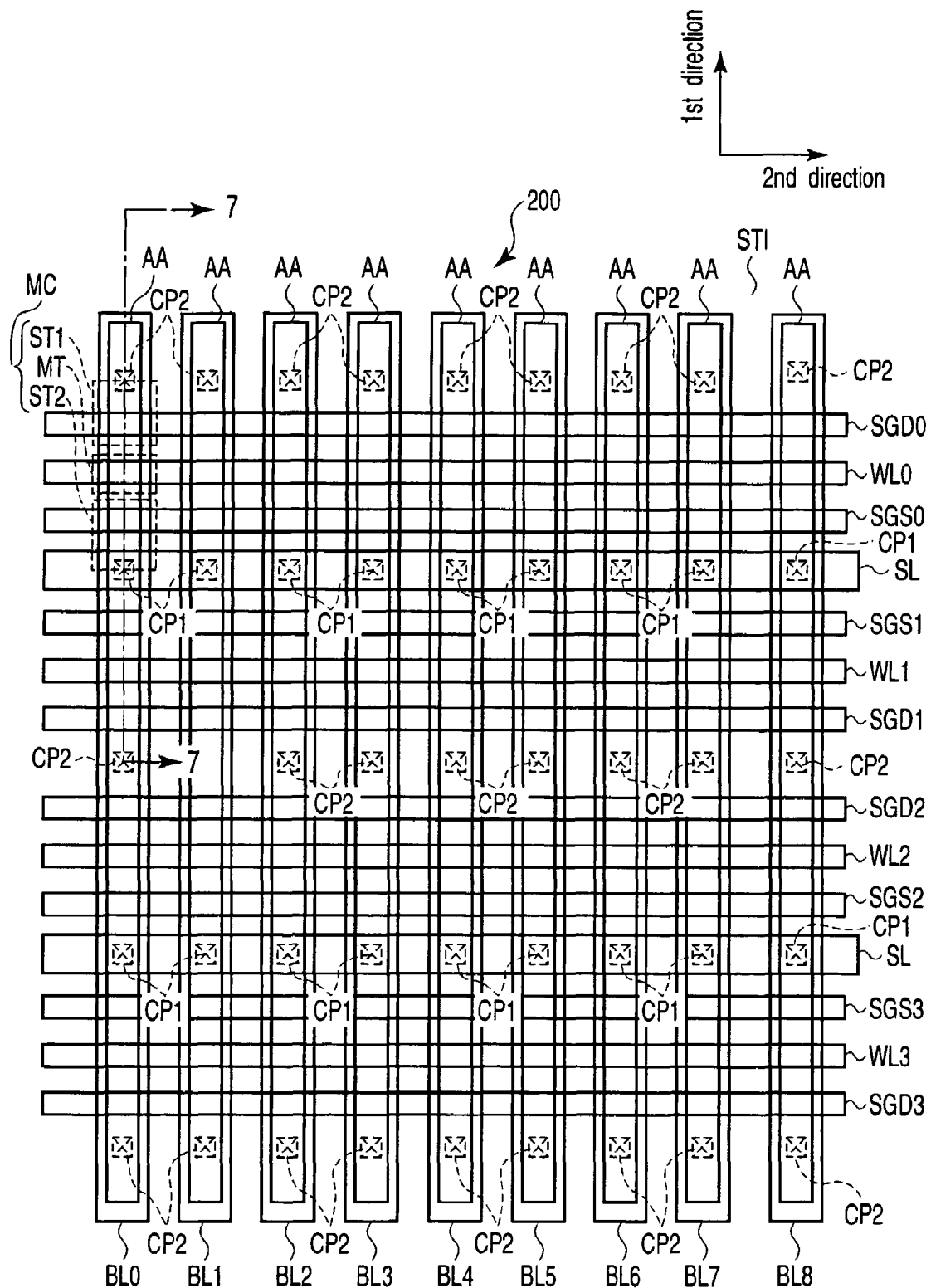
FIG. 6 is a plan view of the memory cell array of the 3Tr-NAND flash memory in the first embodiment.

Next, a plane configuration and a sectional configuration of the memory cell array 10 included in the 3Tr-NAND flash memory 3 will be explained. FIG. 6 is a plan view of a part of the memory cell array 10.

As shown in FIG. 6, in the semiconductor substrate 200, a plurality of strip-shaped element regions AAs extending in a first direction are formed in a second direction. Strip-shaped word lines WL0 to WLm and select gate lines SGD0 to SGDm, SGS0 to SGSm, which extend in the second direction, are formed so as to cross the plurality of element regions AAs. That is, one of the word lines WL0 to WLm is sandwiched between any one of the select gate lines SGD0 to SGDm and any one of the select gate lines SGS0 to SGSm. In the regions where the word lines WL0 to WLm cross the element regions AAs, memory cell transistors MTs are formed. In the regions where the select gate lines SGD0 to SGDm cross the element regions AAs, select transistors ST1 are formed. In the regions where the select gate lines SGS0 to SGSm cross the element regions AAs, select transistors ST2 are formed. Furthermore, in the regions where the word lines WL0 to WLm cross the element regions AAs, floating gates (not shown) isolated on a memory cell transistor MT basis are formed. Like the memory cell transistor MT, each of the select transistors ST1, ST2 has a control gate and a floating gate. However, differently from the memory cell transistor MT, the floating gate is connected to both of the select transistors STs adjacent to each other in the second direction. Then, in a shunt region (not shown), the floating gate of the select transistors STs is connected to a shunt line.

On the source region of each of the select transistors ST2, a strip-shaped source line SL extending in the second direction is formed. The source line SL is connected to the source region of the select transistor ST2 via contact plug CP1. The individual source lines SLs are connected to one another in a region (not shown). The common connection of the source lines SLs is further connected to a source line driver 80.

On the element regions AAs, strip-shaped bit lines BL0 to BLn extending in the first direction are formed. The bit line BL0 to BLn are connected to the drain regions of the select transistors ST1 via contact plugs CP2.

Figure 7:
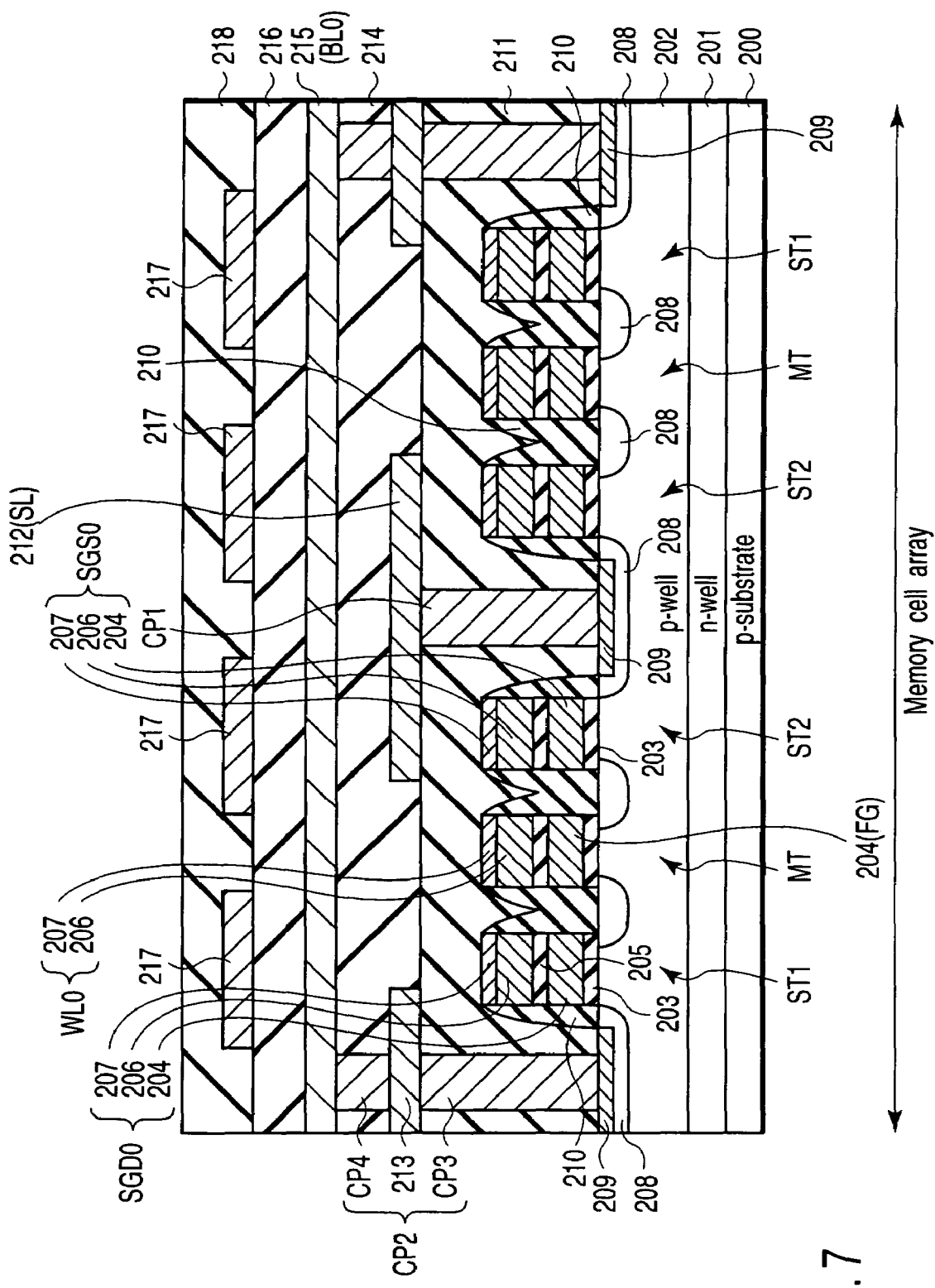
FIG. 7 is a sectional view taken along line 7—7 of FIG. 5.

FIG. 7 is a sectional view taken along line 7—7 of FIG. 6.

As shown in FIG. 7, at the surface of the element region AA of the p-type semiconductor (silicon) substrate 200, an n-well region 201 is formed. At the surface of the n-well region 201, a p-well region 202 is formed. On the p-well region 202, a gate insulating film 203 is formed. On the gate insulating film 203, the gate electrodes of memory cell transistors MTs and select transistors ST1, ST2 are formed. Each of the gate electrodes of the memory cell transistors MT and select transistors ST1, ST2 includes a polysilicon layer 204 formed on the gate insulating film 203, an inter-gate insulating film 205 formed on the polysilicon layer 204, a polysilicon layer 206 formed on the inter-gate insulating film 205, and a silicide layer 207 formed on the polysilicon layer 206. The inter-gate insulating film 205 is formed of, for example, an ON film, an NO film, or an ONO film. In the memory cell transistor MT, the polysilicon layers 204, which are separated from one another between element regions AAs adjoining in the word line direction, function as floating gates (FG). In addition, the polysilicon layer 206 and silicide layer 207 function as control gates (word lines WLs). The polysilicon layers 206 are connected to one another between element regions AAs adjoining in the word line direction. In the select transistors ST1, ST2, a part of the inter-gate insulating film 205 is removed in a shunt region (not shown) and the polysilicon layers 204, 206 are connected electrically in the shut region. Then, the polysilicon layers 204, 206 and the silicide layer 207 function as select gate lines SGS, SGD. In the select transistors ST1, ST2, the polysilicon layer 204 and polysilicon layer 206 are not separated between element regions AAs adjoining in the word line direction and are connected to each other. That is, the floating gates are not separated on a cell basis differently from the memory cell transistor MT, but are all connected to one another.

At the surface of the semiconductor substrate 200 located between adjoining gate electrodes, impurity diffused layers 208 functioning as source region or drain region are formed. Each impurity diffused layer 208 is shared by adjoining transistors. Specifically, an impurity diffused layer 208 between two adjoining select transistors ST1 functions as a drain region for the two select transistors ST1. An impurity diffused layer 208 between two adjoining select transistors ST2 functions as a source region for the two select transistors ST2. An impurity diffused layer 208 between a memory cell transistor MT and a select transistor ST1 adjacent to each other functions as the drain region of the memory cell transistor MT and the source region of the select transistor ST1. Moreover, an impurity diffused layer 208 between a memory cell transistor MT and a select transistor ST2 adjacent to each other functions as the source region of the memory cell transistor MT and the drain region of the select transistor ST2. At the surface of the drain region of the select transistor ST1 and at the surface of the source region 35 of the select transistor ST2, a silicide layer 209 is formed. In the source and drain regions 208 of the memory cell transistor MT, in the source region 208 of the select transistor ST1, and in the drain region 208 of the select transistor ST2, no silicide layer is formed. On the side of the gate electrode (stacked gate) of each of the memory cell transistor MT and select transistors, a sidewall insulating film 210 is formed. The sidewall insulating film 210 is formed on the side facing the source region 208 of the stacked gate and on the side facing its drain region 208. The region between the stacked gates of the memory cell transistor MT and select transistors ST1 and ST2 is filled with the sidewall insulating film 210.

Thus, the top of the source and drain regions of the memory cell transistor MT, the top of the source region of the select transistor ST1, and the top of the drain region of the select transistor ST2 are covered with the sidewall insulating film 210.

On the semiconductor substrate 200, an interlayer insulating film 211 is formed so as to cover the memory cell transistors MTs and select transistors ST1, ST2. In the interlayer insulating film 211, a contact plug CP1 is formed which reaches the silicide layer 209 formed in the source region 208 of the select transistor ST2. On the interlayer insulating film 211, a metal wiring layer 212 to be connected to the contact plug CP1 is formed. The metal wiring layer 212 functions as a source line SL. In the interlayer insulating film 211, a contact plug CP3 is formed which reaches the silicide layer 209 formed in the drain region 208 of the select transistor ST1. On the interlayer insulating film 211, a metal wiring layer 213 to be connected to the contact plug CP3 is formed.

On the interlayer insulating film 211, an interlayer insulating film 214 is formed so as to cover the metal wiring layers 212, 213. In the interlayer insulating film 214, a contact plug CP4 reaching the metal wiring layer 213 is formed. On the interlayer insulating film 214, a metal wiring layer 215 connected in common to a plurality of contact plugs CP4 is formed. The metal wiring layer 215 functions as a bit line BL. The contact plugs CP3, CP4, and metal wiring layer 213 correspond to the contact plugs CP2 in FIG. 6.

On the interlayer insulating film 214, an interlayer insulating film 216 is formed so as to cover the metal wiring layer 215. On the interlayer insulating film 216, a metal wiring layer 217 is formed. The metal wiring layer 217, which is connected to the silicide layers 207 of the select transistors ST1, ST2 in a region (not shown), functions as shunt wiring lines for the select gate lines SGD, SGS. On the interlayer insulating film 216, an interlayer insulating film 218 is formed so as to cover the metal wiring layer 217.

Figure 8:
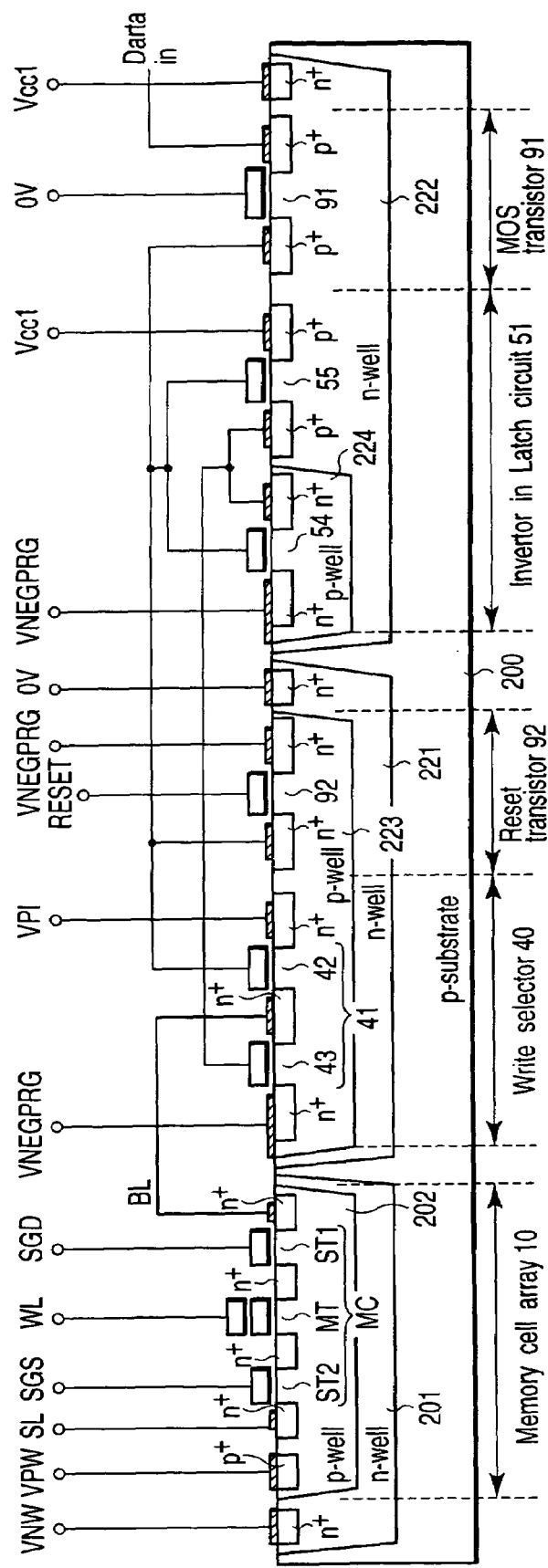
FIG. 8 is a sectional view taken in the column direction of the 3Tr-NAND flash memory in the first embodiment.

Next, a sectional configuration in the column direction of the memory cell array 10, write selector 40, latch circuit 50, and switch group 90 will be explained briefly. FIG. 8 is a sectional view of the memory cell array 10, write selector 40, latch circuit 50, and switch group 90. FIG. 8 particularly shows only one memory cell MC, one select circuit 41, one inverter 53, and MOS transistors 91, 92.

As shown in FIG. 8, at the surface of the semiconductor substrate 200, n-well regions 201, 220, 221 isolated from one another are formed. The n-well region 201 is for forming a memory cell array 10. The n-well 221 is for forming a write selector 40 and a reset transistor 92. The n-well region 222 is for forming a latch circuit 51 and a MOS transistor 91.

At the surface of the n-well region 201, a p-well region 202 is formed. Then, on the p-well region 202, a memory cell MC is formed. Although each of the select transistors ST1, ST2 in the memory cell is shown as a single-layer gate, it may have a stacked gate structure as does the memory cell transistor MT. A potential of VPW is applied to the p-well region 202 and a potential of WNH is applied to the n-well region 201.

At the surface of the n-well region 221, a p-well region 223 is formed. On the p-well region 223, MOS transistors 42, 43 in the select circuit 41 are formed and a reset transistor 92 is also formed. The potential VNEGPRG is applied to the p-well region 223 and 0V is applied to the n-well region 221.

At the surface of the n-well region 222, a p-well region 224 is formed. On the p-well region 224, a MOS transistor 54 is formed. On the n-well region 222, MOS transistors 55, 91 are formed. The MOS transistors 54, 55 form inverters 52, 53. The potential VNEGPRG is applied to the p-well region 224 and the potential Vcc1 is applied to the n-well region 222.

Next, a sectional configuration in the row direction of a part of the memory cell array 10, switch group 22, and row address decode circuit 29 will be explained briefly. FIG. 9 is a sectional view of the memory cell array 10, isolating transistor 28, and MOS transistors 26-1, 26-2.

As shown in FIG. 9, at the surface of the n-well region 201, p-well regions 225, 202 are formed. As described above, the p-well region 202 is for forming a memory cell array. Therefore, explanation of the configuration on the p-well region 202 will be omitted. The p-well region 225 is for forming an n-channel MOS transistor in the row address decode circuit 29.

On the n-well region 201, an isolating transistor 28 is formed. In addition, a MOS transistor 26-2 in the row address decode circuit 29 is also formed. On the p-well region 225, a MOS transistor 26-1 is formed. Then, a potential of WPH is applied to the p-well region 225.

Figure 10:
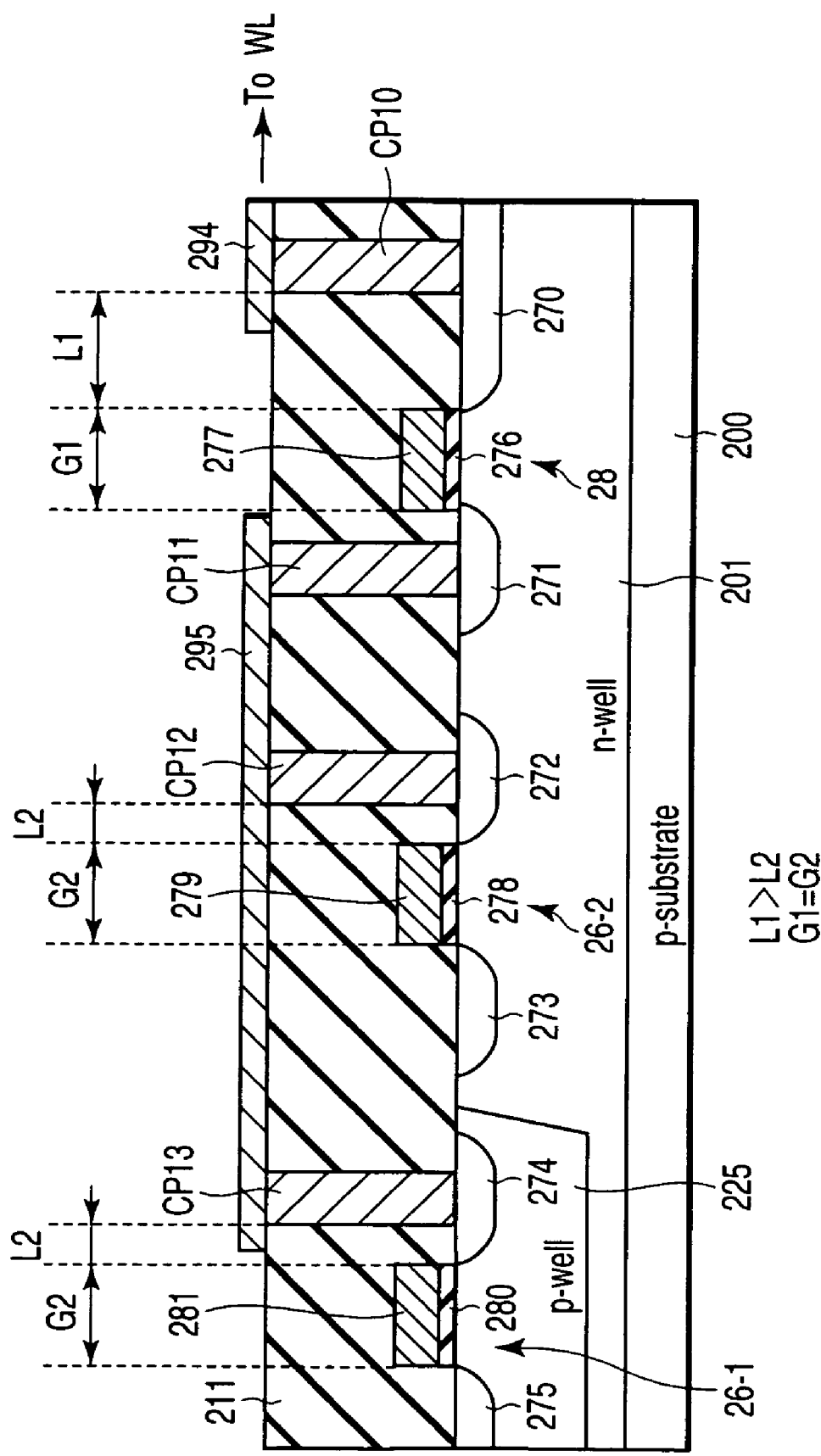
FIG. 10 is a sectional view of a part of the row decoder included in the 3Tr-NAND flash memory of the first embodiment.

FIG. 10 is a sectional view of the isolating transistor 28 and the MOS transistors 26-1, 26-2 of the row address decode circuit 29. As shown in FIG. 10, the isolating transistor 28 includes impurity diffused layers 270, 271 (drain and source regions) formed at the surface of the n-well region 201 and a gate electrode 277 formed on the well region 201 between the impurity diffused layers 270, 271, with a gate insulating film 276 interposed between the gate electrode 277 and the well region 201. On the impurity diffused layer 270, a contact plug CP10 is formed. The contact plug CP10 is connected to a word line with a metal wiring layer 294. On the impurity diffused layer 271, a contact plug CP11 is formed.

The MOS transistor 26-2 includes impurity diffused layers 272, 273 (drain and source regions) formed at the surface of the n-well region 201 and a gate electrode 279 formed on the well region 201 between the impurity diffused layers 272, 273, with a gate insulating film 278 interposed between the gate electrode 279 and the well region 201. On the impurity diffused layer 272, a contact plug CP 12 is formed.

The MOS transistor 26-1 includes impurity diffused layers 274, 275 (drain and source regions) formed at the surface of the p-well region 225 and a gate electrode 281 formed on the well region 225 between the impurity diffused layers 274, 275, with a gate insulating film 280 interposed between the gate electrode 281 and the p-well region 225. On the impurity diffused layer 274, a contact plug CP 13 is formed. The contact plugs CP11 to CP13 are connected to one another with a metal wiring layer 295.

In the above configuration, let the distance between the contact plug CP10 formed on the drain (or one of the source and drain which is connected directly to a word line) of the isolating transistor 28 and the gate electrode 277 be L1. In addition, let the distance between the contact plug CP12 and the gate electrode 279 and the distance between the contact plug CP13 and the gate electrode 281 be L2. Then, L1 and L2 meets the expression L1>L2.

Furthermore, let the gate length of the gate electrode of the isolating transistor 28 be G1. In addition, let the gate length of the gate electrodes 281, 279 of the MOS transistors 26-1, 26-2 be G2. Then, G1 and G2 fulfill the equation G1=G2.

Figures 11, 12:
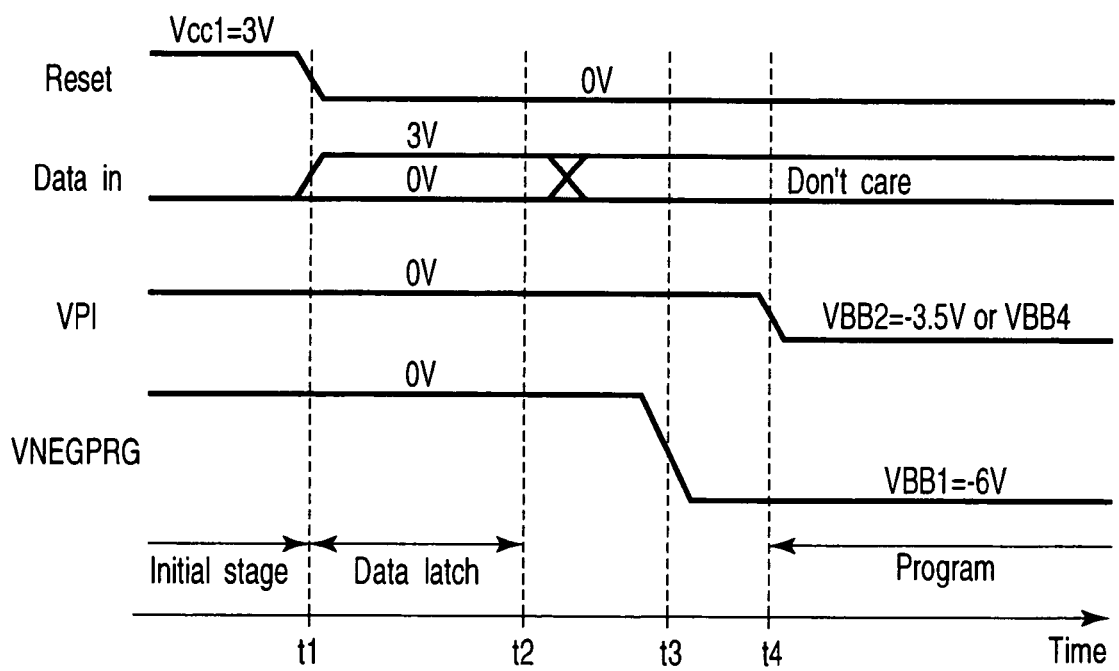
FIG. 11 shows the relationship between voltages in an erase operation and in a write operation of the 3Tr-NAND flash memory in the first embodiment.
FIG. 12 is a timing chart for various signals when the 3Tr-NAND flash memory of the first embodiment is in operation.

Next, the operation of the 3Tr-NAND flash memory 3 configured as described above will be explained by reference to FIGS. 11 and 12. FIG. 11 shows the potentials on the bit lines BL, word lines WL, and select gate lines SGD, SGS and the potential VPW at the p-well region 202 in an erase operation or a write operation. FIG. 12 is a timing chart of a reset signal Reset, a data signal, VPI, and VNEGPRG. Hereinafter, a state where no electron is injected into the floating gate and the threshold voltage is negative is defined as a state where "1" data has been written and a state where electrons are injected into the floating gate and the threshold voltage is positive is defined as a state where "0" data has been written.

<Initial Operation>

Figure 13:
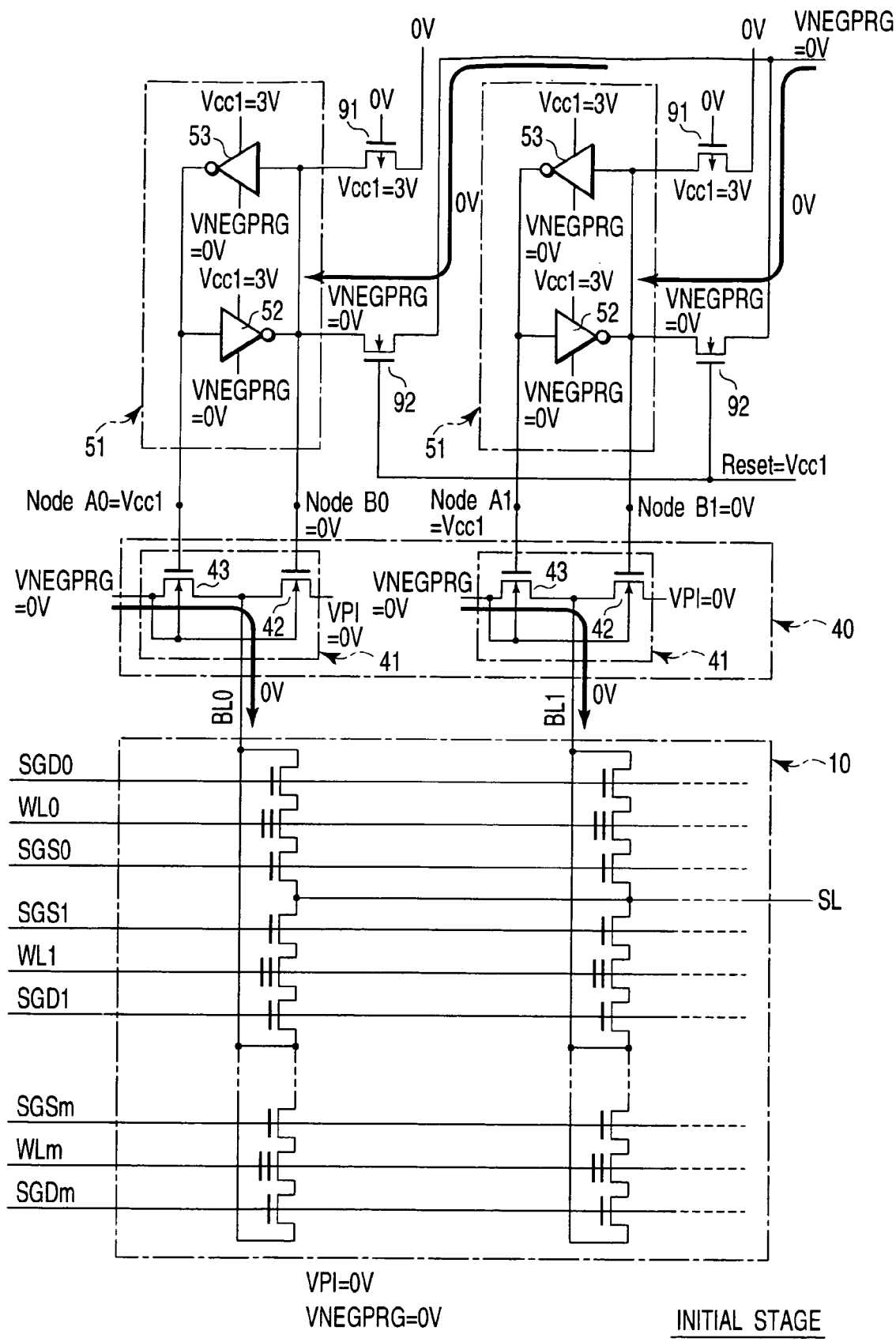
FIG. 13 is a circuit diagram of the memory cell array, write selector, write circuit, and switch group in the initial state of the 3Tr-NAND flash memory in the first embodiment.

First, an initial operation will be explained by reference to FIG. 13. An initial operation is an operation carried out at the beginning of a write operation, a read operation, or a erase operation. In FIG. 12, an initial operation is carried out by time t1. FIG. 13 is a circuit diagram of the memory cell array 10, write selector 40, write circuit 50, and switch group 90 in the initial operation. Hereinafter, the gates of the MOS transistors 43, 42 in the select circuits 41 corresponding to the bit lines BL0 to BLn are referred as nodes B0 to Bn and node A0 to An, respectively.

Before the initial operation, VPI and VNEGPRG are set to 0V. The reset signal Reset is set to Vcc1 (=3V). Then, the reset transistors 92 in the switch group 90 are turned on. Therefore, VNEGPRG=0V is applied to the input nodes of all of the latch circuits 51. Since the power supply voltages on the low-voltage side of the inverters 52, 53 are at VNEGPRG=0V, the input nodes of all of the latch circuits 51 are at 0V and their output nodes are at Vcc1. That is, nodes B0 to Bn are at 0V and nodes A0 to An are at Vcc1. Therefore, in all of the select circuits 41, the MOS transistors 42 are in the off state and the MOS transistors 43 are in the on state. As a result, 0V is supplied from the sources of the MOS transistors 43 to the corresponding bit lines BL0 to BLn.

As described above, in the initial operation, 0V is applied to the input nodes of the latch circuits.

<Data Latch Operation>

Next, a data latch operation will be explained by reference to FIG. 14. A data latch operation is the operation of inputting the write data to each latch circuit 51 in a write operation. A data latch operation is carried out between time t1 to time t2 in FIG. 12. FIG. 14 is a circuit diagram of the memory cell array 10, write selector 40, write circuit 50, and switch group 90 in a data latch operation.

First, before a data latch operation, the reset signal Reset is set to 0V and the write data is input to one-end sides of the current paths of the MOS transistors 91 so as to correspond to the respective bit lines. When "0" writing is done (or when electrons are injected into the floating gate), 0V is applied to one end of the current path of the MOS transistor 91. When "1" writing is done (or when no electron is injected into the floating gate), 3V is applied to one end of the current path of the MOS transistor 91. VPI and VNEGPRG remain at 0V. Setting the reset signal Reset to 0V brings all of the MOS transistors 92 into the off state. All of the MOS transistors 91 are kept in the on state.

The example of FIG. 14 shows a case where "0" data is written into the memory cell connected to bit line BL0 and "1" data is written into the memory cell connected to the bit line BL1.

First, a case where "0" data is written will be explained, centering on the bit line BL0. As shown in FIG. 14, 0V is applied to one end of the current path of the MOS transistor 91. Since the gate potential of the MOS transistor 91 is also 0V, the MOS transistor 91 is in the cut off state. As a result, the data in the latch circuit 51 remains in the initial state. Therefore, node A0 is at Vcc1 and node B0 is at 0V. Consequently, in the select circuit 41 corresponding to the bit line BL0, the MOS transistor 43 is in the on state, the MOS transistor 42 is in the off state, and VNEGPRG=0V is applied from the source of the MOS transistor 43 to the bit line BL0.

Next, a case where "1" data is written will be explained, centering on the bit line BL1.

As shown in FIG. 14, 3V is applied to one end of the current path of the MOS transistor 91. Since the MOS transistor 91 is in the on state, the 3V reaches the input node of the latch circuit. Because of VNEGPRG=0V, the potential at node A1 changes from Vcc1 to 0V and the potential at node B1 changes from 0V to Vcc1. Thus, in the select circuit 41 corresponding to the bit line BL1, the MOS transistor 43 is turned off and the MOS transistor 42 is turned on. As a result, VPI=0V is applied from the source of the MOS transistor 42 to the bit line BL1.

As described above, in the data latch operation, the data in the latch circuit corresponding to the memory cell into which "1" data is to be written is reversed from its initial state. That is, when "0" writing is done (or when electrons are injected), no data is input from the outside. When "1" writing (or when no electron is injected=the memory is unselected), the data is taken in from the outside.

<Write Operation>

Figure 15:
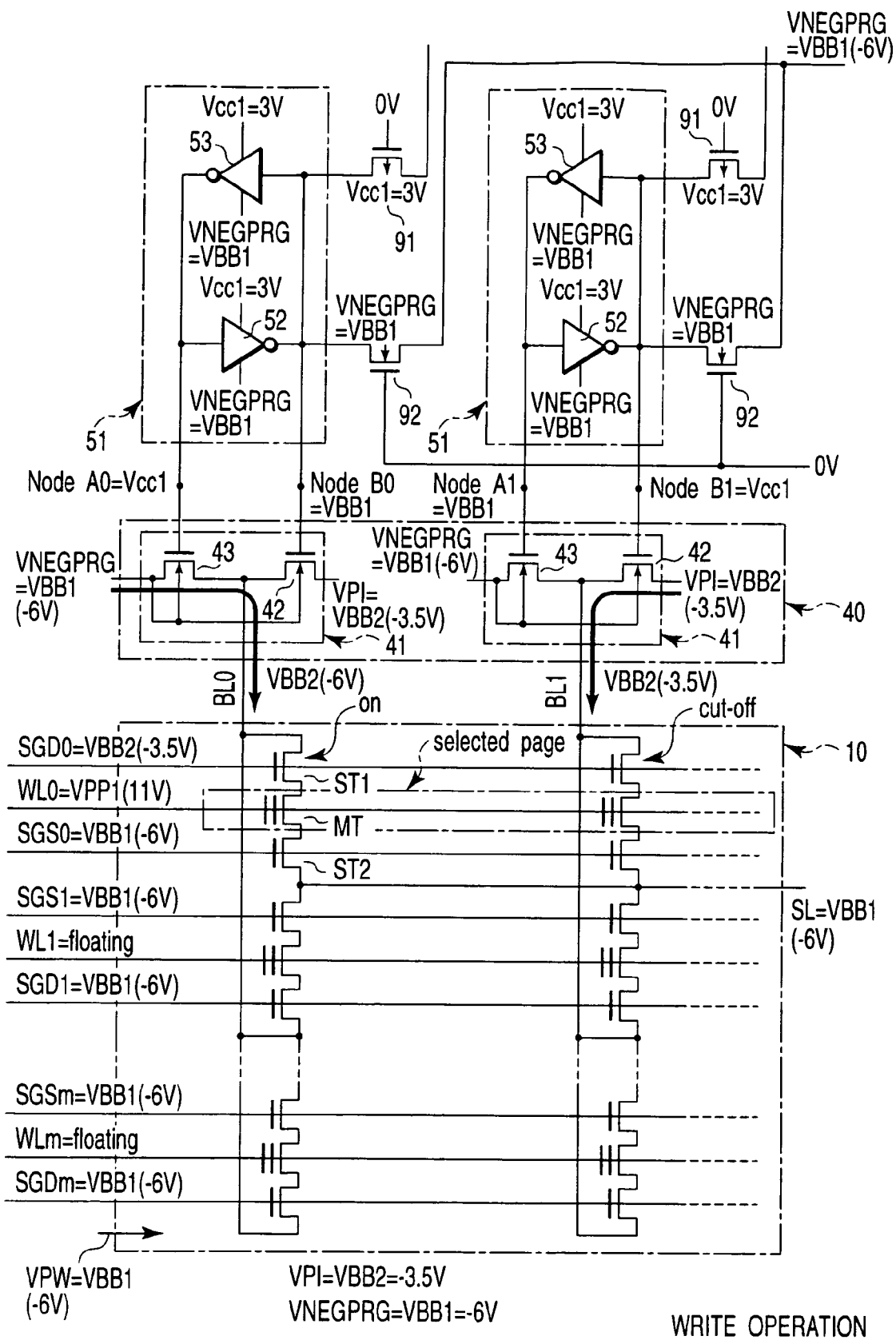
FIG. 15 is a circuit diagram of the memory cell array, write selector, write circuit, and switch group in a write operation of the 3Tr-NAND flash memory of the first embodiment.
Figure 16:
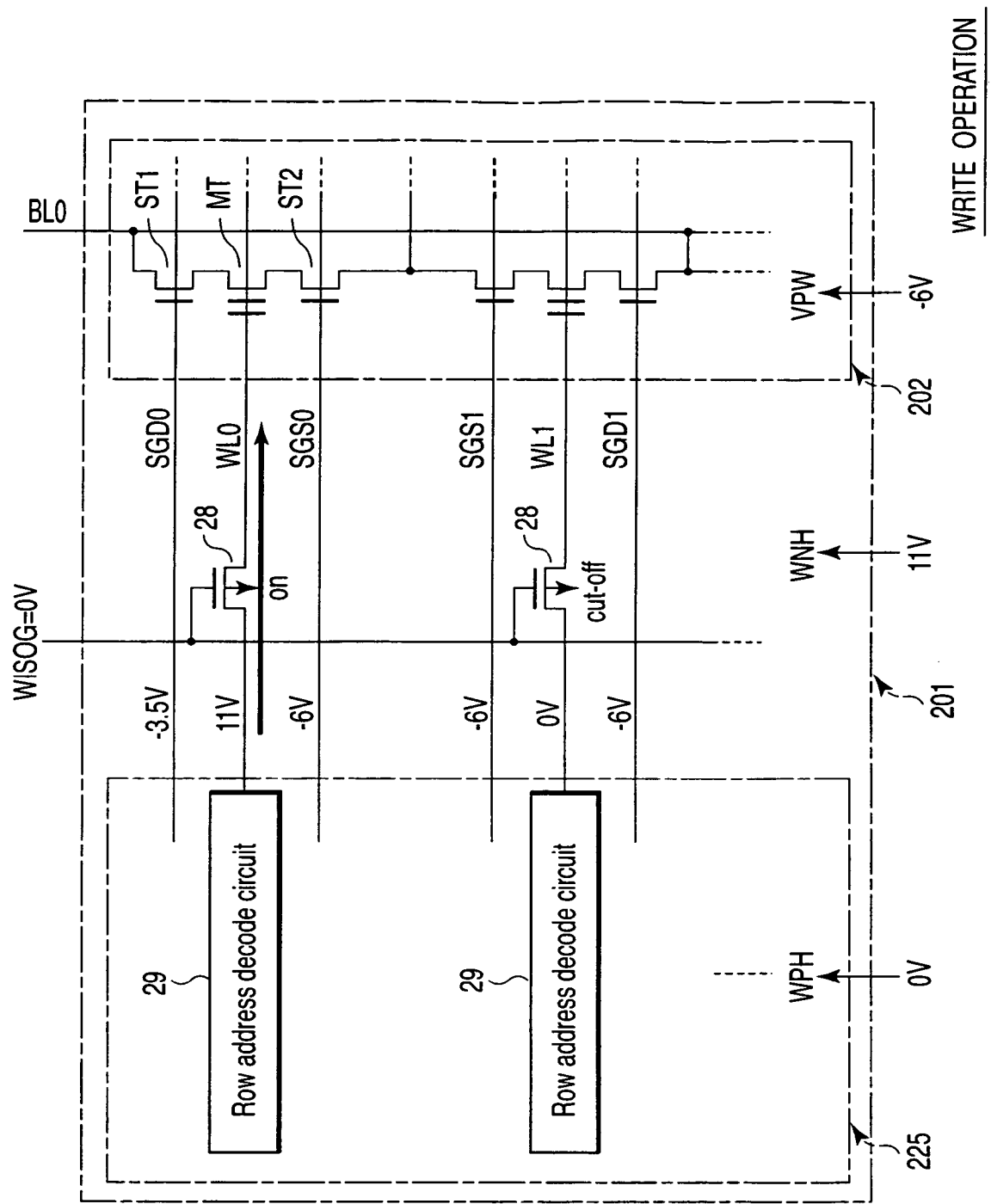
FIG. 16 is a circuit diagram of the memory cell array and row decoder in a write operation of the 3Tr-NAND flash memory of the first embodiment.

A write operation will be explained by reference to FIGS. 15 and 16. Data is written simultaneously into all of the memory cell transistors connected to any one of the word lines. Either "0" data or "1" data is written, depending on whether electrons are injected into the floating gate of the memory cell transistor MT. Electrons are injected into the floating gate by FN tunneling. In FIG. 12, a write operation is carried out at time t4 or later. FIG. 15 is a circuit diagram of the memory cell array 10, write selector 40, write circuit 50, and switch group 90 in a write operation. In FIG. 15, it is assumed that data is written into the memory cell transistors MTs connected to the word line WL0 and that, of the memory cell transistors MTs, "0" data is written into the one connected to the bit line BL0 and "1" data is written into the one connected to the bit line BL1. In other words, the memory cell connected to the bit line BL0 is selected and the memory cell connected to the bit line BL1 is unselected. FIG. 16 is a circuit diagram of the row address decode circuit 29, isolating transistor 28, and memory cell array 10 in a write operation. In FIG. 16, each region shown by a broken line indicates the same well.

First, before a write operation, the reset signal Reset remains at 0V. Then, VNEGPRG is set to VBB1 (=−6V) at time t3 and VPI is set to VBB2 (=−3.5V) at time t4. The charge pump circuit 122 outputs the negative potentials VBB1 and VBB2 under the control of the write state machine 110. VPI may be another negative potential of VBB4, not VBB2. In this case, too, the charge pump circuit 122 outputs the negative potential VBB4 under the control of the write state machine 110.

Then, the low-voltage-side power supply voltage of the inverters 52, 53 in the latch circuit 51 changes from 0V to VBB1, with the result that the potentials at node B0 and node A1 change from 0V to VBB1. Then, in the select circuit 41 corresponding to the bit line BL0, the MOS transistor 43 is in the on state. In the select circuit 41 corresponding to the bit line BL1, the MOS transistor 42 is in the on state. Since the source potentials of the MOS transistors 42, 43 are VPI=VBB2 and VNEGPRG=VBB1, respectively, VBB1 and VBB2 are supplied to the bit lines BL0 and BL1, respectively.

Then, the row decoder 20 selects the select gate line SGD0, applies VBB2 to the selected select gate line SGD0, and further applies VBB1 to the unselected select gate lines SGD1 to SGDm and to all of the select gate lines SGS0 to SGSm. Then, of the select transistors ST1 connected to the selected select gate line SGD0, the one ST1 connected to the bit line BL1 applied with VBB2 is cut off. On the other hand, the select transistor ST1 connected to the bit line BL0 applied with VBB1 is turned on.

In the row decoder 20, the row address decode circuit 29 corresponding to the selected word line WL0 outputs the positive potential VPP1 (11V). The row address decode circuits 29 corresponding to the unselected word lines WL1 to WLm output 0V. WISOG is set to 0V. Thus, the isolating transistor 28 corresponding to the selected word line WL0 is turned on and the isolating transistors 28 corresponding to the unselected word lines WL1 to WLm are cut off. As a result, VPP1 is applied to the selected word line WL0 and the unselected word lines WL1 to WLm become floating. The charge pump circuit 123 outputs the positive potential VPP1 under the control of the write state machine 110.

As a result, a channel region is formed in each of the memory cell transistors MTs connected to the selected word line WL0. Since the select transistor ST1 connected to the selected select gate line SGD0 and bit line BL1 is in the cut-off state, the channel potential of the memory cell transistor MT connected to the select transistor ST1 is floating. As a result of coupling with the word line WL, the channel potential rises to about VPP1. On the other hand, since the select transistor ST1 connected to the selected select gate line SGD0 and bit line BL0 is in the on state, the channel potential of the memory cell transistor MT connected to the select transistor ST1 is VBB1.

Furthermore, the row decoder 20 applies VBB1 to the substrate (p-well region 202) in which memory cells are formed. The potentials WNH, WPH of the n-well region 201 and p-well region 225 are set to VPP1 and 0V, respectively.

As a result, in the memory cell transistor MT in the memory cell including the cut-off select transistor ST1, since the potential difference between the gate and channel is insufficient, no electron is injected into the floating gate. That is, "1" data is written. In the example of FIG. 15, the threshold value of the memory cell connected to the bit line BL1 and the selected word line WL0 (or the memory cell into which "1" data is to be written) remains negative.

On the other hand, in the memory cell transistor MT in the memory cell including the select transistor ST1 connected to the selected select gate line SGD0 and to the bit line BL0, since the potential difference between the gate and channel is 17V (=VPP1−VBB1), electrons are injected into the floating gate by FN tunneling. As a result, the threshold value of the memory cell transistor MT changes to positive. That is, "0" data is written.

As described above, the data is written into one page of memory cell transistors simultaneously.

<Erase Operation>

Figure 17:
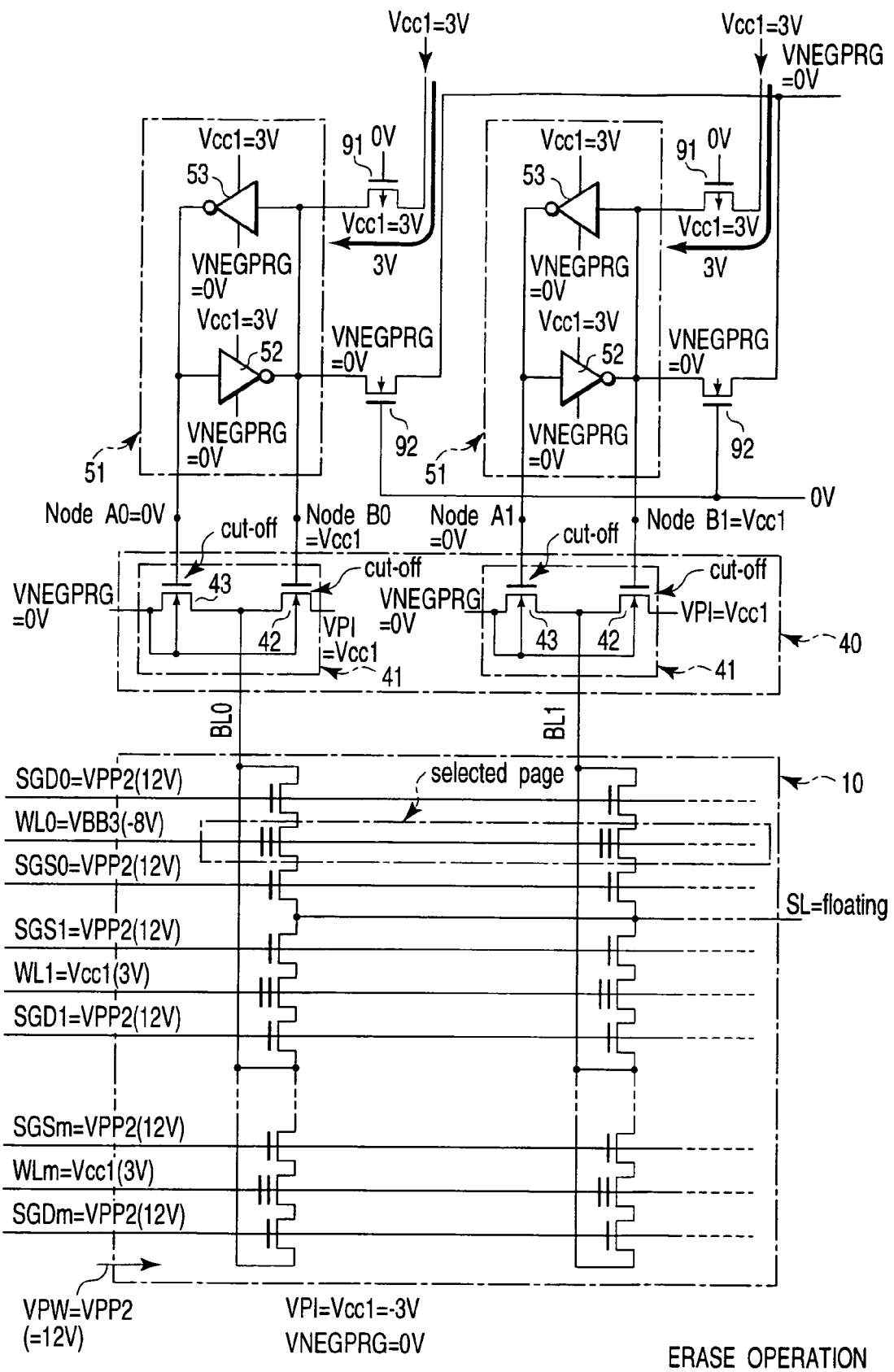
FIG. 17 is a circuit diagram of the memory cell array, write selector, write circuit, and switch group in an erase operation of the 3Tr-NAND flash memory of the first embodiment.
Figure 18:
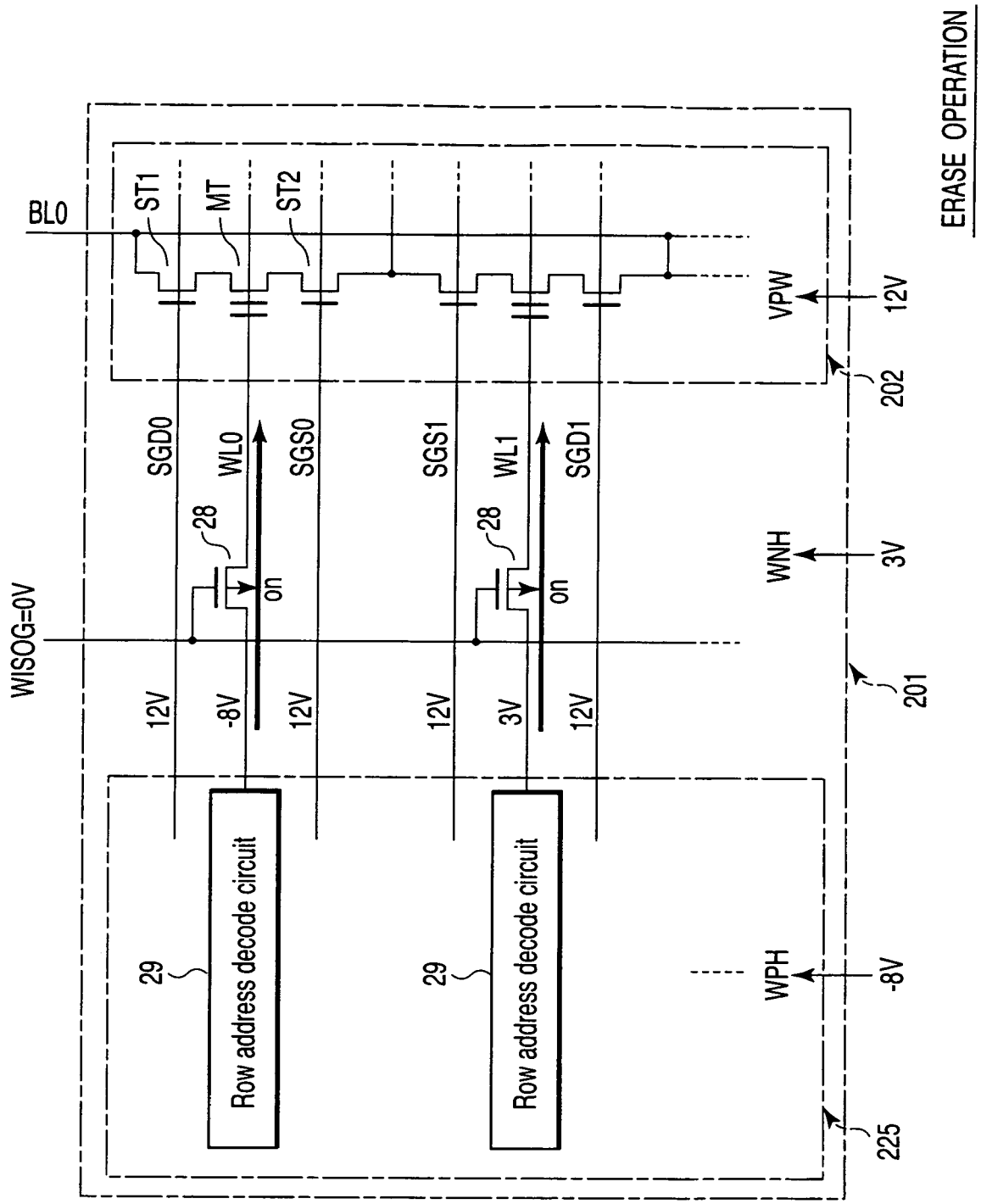
FIG. 18 is a circuit diagram of the memory cell array and row decoder in an erase operation of the 3Tr-NAND flash memory of the first embodiment.

Next, an erase operation will be explained by reference to FIGS. 17 and 18. FIG. 17 is a circuit diagram of the memory cell array 10, write selector 40, write circuit 50, and switch group 90 in an erase operation. Data is erased in pages as in a write operation. An erase operation is carried out by pulling electrons out of the floating gate by FN tunneling. FIG. 17 shows a case where the data is erased from the memory cell transistors connected to the word line WL0. FIG. 18 is a circuit diagram of the row address decode circuit 29, isolating transistor 28, and memory cell array 10 in a write operation.

Before an erase operation, the reset signal Reset is set to 0V and 3V is applied to one end of the current path of each of the MOS transistors 91 corresponding to all the bit lines. VPI is at Vcc1 and VNEGPRG remains at 0V. Then, setting the reset signal Reset to 0V brings all of the MOS transistors 92 into the off state. All of the MOS transistors 91 are in the on state. As a result, 3V is applied to the input nodes of the latch circuits 51. Since VNEGPRG=0V, the potentials at nodes A0 to An are 0V and the potentials at nodes B0 to Bn are Vcc1. Accordingly, in all of the select circuits 41, the MOS transistors 42, 43 are cut off. Therefore, the bit lines BL0 to BLn are separated electrically from the latch circuits 51, VNEGPRG and VPI and therefore go into the floating state.

Then, the row decoder 20 applies VPP2 (12V) to all of the select gate lines SGD0 to SGDm, SGS0 to SGSm. In addition, in the row decoder 20, the row address decode circuits 29 corresponding to the word line WL0 output VBB3 (=−8V). The row address decode circuits 29 corresponding to the unselected word lines WL1 to WLm output Vcc1 (3V). Then, WISOG is set to, for example, −11V. Thus, all of the isolating transistors 28 are turned on. As a result, VBB3 is applied to the selected word line WL0 and Vcc1 is applied to the unselected word lines WL1 to WLm. Furthermore, the row decoder 20 applies VPP2 (12V) to the semiconductor substrate (p-well region 202) in which memory cells are formed. The potentials WNH, WPH of the n-well region 201 and p-well region 225 are set to VBB3 and Vcc1, respectively. The charge pump circuits 122, 123 output the negative potential VBB3 and the positive potential VPP2 under the control of the write state machine 110.

Then, the potential difference between the memory cell transistor MT connected to the selected word line WL0 and the semiconductor substrate is 20V (=VPP2−VBB3), causing electrons in the floating gate to be pulled out into the semiconductor substrate by FN tunneling. Consequently, the data is erased from the memory cell transistors MTs connected to the selected word line WL0, with the result that the threshold values of the memory cell transistors MTs become negative.

In the memory cell transistors MTs connected to the unselected word lines WL1 to WLm, Vcc1 is applied to the word lines WL1 to WLm. Since the potential difference between the memory cell transistor MT and the well region is insufficient, no electron is pulled out of the floating gate, with the result that the data is not erased.

As described above, the data is erased from the selected page simultaneously. While in the example of FIG. 17, the data has been erased from (one page of) the memory cell transistors connected to one word line, the data may be erased from the memory cell transistors MTs connected to a plurality of word lines. In this case, the row decoder 20 applies VBB3 to the plurality of word lines.

<Read Operation>

Figure 19:
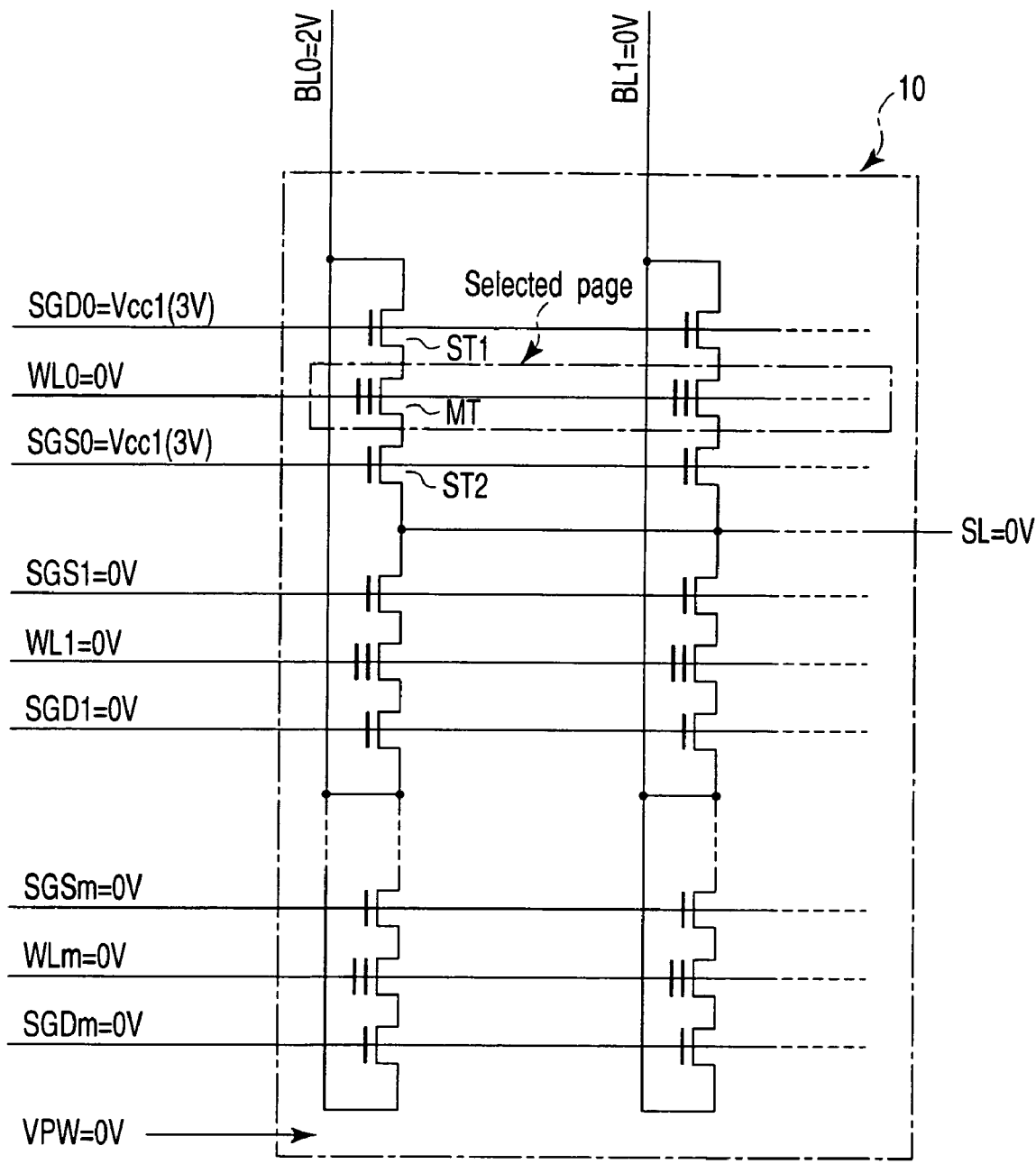
FIG. 19 is a circuit diagram of the memory cell array in a read operation of the 3Tr-NAND flash memory of the first embodiment.

Next, a read operation will be explained by reference to FIGS. 19 and 20. FIG. 19 is a circuit diagram of the memory cell array 10 of the 3Tr-NAND flash memory 3. FIG. 19 shows a case where the data is read from the memory cell transistor MT connected to the bit line BL0 and to the word line WL0. FIG. 20 is a circuit diagram of the row address decode circuit 29, isolating transistor 28, and memory cell array 10 in a read operation.

First, the row decoder 20 selects the select gate lines SGD0, SGS0 connected to the memory cell from which the data is to be read and applies Vcc1 to the selected select gate lines SGD0, SGS0. In addition, the row decoder 20 makes unselected the other select gate lines SGD1 to SGDm and SGS1 to SGSm and applies 0V to the unselected select gate lines. As a result, the select transistors ST1, ST2 connected to the selected select gate lines SGD0, SGS0 are turned on. In the row decoder 20, the row address decode circuit 29 outputs 0V. Then, WISOG is set to −3V. Thus, all of the isolating transistors 28 are turned on, with the result that 0V is applied to all of the word lines WL0 to WLm. The potentials WNH, WPH of the n-well region 201 and p-well region 225 are set to Vcc1 and 0V, respectively.

Since the threshold value is negative if the written data is "1", the memory cell transistor MT is in the on state. Since the threshold value is positive if the written data is "0", the memory cell transistor MT is in the off state.

In this state, the bit lines are connected to the sense amplifier 70 via the read selector 60, with the result that, for example, 2.0V is applied to the selected bit line BL0. Then, if the data written in the memory cell transistors MTs connected to the select transistors ST1, ST2 connected to the selected select gate lines SGD0, SGS0 is "1", current flows from the bit line to the source line. In contrast, if the written data is "0," no current flows.

As described above, the bit line potential varying with the current flowing from the bit line to the source line is amplified by the sense amplifier 70, thereby reading the data. While in the example of FIG. 19, the data has been written from one bit line, the data may be read simultaneously from a plurality of memory cell transistors by applying a potential to a plurality of bit lines. In the read operation, the MOS transistors 42, 43 in all of the select circuits 41 are turned off and the bit lines BL0 to BLn are separated electrically from the latch circuits 51, VPI and VNEGPRG.

As described above, the flash memory of the first embodiment produces the following effects.

(1) The size of the row decoder can be reduced.

Figure 21:
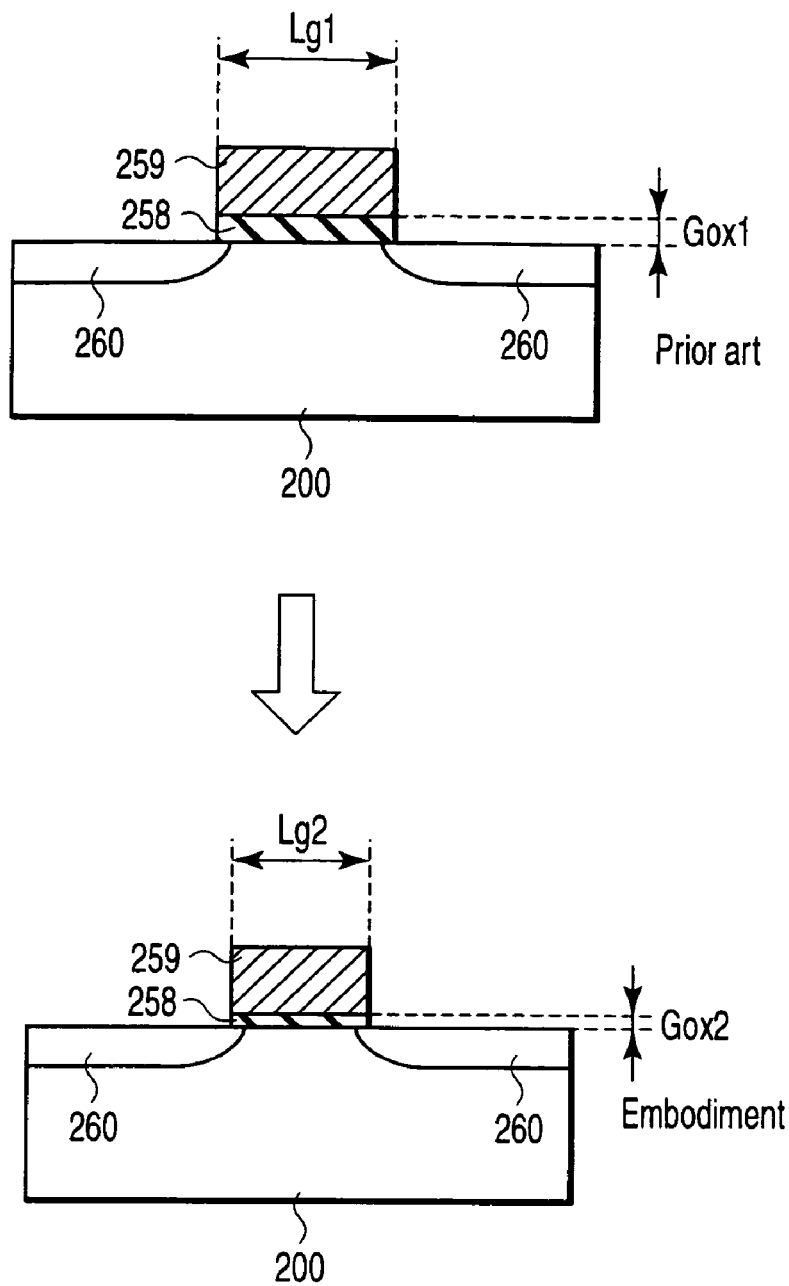
FIG. 21 is a sectional view of a MOS transistor included in a row decoder of the 3Tr-NAND flash memory of the first embodiment and in a conventional flash memory.

The flash memory of the first embodiment uses not only the positive potential but also the negative potential in a write operation and an erase operation. Therefore, the potential difference applied to the gate insulating films of the MOS transistors in the row decoder 20 is about 11 to 12V at a maximum. In this respect, in a conventional configuration which carried out a write operation or an erase operation using only positive potentials, the potential difference is about 30V. Thus, as shown in FIG. 21, the size of the MOS transistor in the row decoder 20 can be made smaller. Specifically, in a conventional configuration which carried out a write operation or an erase operation using 0V and 20V, the gate length Lg1 of the gate electrode 259 of the MOS transistor was about 1.2 μm and the film thickness Gox1 of its gate insulating film 258 was about 400 Å as shown in FIG. 21. In the configuration of the first embodiment, however, the gate length Lg2 of the gate electrode 259 can be made about 0.7 μm and the film thickness Gox2 of the gate insulating film 258 can be made 150 to 170 Å. Since the memory cells can be made smaller in size and the size of the row decoder 20 can be reduced, the memory size of the flash memory can be decreased.

(2) The operation reliability of the flash memory can be improved.

Figure 22:
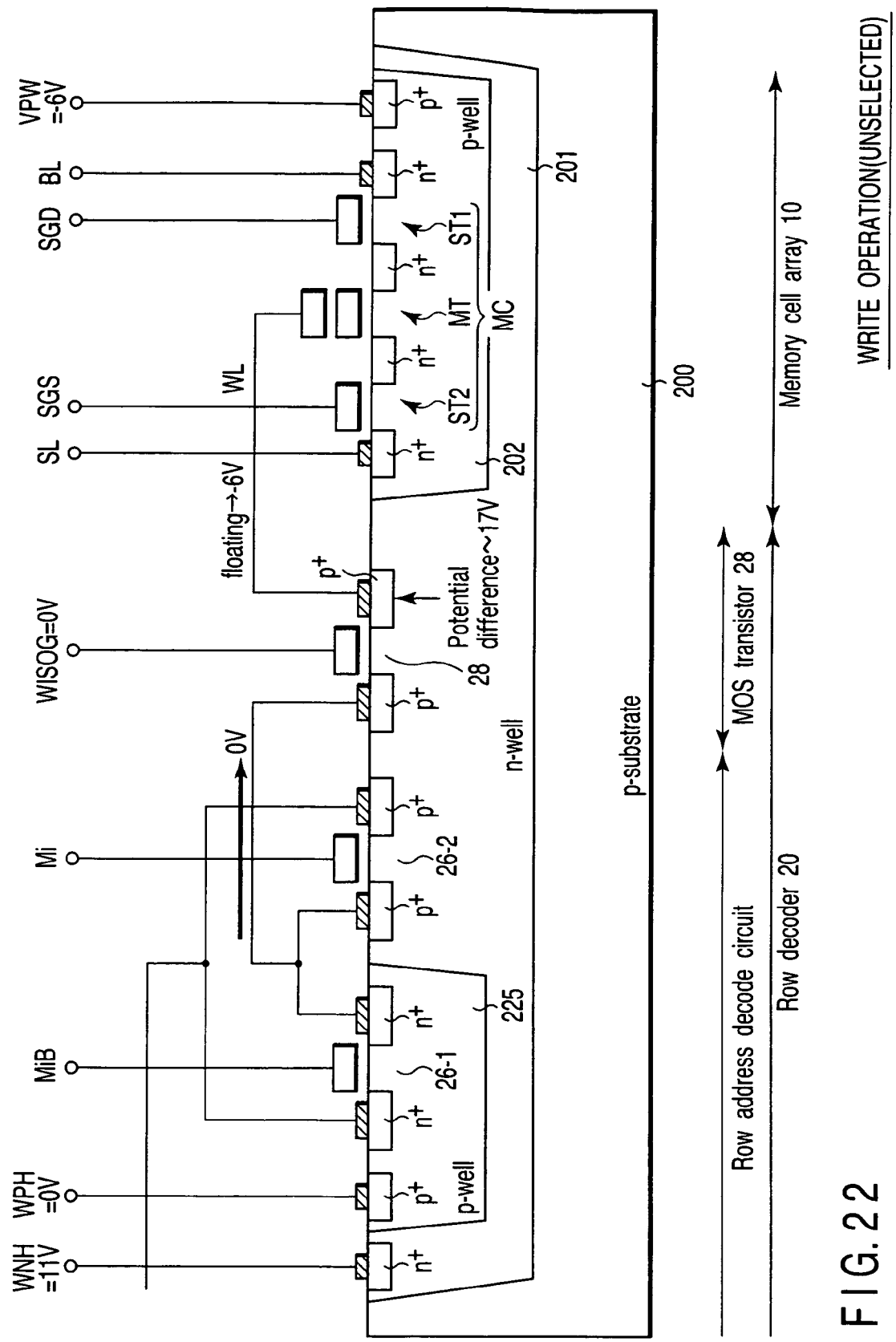
FIG. 22 is a sectional view in the row direction of the 3Tr-NAND flash memory of the first embodiment, which helps explain a write operation.

As described in item (1), the voltage applied to the gate insulating films of the MOS transistors in the row decoder 20 is only 11 to 12 at a maximum. However, as a result of using a negative voltage, there appears a place to which a voltage higher than 11 to 12V is applied. This will be explained by reference to FIG. 22. FIG. 22, which corresponds to FIG. 9, is a sectional view of a memory cell made unselected in a write operation, an isolating transistor 28, and a row address decode circuit 29.

As shown in FIG. 22, the output of the row address decode circuit 29 corresponding to an unselected word line is 0V. Since WISOG=0V, the isolating transistor 28 is in the cut-off state. Thus, the unselected word line is floating. Coupling with the p-well region 202, the potential on the unselected word line reaches about −6V. That is, the potential of the drain of the isolating transistor 28 also becomes −6V. The potential at the n-well region 201 is 11V. Therefore, there is a potential difference of about 17V at the interface between the drain of the isolating transistor 28 and the n-well region 201.

To overcome this drawback, the distance between the gate electrode of the isolating transistor 28 and the contact plug connected to the word line is made larger than the distance between the gate electrode of the MOS transistor included in the row address decode circuit 29 and the contact plug. As a result, the concentration of the voltage is alleviated near the drain of the isolating transistor 28. In other words, the drain breakdown voltage is set higher than the source breakdown voltage. Therefore, even if there appears a large potential difference between the drain of the isolating transistor 28 and the n-well region 201, the occurrence of a breakdown in the region can be prevented effectively. Consequently, the operation reliability of the flash memory can be improved.

(3) The occurrence of erroneous writing can be suppressed without decreasing the writing speed.

In the configuration of the first embodiment, the flash memory 3 has the select circuits 40 provided for the bit lines in a one-to-one correspondence. According to the data held in the latch circuit 51, the negative write voltage VNEGPRG (VBB1) is applied to the bit line via the current path of the MOS transistor 43 when "0" writing is done (to the selected bit line). On the other hand, when "1" writing is done (to the unselected bit lines), the write inhibit voltage VPI is applied to the unselected bit lines via the current paths of the corresponding MOS transistors 42. The voltage value of the write inhibit voltage VPI can be changed by the charge pump circuit 122.

Figure 23:
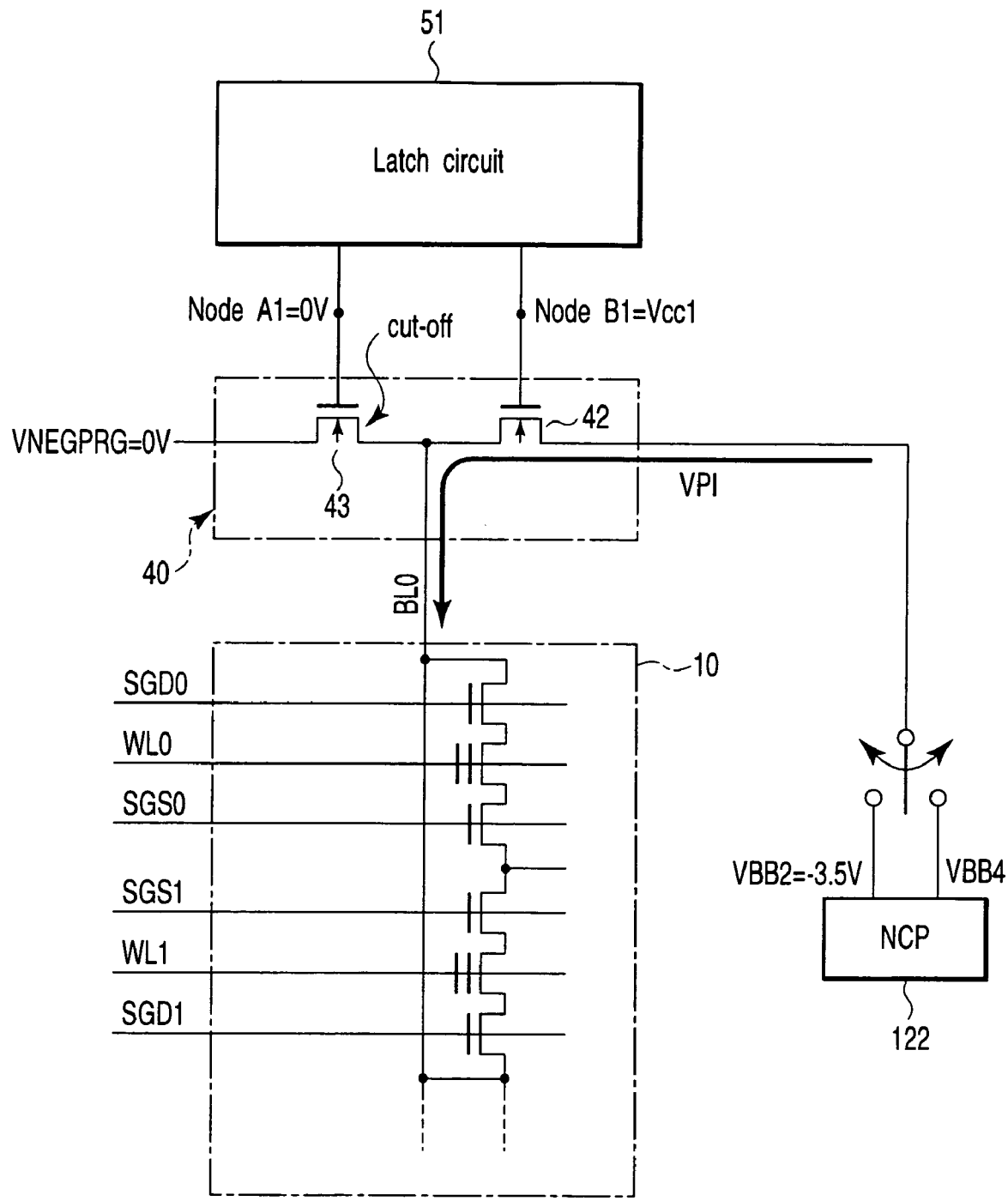
FIG. 23 is a circuit diagram of the memory cell array, a select circuit, a latch circuit, and a charge pump circuit of the 3Tr-NAND flash memory of the first embodiment, which helps explain the way of applying a write inhibit voltage to bit lines.

FIG. 23 shows the memory cell array 10, select circuit 40, latch circuit 51, and charge pump circuit 122 in a write operation. As shown in FIG. 23, the charge pump circuit 122 generates, for example, VBB2 and VBB4 as negative potentials. VBB4 may be higher or lower than VBB2. The best one of VBB2 and VBB4 to prevent erroneous writing is used as the write inhibit voltage VPI.

Then, to use a negative voltage as the write inhibit voltage VPI, the select circuits 41 are provided. For example, if the power supply voltages on the low-voltage side and high-voltage side of the latch circuit were made negative, a forward bias would be applied between the n-well region of the p-channel MOS transistor in an inverter and the semiconductor substrate, making the circuit operation unstable. In the first embodiment, however, the select circuit 41 including two n-channel MOS transistors 42, 43 formed in the same p-well region is used. Therefore, the select circuit 41 can apply VNEGPRG and VPI to the bit line. Both of VNEGPRG and VPI can be negative voltages.

Therefore, it is not necessary to change another voltage, such as the potential on the word line, to prevent erroneous writing differently from in the prior art. Erroneous writing can be suppressed by just selecting either VBB2 or VBB4 as the write inhibit voltage and using the voltage as the optimum value.

Accordingly, erroneous writing can be suppressed without decreasing the writing speed. Since the value of the write inhibit voltage VPI can be changed to a plurality of values, the degree of freedom in the circuit configuration can be increased.

(4) The write operation can be simplified.

With the configuration of the first embodiment, before a write or erase operation, the data in the latch circuits 51 is initialized in the initial operation. As a result, the input to each of the latch circuits 51 is at the low (L) level and its output is at the high (H) level.

Then, in a data latch operation, 0V is applied to the MOS transistor 91 when "0" writing is done (to the selected bit line) and 3V is applied to the MOS transistor when "1" writing is done (to the unselected bit lines). Since the MOS transistor 91 is cut off when "0" writing is done, externally supplied "0" data is actually not transferred to the latch circuits 51. That is, the data in the latch circuits 51 remains unchanged. On the other hand, when "1" writing is done, "1" data is transferred to the latch circuits 51 via the current paths of the MOS transistors 91.

Specifically, in the first embodiment, the initial operation is carried out, thereby initializing the data in the latch circuits 51. Then, when "0" writing is done (to the selected bit line), the select circuit 41 applies the write voltage VNEGPRG to the selected bit line on the basis of the initialized data. On the other hand, when "1" writing is done (to the unselected bit lines), the select circuit 41 applies the write inhibit voltage VPI to the unselected bit lines on the basis of the externally input data, not the initialized data.

Therefore, "the latch circuits 51 are initialized in the initial operation" can be paraphrased as "0 data is input to all of the latch circuits." Thus, in a write operation, when "1" data is written, or when no electron is injected into the floating gate, or in other words, only when writing is done to the unselected bit lines, data is externally input. In contrast, when "0" data is written, or when electrons are injected into the floating gate, or in other words, when writing is done to the selected bit line, there is no need to input data from the outside. Therefore, the write operation can be simplified.

(5) The reliability of the erase operation can be improved.

With the configuration of the first embodiment, however, the high ("H") level (3V) is applied to the latch circuits 51 in an erase operation. Therefore, nodes B0 to Bn are at Vcc1 and nodes A0 to An are at 0V. Accordingly, both of the MOS transistors 42, 43 are cut off. Thus, there is no current path extending from the bit lines to the VNEGPRG node and VPI node, which prevents the potentials on the bit lines from dropping. As a result, the reliability of the erase operation is improved.

(6) Control of the flash memory can be simplified.

With the configuration of the first embodiment, the transfer gate that transfers the externally input write data to the latch circuit 51 is formed by p-channel MOS transistors 91. Therefore, the circuit area can be reduced as compared with a case where the transfer gate is formed by a combination of n-channel MOS transistors and p-channel MOS transistors. In addition, the gate of the p-channel MOS transistor is always set to the ground potential, which makes it completely unnecessary to control the gate potential. Therefore, control of the flash memory can be simplified.

Figure 24:
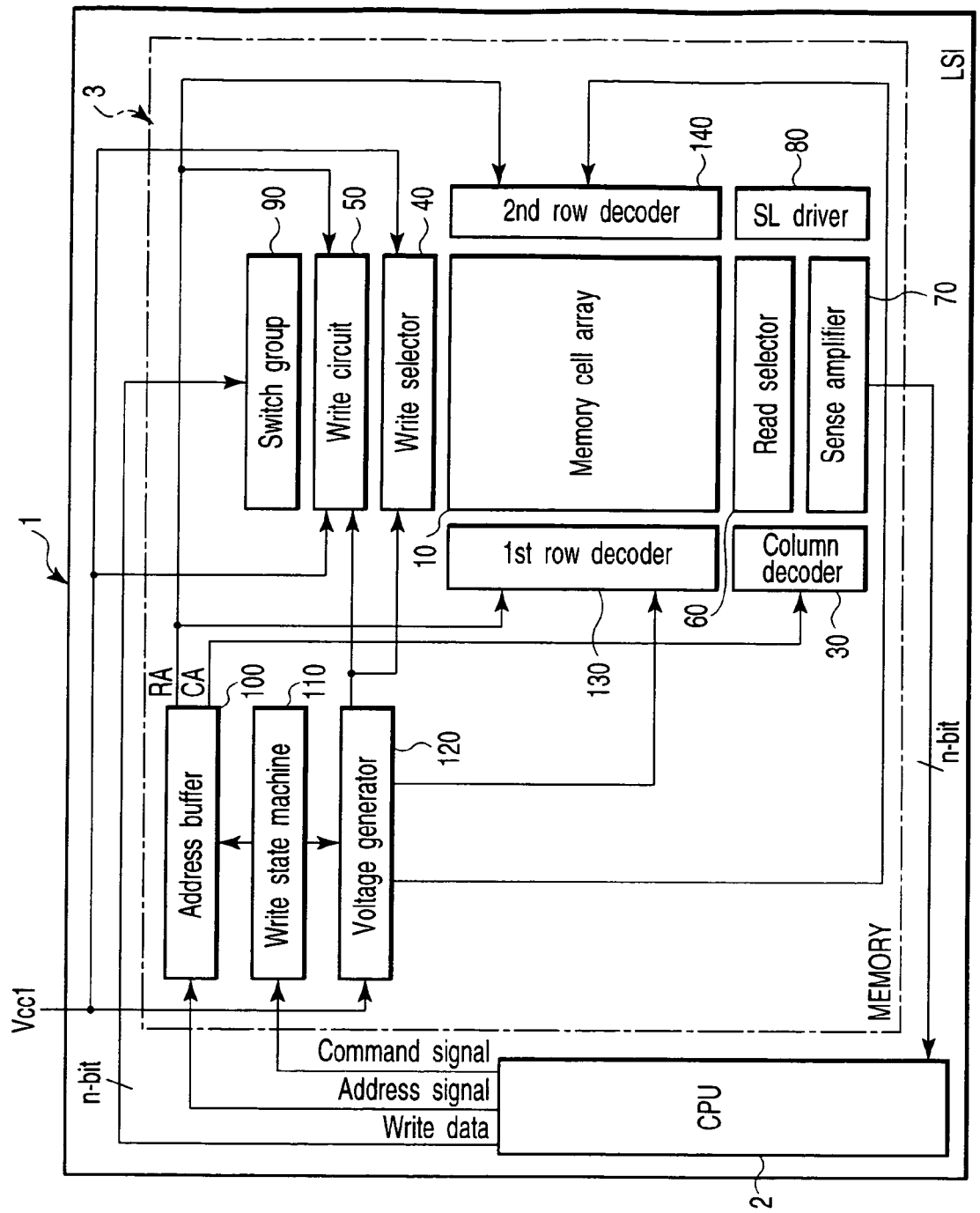
FIG. 24 is a block diagram of a system LSI according to a second embodiment of the present invention.

Next, a semiconductor memory device according to a second embodiment of the present invention will be explained. The second embodiment is such that the row decoder is divided in two in the first embodiment so that the same potential as that of the well may be applied to the unselected word lines in a write operation. FIG. 24 is a block diagram of a system LSI according to the second embodiment.

As shown in FIG. 24, the system LSI 1 according to the second embodiment is such that the row decoder 20 is replaced with a first row decoder 130 and a second row decoder 140 in the configuration of FIG. 1 explained in the first embodiment. Since the remaining configuration is the same as that of the first embodiment, its explanation will be omitted.

Figure 25:
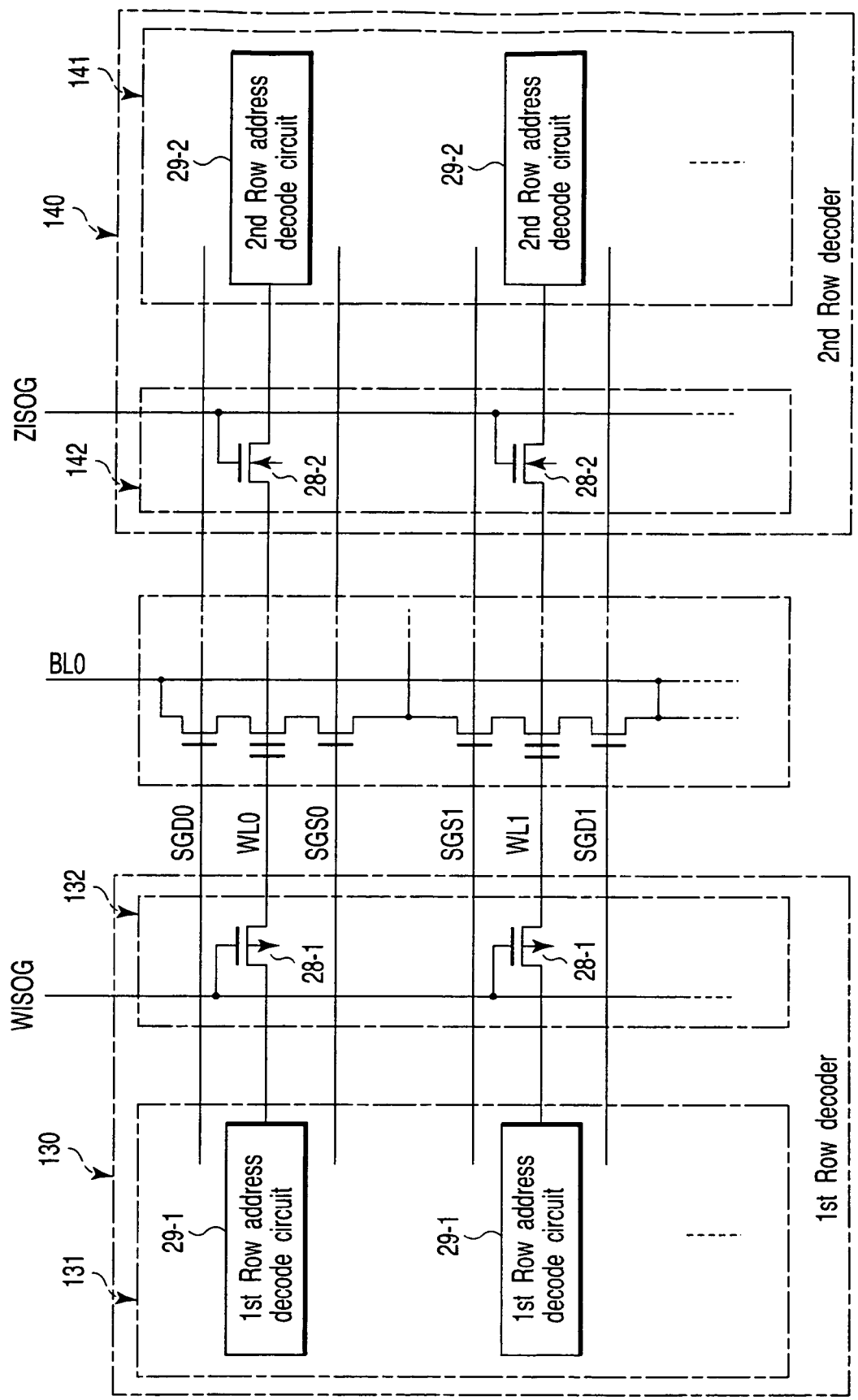
FIG. 25 is a circuit diagram of a memory cell array and a first and a second row decoder of a 3Tr-NAND flash memory according to the second embodiment.

FIG. 25 is a circuit diagram of the first and second row decoders 130, 140 and memory cell array 10. As shown in FIG. 25, the first row decoder 130 includes a row address decode circuit group 131 and a switch element group 132. The row address decode circuit group 131 includes row address decode circuits 29-1 provided for the word lines in a one-to-one correspondence. The switch element group 132 includes p-channel MOS transistors (isolating transistors) 28-1 provided for the word lines in a one-to-one correspondence. The configuration of each row address decode circuit 29-1 is the same as that of the row address decode circuit 29 explained in the first embodiment (see FIG. 3). The gates of a plurality of isolating transistors are connected in common to node WISOG. Their drains are connected to the corresponding word lines. Their sources are connected to the output nodes of the corresponding row address decode circuits 29-1.

The second row decoder 140 includes a row address decode circuit group 141 and a switch element group 142. The row address decode circuit group 141 includes row address decode circuits 29-2 provided for the word lines in a one-to-one correspondence. The switch element group 142 includes n-channel MOS transistors (isolating transistors) 28-2 provided for the word lines in a one-to-one correspondence. The configuration of each row address decode circuit 29-2 is the same as that of the row address decode circuit 29 explained in the first embodiment (see FIG. 3). The gates of a plurality of isolating transistors are connected in common to node ZISOG. Their drains are connected to the corresponding word lines. Their sources are connected to the output nodes of the corresponding row address decode circuits 29-2.

A plane configuration and a sectional configuration of the memory cell array 10 included in the 3Tr-NAND flash memory 3 are as shown in FIGS. 6 and 7 explained in the first embodiment. A sectional structure in the column direction of the memory cell array 10, write selector 40, latch circuit 50 and switch group 90 are as explained in FIG. 8.

Figure 26:
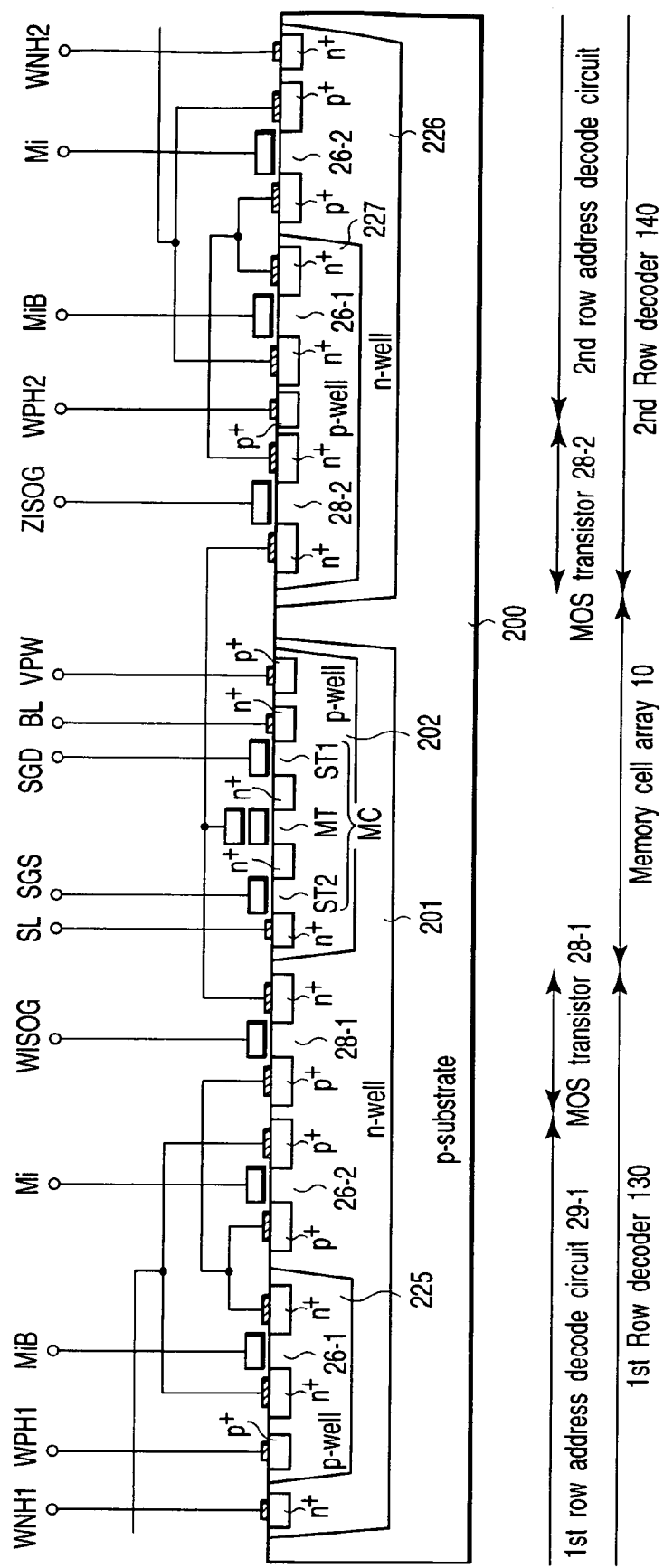
FIG. 26 is a sectional view taken in the row direction of the 3Tr-NAND flash memory in the second embodiment.
Figure 27:
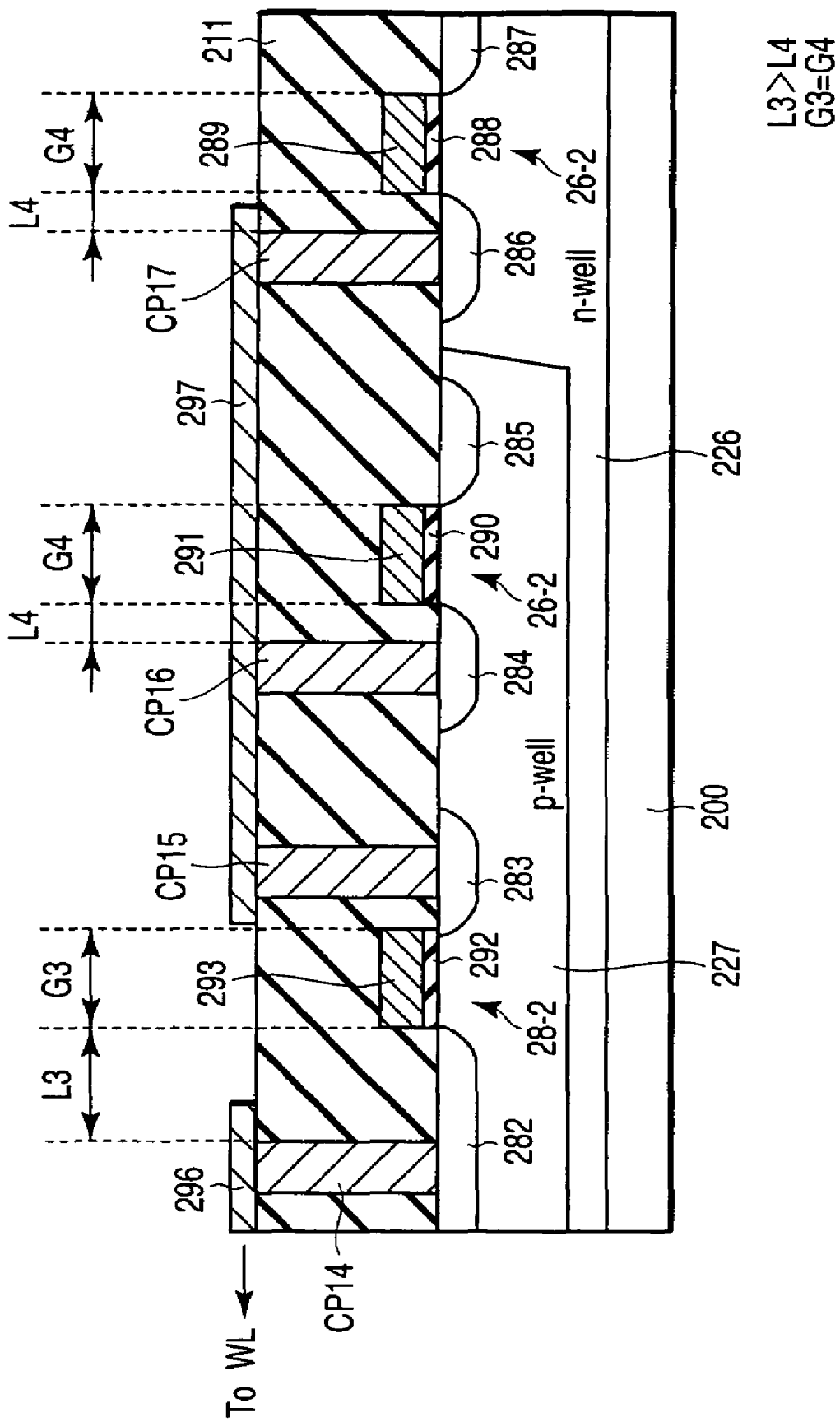
FIG. 27 is a sectional view of a part of the second row decoder included in the 3Tr-NAND flash memory of the second embodiment.

FIG. 26 is a sectional view in the row direction of a part of the memory cell array 10, switch groups 132, 142, and row address decode circuits 29-1, 29-2. FIG. 27 is a sectional view of MOS transistors 26-1, 26-2 included in the memory cell array 10, isolating transistors 28-1, 28-2, and row address decode circuits 29-1, 29-2. Since the configuration of the first row decoder 130 and memory cell array 10 is the same as that of FIG. 9 explained in the first embodiment, only the configuration of the second row decoder 140 will be explained. It is assumed that the potential applied to the p-well region 225 is WPH1 and the potential applied to the n-well region 201 is WNH1.

As shown in FIG. 26, at the surface of the p-type semiconductor substrate 200, an n-well region 226 separated from the n-well region 201 is formed. At the surface of the n-well region 226, a p-well region 227 is formed. On the p-well region 227, an isolating transistor 28-2 is formed and a MOS transistor 26-1 for the row address decode circuit 29-2 is formed. On the n-well region 226, a MOS transistor 26-2 for the row address decode circuit 29-2 is formed. The voltage WPH2 is applied to the p-well region 227 and the potential WNH1 is applied to the n-well region 226.

The relationship between the isolating transistor 28-1 and the MOS transistor of the row address decode circuit 29-1 is as explained in FIG. 10. The relationship between the isolating transistor 28-2 and the MOS transistor of the row address decode circuit 29-2 is also as explained in FIG. 10.

FIG. 27 is a sectional view of the isolating transistor 28-2 and the MOS transistors 26-1, 26-2 of the row address decode circuit 29-2. As shown in FIG. 27, the isolating transistor 28-2 includes impurity diffused layers 282, 283 (drain and source regions) formed at the surface of the p-well region 227 and a gate electrode 293 formed on the well region 227 between the impurity diffused layers 282, 283, with a gate insulating film 292 interposed between the gate electrode 293 and the well region 227. On the impurity diffused layer 282, a contact plug CP14 is formed. The contact plug CP14 is connected to a word line with a metal wiring layer 296. On the impurity diffused layer 283, a contact plug CP15 is formed.

The MOS transistor 26-1 includes impurity diffused layers 284, 285 (drain and source regions) formed at the surface of the p-well region 227 and a gate electrode 291 formed on the well region 227 between the impurity diffused layers 284, 285, with a gate insulating film 290 between the gate electrode 281 and the well region 227. On the impurity diffused layer 284, a contact plug CP 16 is formed.

The MOS transistor 26-2 includes impurity diffused layers 286, 287 (drain and source regions) formed at the surface of the n-well region 226 and a gate electrode 289 formed on the well region 226 between the impurity diffused layers 286, 287, with a gate insulating film 288 interposed between the gate electrode 289 and the well region 226. On the impurity diffused layer 286, a contact plug CP 17 is formed. The contact plugs CP15 to CP17 are connected to one another with a metal wiring layer 297.

In the above configuration, let the distance between the contact plug CP14 formed on the drain (or one of the source and drain which is connected directly to a word line) of the isolating transistor 28-2 and the gate electrode 293 be L3. In addition, let the distance between the contact plug CP16 and the gate electrode 291 and the distance between the contact plug CP17 and the gate electrode 289 be L4. Then, L3 and L4 meets the expression L3>L4. That is, the isolating transistor 28-2 is so formed that its drain breakdown voltage is higher than its source breakdown voltage.

Furthermore, let the gate length of the gate electrode 293 of the isolating transistor 28-2 be G3. In addition, let the gate length of the gate electrodes 291, 289 of the MOS transistors 26-1, 26-2 be G4. Then, G3 and G4 fulfill the equation G3=G4.

Next, the operation of the 3Tr-NAND flash memory 3 configured as described above will be explained by reference to FIGS. 12 and 28. FIG. 28 shows the potentials on the bit lines BL, word lines WL, and select gate lines SGD, SGS and the potential VPW at the p-well region 202 in an erase operation or a write operation. The second embodiment differs from the first embodiment in that the voltage applied to the unselected word lines in an erase operation is 12V and the unselected word lines are not made floating in a write operation, but are set to −6V, the same as VPW.

Since the initial operation and data latch operation are the same as in the first embodiment, explanation of them will be omitted. In addition, since the configuration that applies a voltage to the bit lines is the same as in the first embodiment, the explanation below will be given, centering on the operation of the first and second row decoders 130, 140.

<Write Operation>

Figure 29:
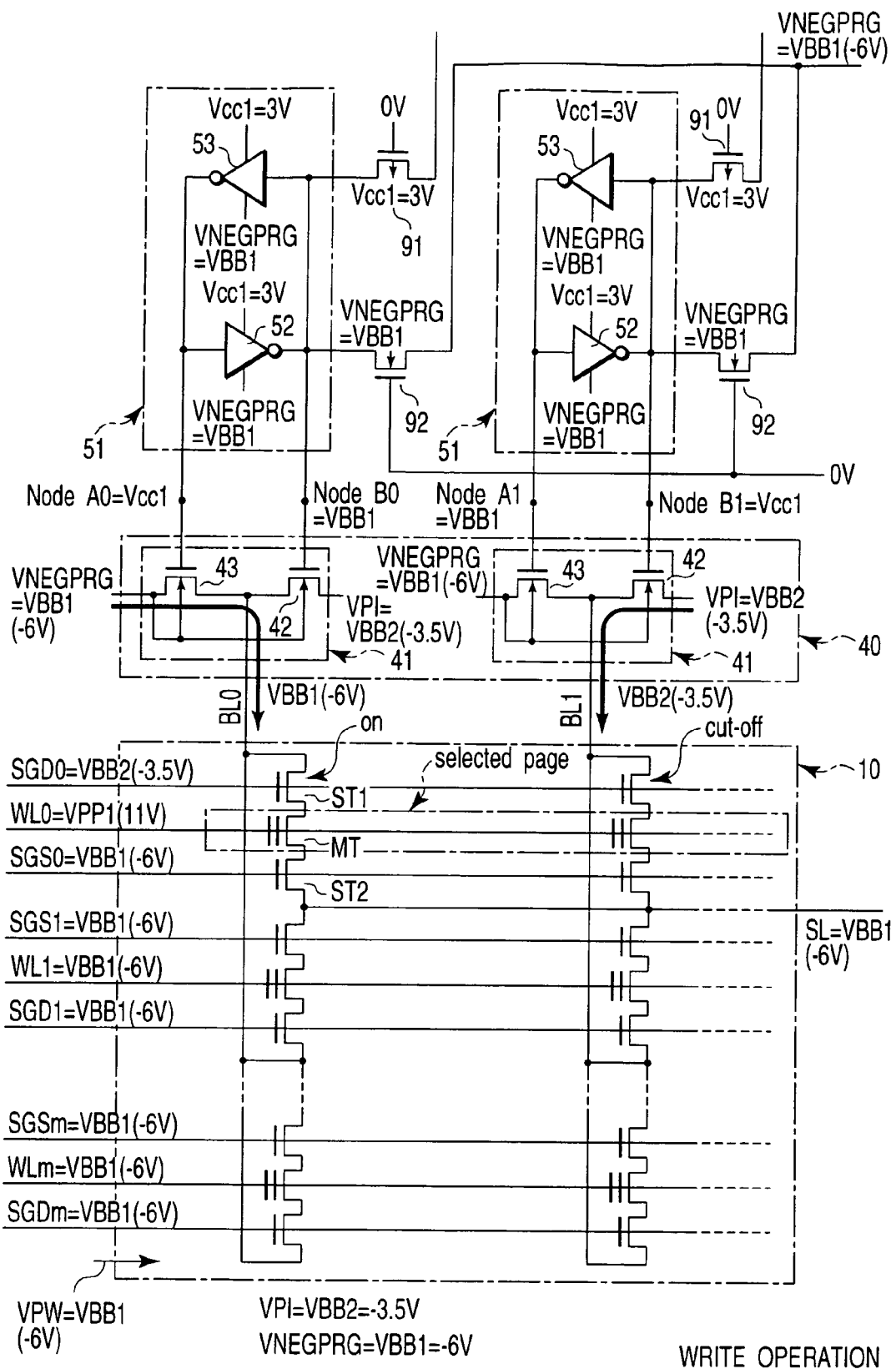
FIG. 29 is a circuit diagram of the memory cell array, write selector, write circuit, and switch group in a write operation of the 3Tr-NAND flash memory of the second embodiment.
Figure 30:
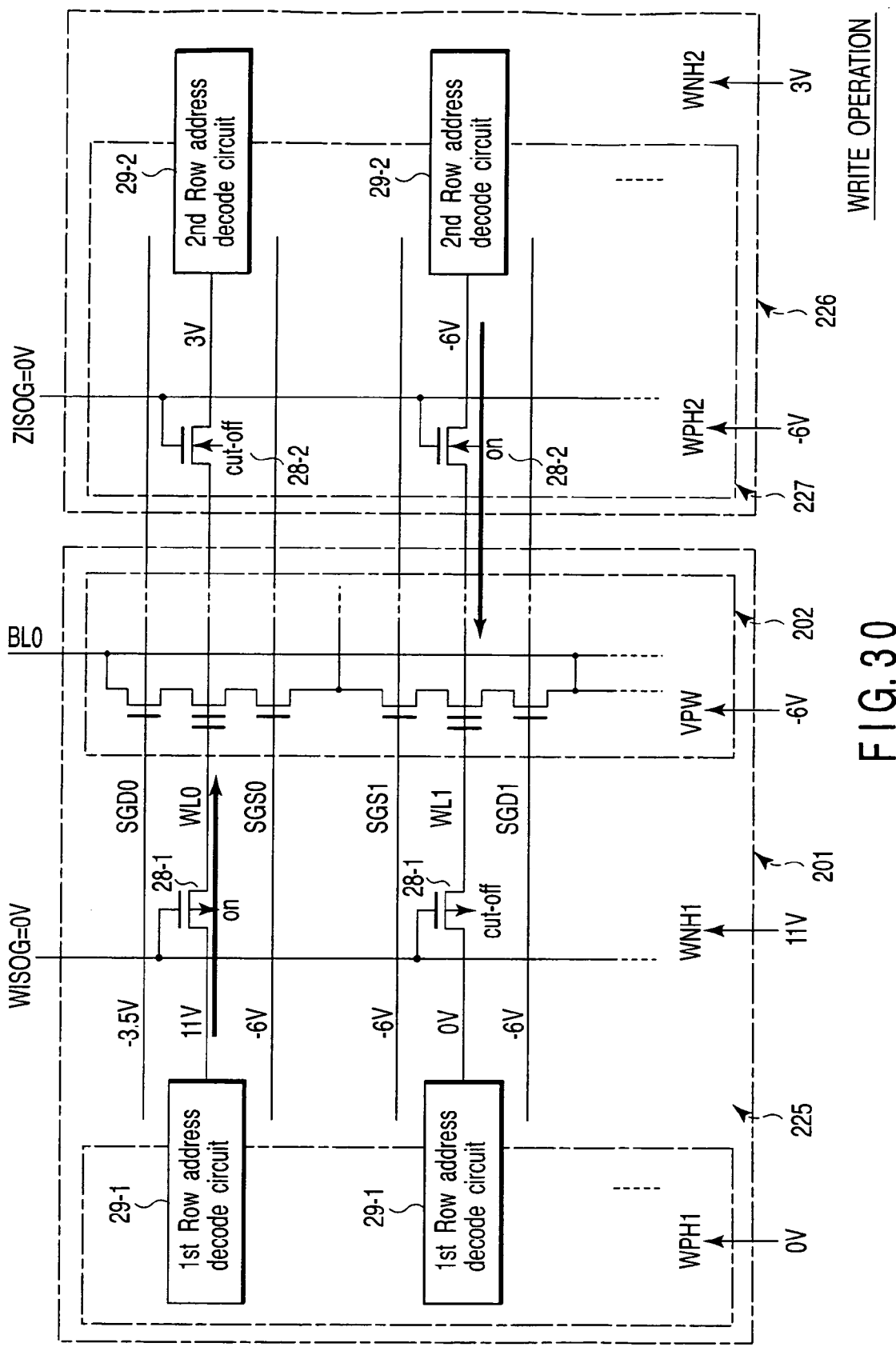
FIG. 30 is a circuit diagram of the memory cell array and the first and second row decoders in a write operation of the 3Tr-NAND flash memory of the second embodiment.

A write operation will be explained by reference to FIGS. 29 and 30. In FIG. 12, a write operation is carried out at time t4 or later. FIG. 29 is a circuit diagram of the memory cell array 10, write selector 40, write circuit 50, and switch group 90 in a write operation. In FIG. 29, it is assumed that data is written into the memory cell transistors MTs connected to the word line WL0 and that, of the memory cell transistors MTs, "0" data is written into the one connected to the bit line BL0 and "1" data is written into the one connected to the bit line BL1. FIG. 30 is a circuit diagram of the first and second row address decode circuits 29-1, 29-2, isolating transistors 28-1, 28-2, and memory cell array 10 in a write operation. In FIG. 30, each region shown by a broken line indicates the same well.

As explained in the first embodiment, VBB1 is applied to the bit line BL0 and VBB2 is applied to the bit line BL1.

Then, the first row decoder 130 or second row decoder 140 selects the select gate line SGD0, applies VBB2 to the selected select gate line SGD0, and further applies VBB1 to the unselected select gate lines SGD1 to SGDm and to all of the select gate lines SGS0 to SGSm. Then, of the select transistors ST1 connected to the selected select gate line SGD0, the one ST1 connected to the bit line BL1 applied with VBB2 is cut off. On the other hand, the select transistor ST1 connected to the bit line BL0 applied with VBB1 is turned on.

In the first row decoder 130, the first row address decode circuit 29-1 corresponding to the selected word line WL0 outputs the positive potential VPP1 (11V). The first row address decode circuits 29-1 corresponding to the unselected word lines WL1 to WLm output 0V. WISOG is set to 0V. Thus, the isolating transistor 28 corresponding to the selected word line WL0 is turned on and the isolating transistors 28 corresponding to the unselected word lines WL1 to WLm are cut off. As a result, VPP1 is applied to the selected word line WL0.

In the second row decoder 140, the second row address decode circuit 29-2 corresponding to the selected word line WL0 outputs the positive potential Vcc1 (3V). The second row address decode circuits 29-2 corresponding to the unselected word lines WL1 to WLm output VBB1. ZISOG is set to 0V. Thus, the isolating transistor 28-2 corresponding to the selected word line WL0 is cut off and the isolating transistors 28-2 corresponding to the unselected word lines WL1 to WLm are turned on. As a result, VBB1 is applied to the unselected word lines WL1 to WLm.

Furthermore, the first row decoder 130 or second row decoder 140 applies VBB1 to the substrate (p-well region 202) in which memory cells are formed. The potentials WNH1, WPH1 of the n-well region 201 and p-well region 225 are set to Vcc1 and VBB1, respectively.

As a result, the memory cell transistor MT in the memory cell including the cut-off select transistor ST1 keeps its negative threshold value unchanged. In addition, electrons are injected into the memory cell including the select transistor ST1 connected to the selected select gate line SGD0 and the bit line BL0, with the result that the threshold value of the memory cell transistor MT changes to positive.

<Erase Operation>

Figure 31:
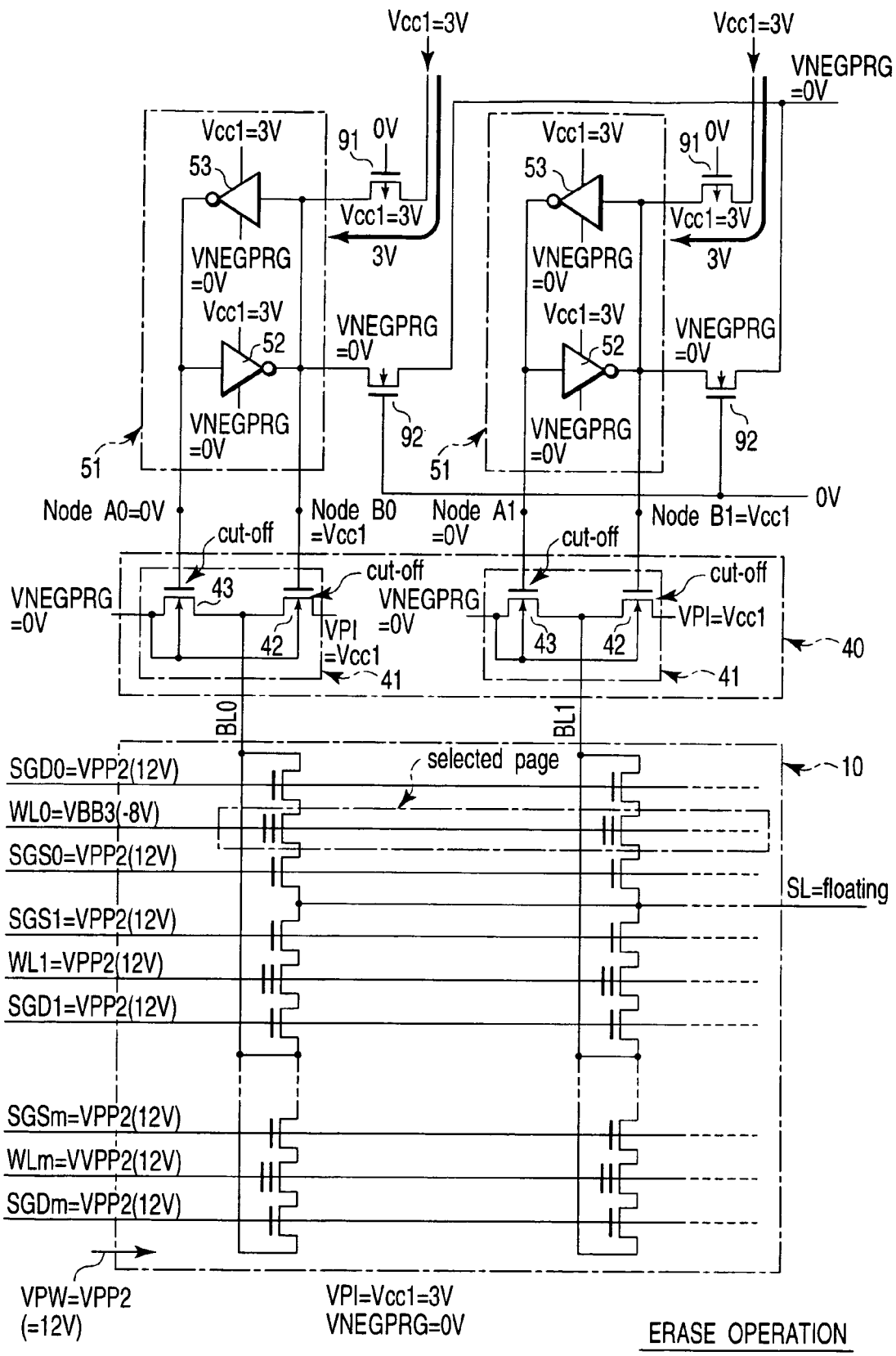
FIG. 31 is a circuit diagram of the memory cell array, write selector, write circuit, and switch group in an erase operation of the 3Tr-NAND flash memory of the second embodiment.
Figure 32:
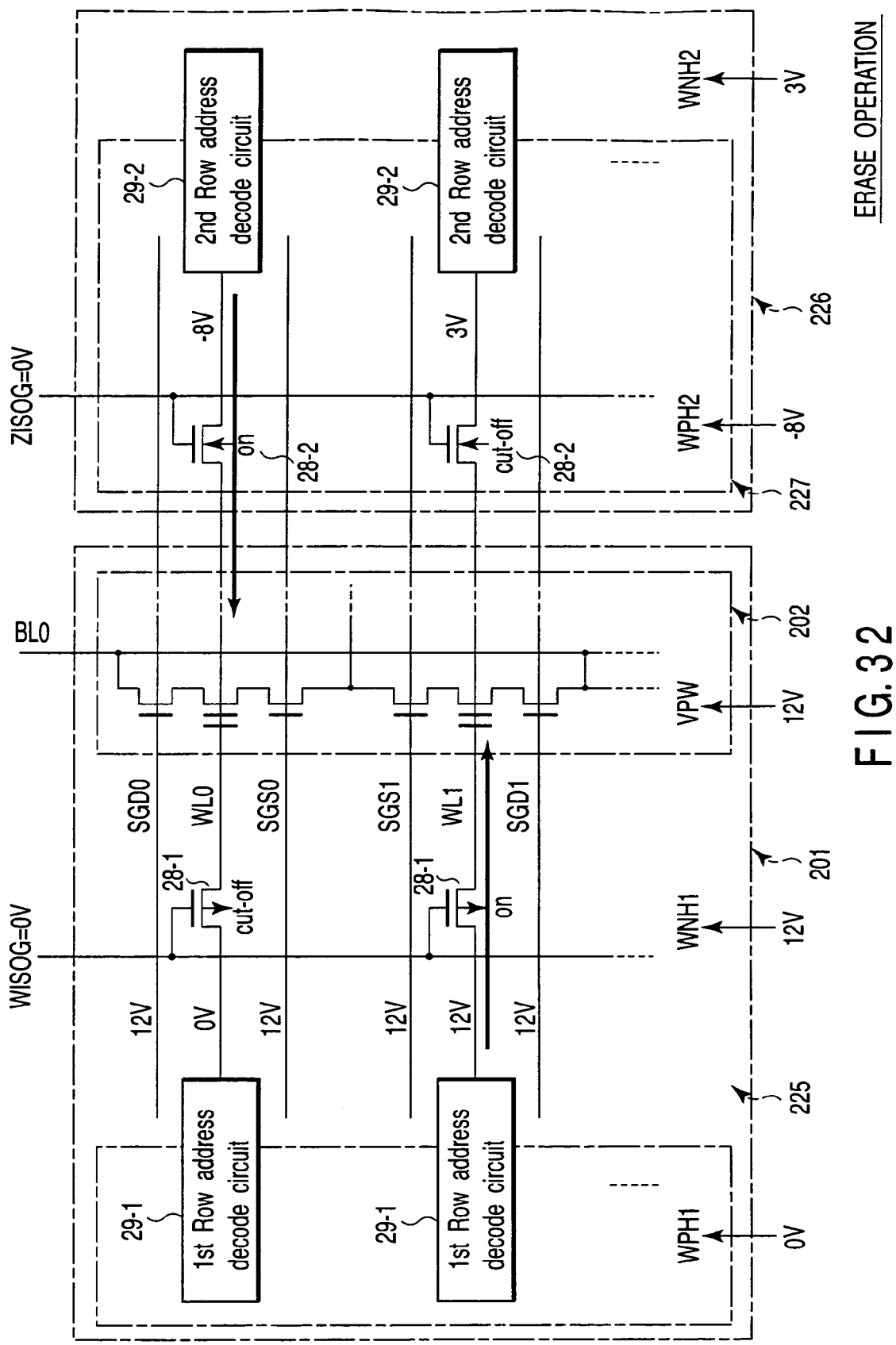
FIG. 32 is a circuit diagram of the memory cell array and the first and second row decoders in an erase operation of the 3Tr-NAND flash memory of the second embodiment.

Next, an erase operation will be explained by reference to FIGS. 31 and 32. FIG. 32 is a circuit diagram of the memory cell array 10, write selector 40, write circuit 50, and switch group 90 in an erase operation. FIG. 31 shows a case where the data is erased from the memory cell transistors connected to the word line WL0. FIG. 32 is a circuit diagram of the first and second row address decode circuits 29-1, 29-2, isolating transistors 28-1, 28-2, and memory cell array 10 in a write operation.

As explained in the first embodiment, the bit lines BL0 to BLn are separated electrically from the latch circuits 51, VNEGPRG and VPI and therefore go into the floating state.

Then, the first row decoder 130 or second row decoder 140 applies VPP2 (12V) to all of the select gate lines SGD0 to SGDm, SGS0 to SGSm. In addition, in the first row decoder 130, the first row address decode circuit 29-1 corresponding to the word line WL0 outputs 0V. The first row address decode circuits 29-1 corresponding to the unselected word lines WL1 to WLm output VPP2. Then, WISOG is set to, for example, 0V. Thus, the isolating transistor 28-1 corresponding to the selected word line WL0 is cut off and the isolating transistors 28-1 corresponding to the unselected word lines WL1 to WLm are turned on. As a result, the first row address decode circuit 29-1 applies VPP2 to the unselected word lines WL1 to WLm.

Furthermore, in the second row decoder 140, the second row address decode circuit 29-2 corresponding to the selected word line outputs VBB3 (−8V). The second row address decode circuits 29-2 corresponding to the unselected word lines WL1 to WLm output Vcc1. Then, ZISOG is set to, for example, 0V. Thus, the isolating transistor 28-2 corresponding to the selected word line WL0 is turned on and the other isolating transistors 28-2 are cut off. As a result, the second row address decode circuit 29-2 applies VBB3 to the selected word line WL0.

In addition, one of the first and second row decoders 130, 140 applies VPP2 (12V) to the semiconductor substrate (p-well region 202) in which memory cells are formed. The potentials WNH1, WPH1 of the n-well region 201 and p-well region 225 are set to VPP2 and 0V, respectively. The potentials WNH2, WPH2 of the n-well region 226 and p-well region 227 are set to Vcc1 and VBB3, respectively.

As a result, the data is erased from the memory cell transistors MTs connected to the selected word line WL0, with the result that the threshold values of the memory cell transistors MTs become negative. In the memory cell transistors MTs connected to the unselected word lines WL1 to WLm, there is no potential difference between the word lines WL1 to WLm and the well region, which prevents the data from being erased.

<Read Operation>

Figure 33:
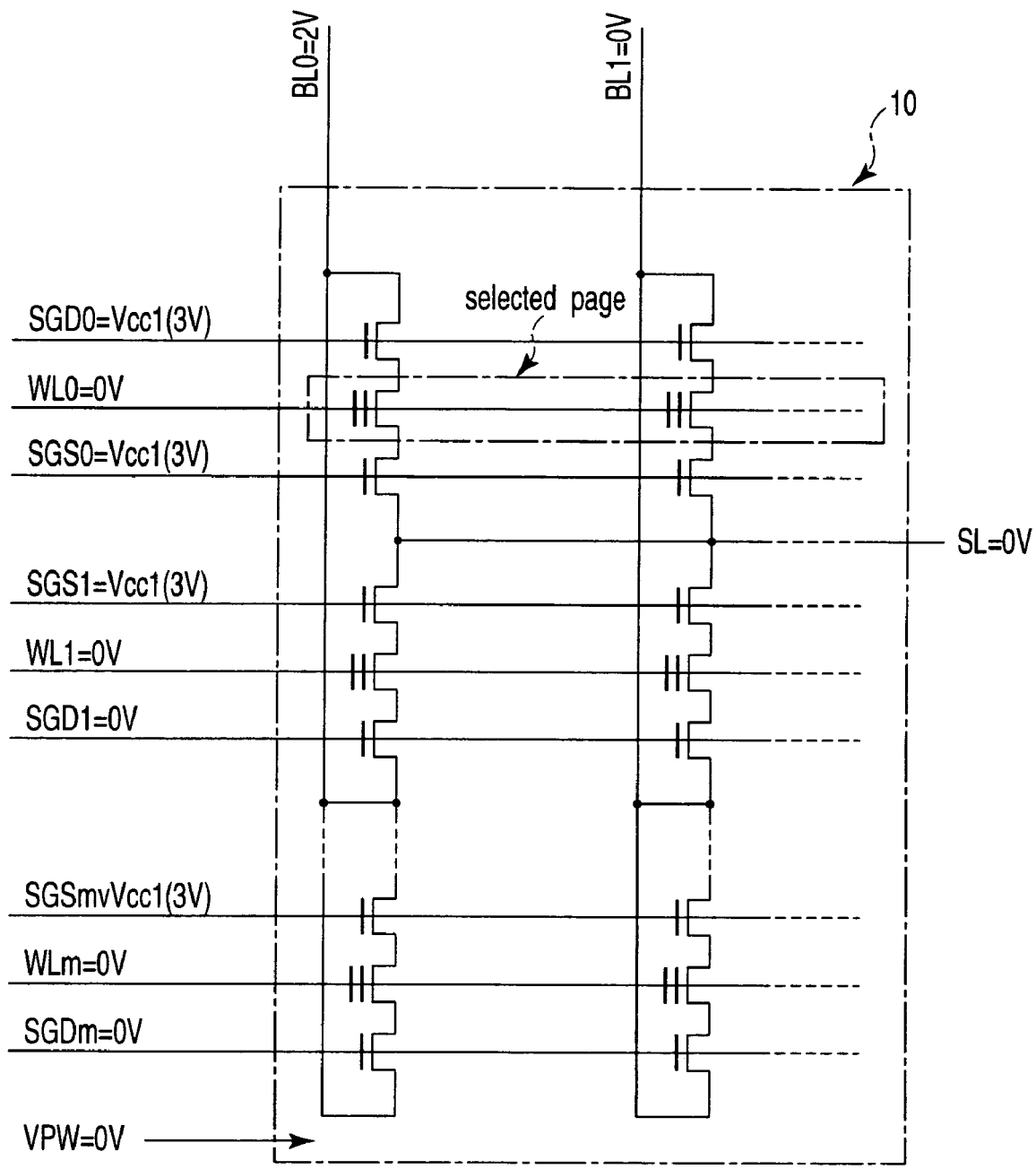
FIG. 33 is a circuit diagram of the memory cell array in a read operation of the 3Tr-NAND flash memory of the second embodiment.
Figure 34:
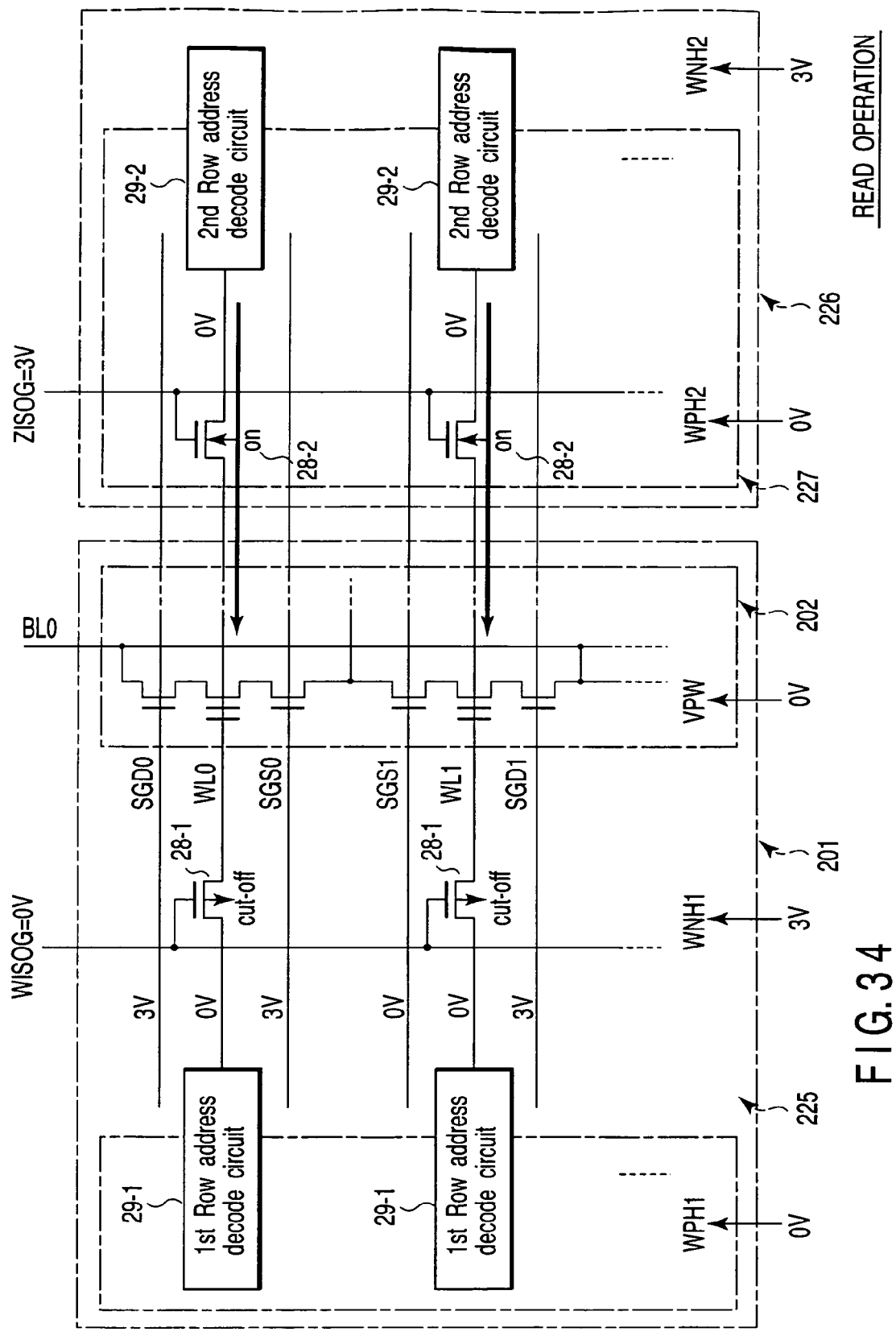
FIG. 34 is a circuit diagram of the memory cell array and the first and second row decoders in a read operation of the 3Tr-NAND flash memory of the second embodiment.

Next, a read operation will be explained by reference to FIGS. 33 and 34. FIG. 33 is a circuit diagram of the memory cell array 10 of the 3Tr-NAND flash memory 3. FIG. 33 shows a case where the data is read from the memory cell transistor MT connected to the bit line BL0 and to the word line WL0. FIG. 34 is a circuit diagram of the first and second row address decode circuits 29-1, 29-2, isolating transistors 28-1, 28-2, and memory cell array 10 in a read operation.

First, one of the first and second row decoders 130, 140 applies Vcc1 (3V) to all of the select gate lines SGS0 to SGSm and further applies Vcc1 to the selected gate line SGD0 and 0V to the unselected select gate lines SGD1 to SGDm. As a result, the select transistors ST1, ST2 connected to the selected select gate lines SGD0, SGS0 are turned on. Specifically, a voltage is applied to the select gate lines SGD on the basis of the row address signal, whereas a voltage is applied to the select gate lines SGS simultaneously, regardless of the row address signal.

In the first row decoder 130, all of the first row address decode circuits 29-1 output 0V. WISOG is set to 0V. Thus, all of the isolating transistors 28-1 are cut off. In the second row decoder 140, all of the second row address decode circuits 29-2 output 0V. ZISOG is set to 3V. Thus, all of the isolating transistors 28-2 are turned on. As a result, the second row address decode circuits 29-2 output 0V to all of the word lines WL0 to WLm. The potentials WNH1, WPH1 of the n-well region 201 and p-well region 225 are set to Vcc1 and 0V, respectively. The potentials WNH2, WPH2 of the n-well region 226 and p-well region 227 are set to Vcc1 and 0V, respectively.

Since the threshold value is negative if the written data is "1", the memory cell transistor MT is in the on state. Since the threshold value is positive if the written data is "0", the memory cell transistor MT is in the off state.

In this state, the bit lines are connected to the sense amplifier 70 via the read selector 60, with the result that, for example, 2.0V is applied to the selected bit line BL0, thereby reading the data.

Figure 35:
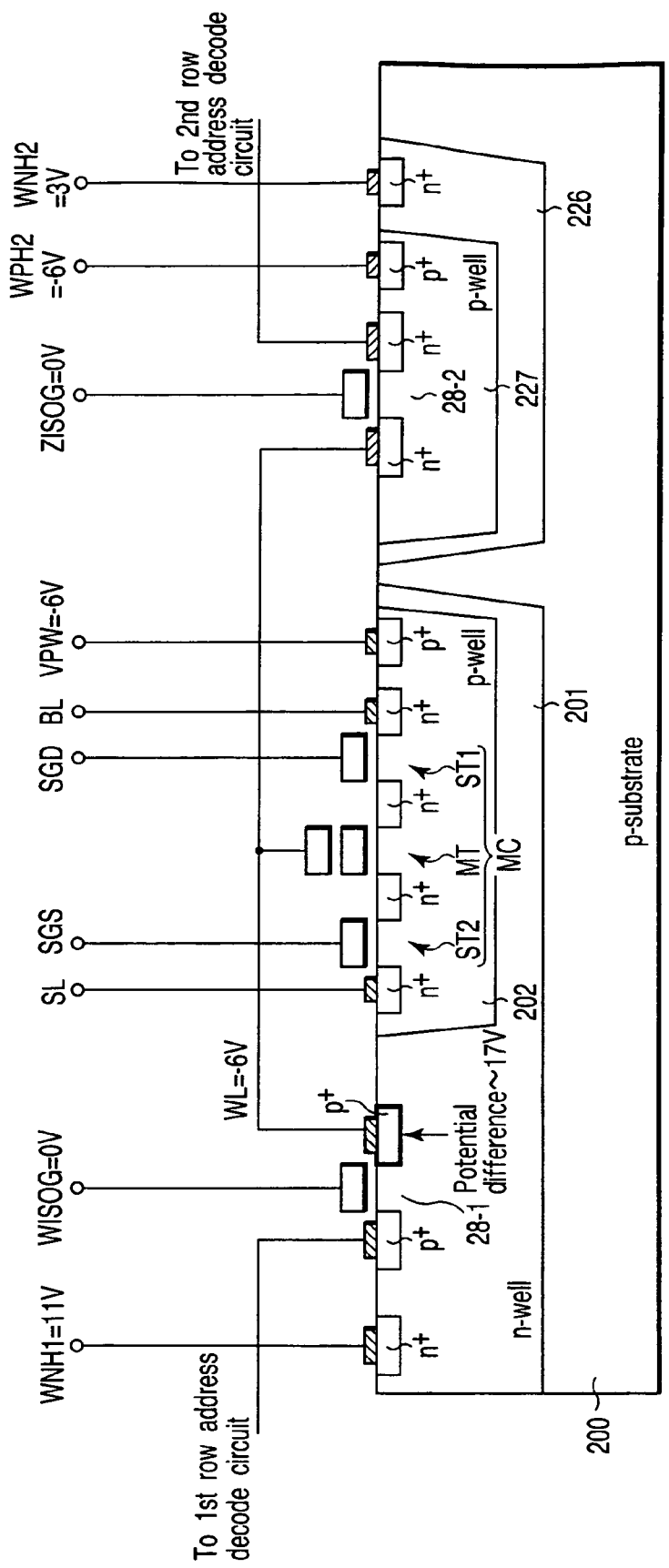
FIG. 35 is a sectional view in the row direction of the 3Tr-NAND flash memory of the second embodiment, which helps explain a write operation.
Figure 36:
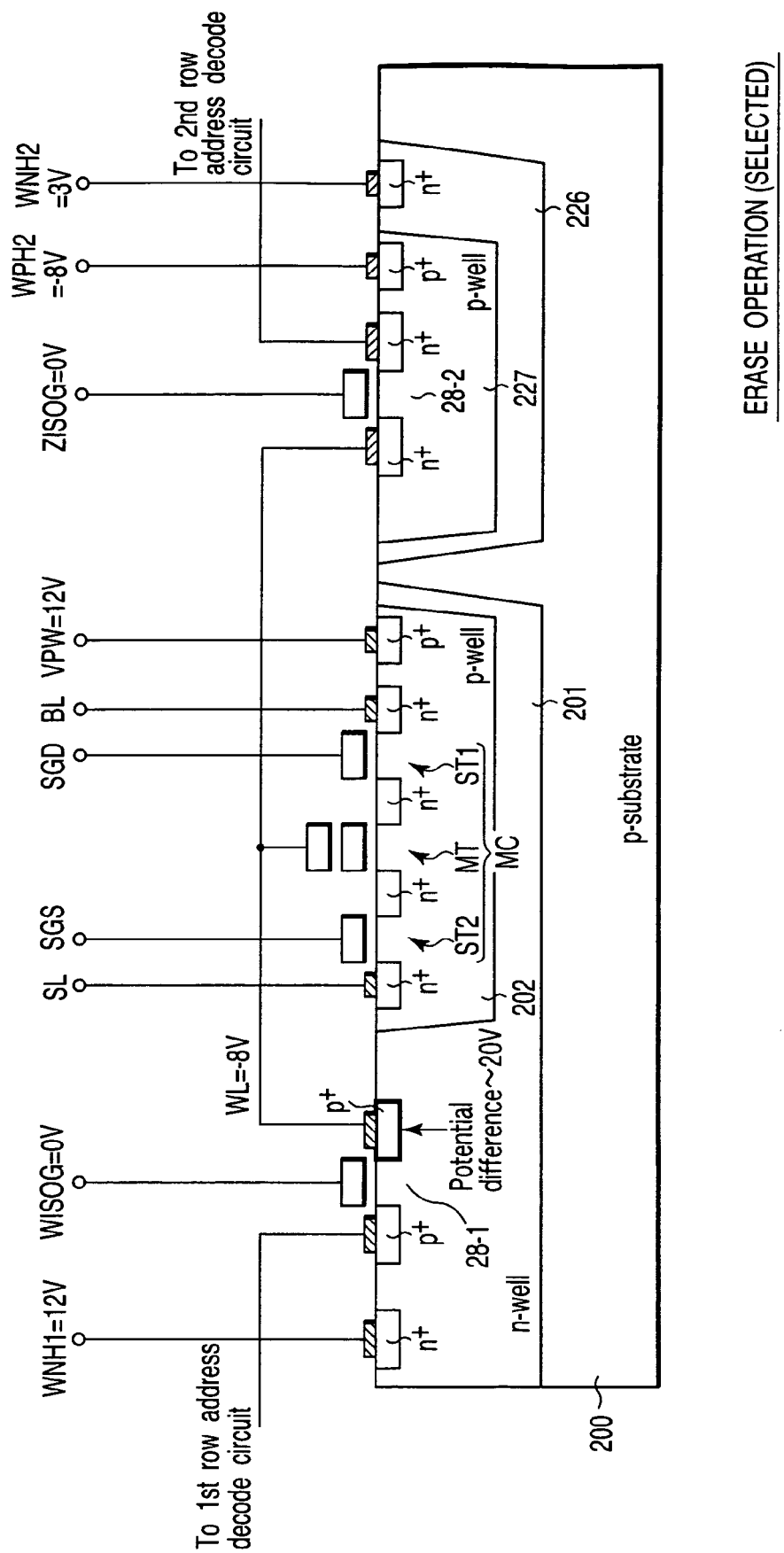
FIG. 36 is a sectional view in the row direction of the 3Tr-NAND flash memory of the second embodiment, which helps explain an erase operation.
Figure 37:
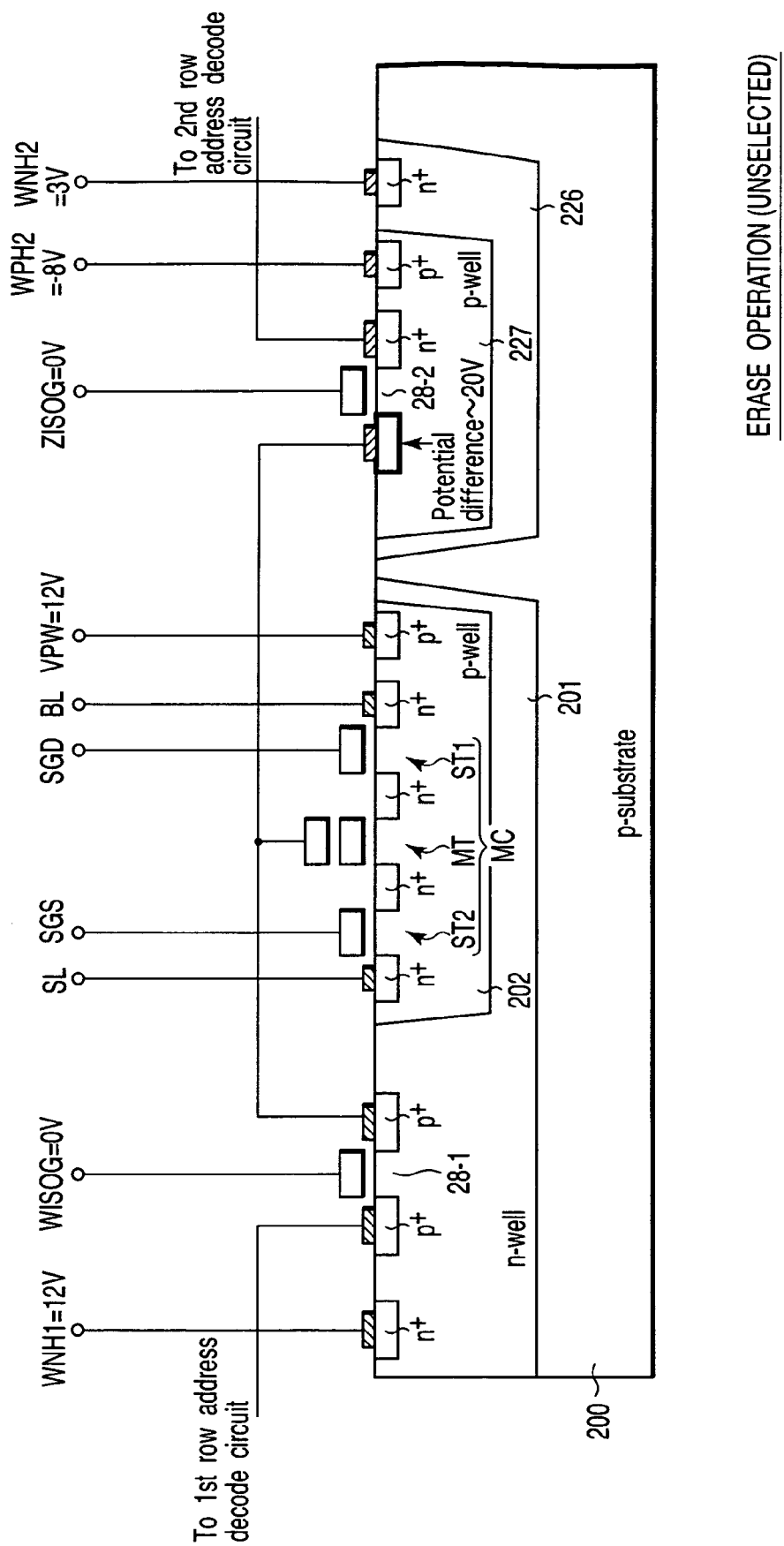
FIG. 37 is a sectional view in the row direction of the 3Tr-NAND flash memory of the second embodiment, which helps explain an erase operation.

As described above, the flash memory of the second embodiment produces the effects in item (1) to item (6) explained in the first embodiment. Hereinafter, the effect in item (2) will be explained by reference to FIGS. 35 to 37. FIGS. 35 to 37 are sectional views of the memory cell array 10 and isolating transistors 28-1, 28-2. FIG. 35 shows a region selected for writing. FIG. 36 shows a region selected for erasing. FIG. 37 shows a region unselected for erasing.

First, as shown in FIG. 35, −6V is applied to the unselected word lines. Therefore, the potential of the drain of the isolating transistor 28-1 in the cut off state is at −6V. The potential VNH1 of the n-well region 201 is kept at −11V. As a result, a potential difference of 17V appears between the drain of the isolating transistor 28-1 and the n-well region 201.

As shown in FIG. 36, −8V is applied to the selected word line in an erase operation. Therefore, the potential of the drain of the isolating transistor 28-1 in the cut off state is at −8V. The potential WNH1 of the n-well region 201 is kept at 12V. As a result, a potential difference of 20V appears between the drain of the isolating transistor 28-1 and the n-well region 201.

Furthermore, as shown in FIG. 37, 12V is applied to the unselected word lines in an erase operation. Therefore, the potential of the drain of the isolating transistor 28-2 in the cut off state is also at 12V. The potential WNH2 of the p-well region 227 is kept at −8V. As a result, a potential difference of 20V appears between the drain of the isolating transistor 28-2 and the p-well region 227.

As described above, the isolating transistors 28-1, 28-2 are formed so as to alleviate the concentration of an electric field near the drains of the isolating transistors (see FIGS. 10 and 27). Accordingly, as explained in item (2) in the first embodiment, it is possible to prevent the drains of the isolating transistors from being broken down.

The second embodiment further produces the following effects in item (7) and item (8). (7) The operation reliability of the flash memory can be improved.

With the second embodiment, the first row decoder 130 supplies the positive voltage and the second row decoder 140 supplies the negative voltage in an erase operation and a write operation. Therefore, in an erase operation, the same voltage as the potential VPW at the p-well region where the memory cells are formed can be applied to the unselected word lines. As a result, almost no voltage stress is applied to the gate insulating films of the memory cell transistors connected to the unselected word lines. Consequently, the deterioration of the gate insulating films of the memory cell transistors can be prevented.

Furthermore, in a write operation, the same voltage as the potential VPW can be applied to the unselected word lines. Applying the voltage directly to the unselected word lines without coupling suppresses the application of a voltage stress to the gate insulating films effectively.

Accordingly, the operation reliability of the flash memory can be improved. (8) Control of the flash memory can be simplified.

With the second embodiment, the first row decoder 130 supplies the positive voltage and the second row decoder 140 supplies the negative voltage in an erase operation and a write operation. Therefore, WISOG and ZISOG, the gate potentials of the isolating transistors 28-1, 28-2, can be kept constantly at 0V in a write operation and an erase operation. That is, control of WISOG and ZISOG becomes unnecessary, which helps simplify the control of the operation.

In the second embodiment, a constant voltage has been applied to the sources of all of the select transistors in a read operation and a voltage according to the row address signal has been applied to their drains. These voltages may be replaced with each other. Specifically, the constant voltage may be applied to the drains of all of the select transistors and the voltage according to the row address signal may be applied to their sources.

Figure 38:
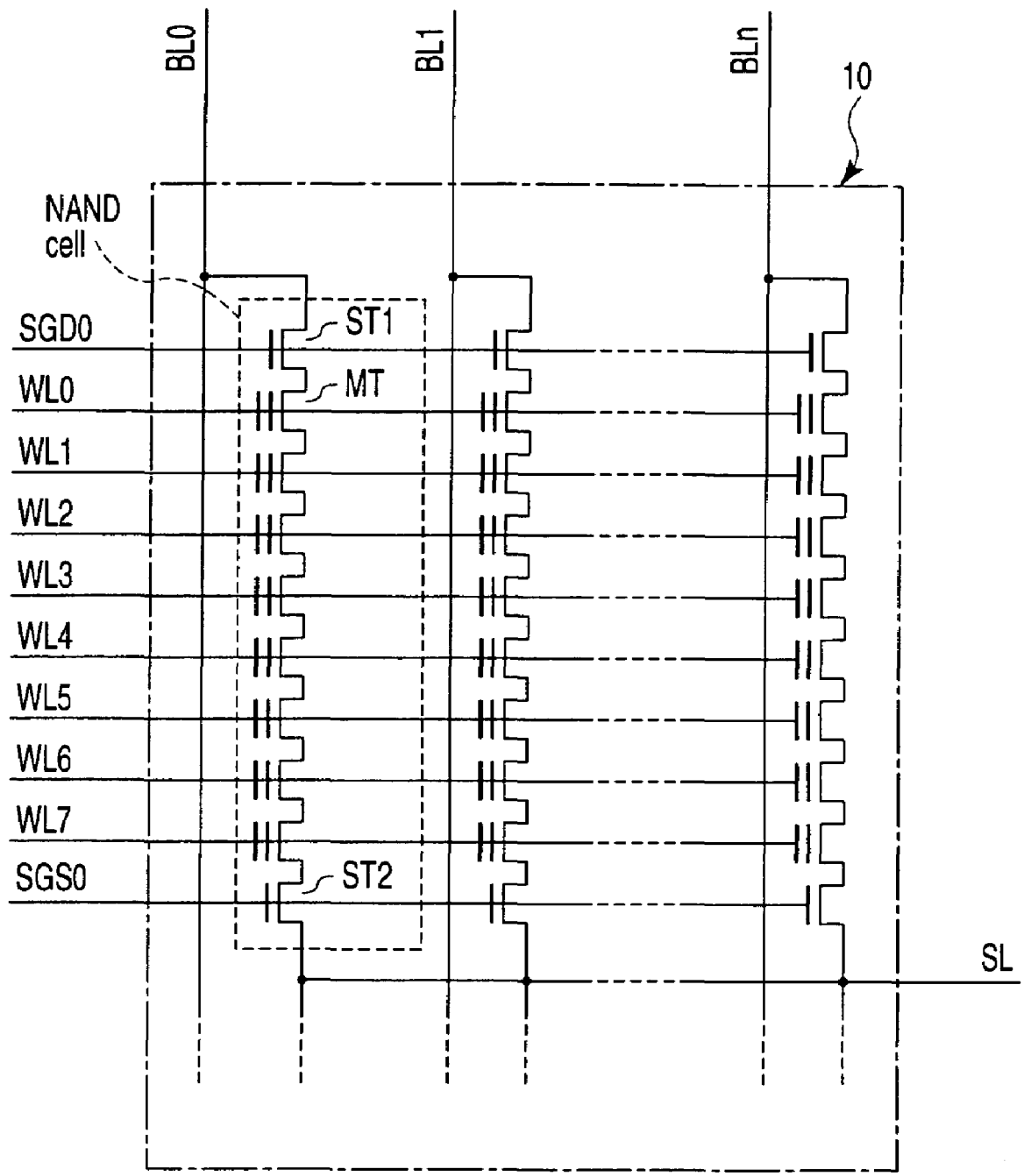
FIG. 38 is a circuit diagram of a memory cell array included in a NAND flash memory according to a third embodiment of the present invention.

Next, a semiconductor memory device according to a third embodiment of the present invention will be explained. The third embodiment is such that the second embodiment is applied to a NAND flash memory. Specifically, the memory cell array 10 of FIG. 24 is replaced with a NAND flash memory and the generated voltage of the voltage generator 120 is changed. Therefore, an explanation of the configuration excluding the memory cell array 10 and voltage generator 120 will be omitted. FIG. 38 is a circuit diagram of the memory cell array 10 included in the flash memory 3 of the third embodiment.

As shown in FIG. 38, the memory cell array 10 has a plurality of NAND cells arranged in a matrix. Each of the NAND cells includes eight memory cell transistors MTs and select transistors ST1, ST2. Each of the memory cell transistors MTs has a stacked-gate structure that includes a floating gate formed above a semiconductor substrate with a gate insulating film interposed therebetween and a control gate formed on the floating gate with an inter-gate insulating film interposed therebetween. The number of memory cell transistors MTs is not limited to 8 and may be 16 or 32. The number is illustrative and not restrictive. The adjoining ones of the memory cell transistors MTs share their source and drain. They are arranged in such a manner that their current paths are connected in series between the select transistors ST1, ST2. The drain region at one end of the series connection of the memory cell transistors MTs is connected to the source region of the select transistor ST1. The source region at the other end is connected to the drain region of the select transistor ST2.

The control gates of the memory cell transistors MTs in a same row are connected in common to any one of word lines WL0 to WLm. The gates of the select transistors ST1, ST2 in the same row are connected in common to select gate lines SGD, SGS, respectively. The drains of the select transistors ST1 in a same column are connected in common to any one of bit lines BL0 to BLn. The sources of the select transistors ST2 are connected in common to a source line SL and then connected to a source line driver 15. Both of the select transistors ST1, ST2 are not necessarily needed. Only one of them may be used, provided that it can select a NAND cell.

The voltage generator 120 generates a plurality of internal voltages on the basis of the voltage Vcc1 externally input.

Figure 39:
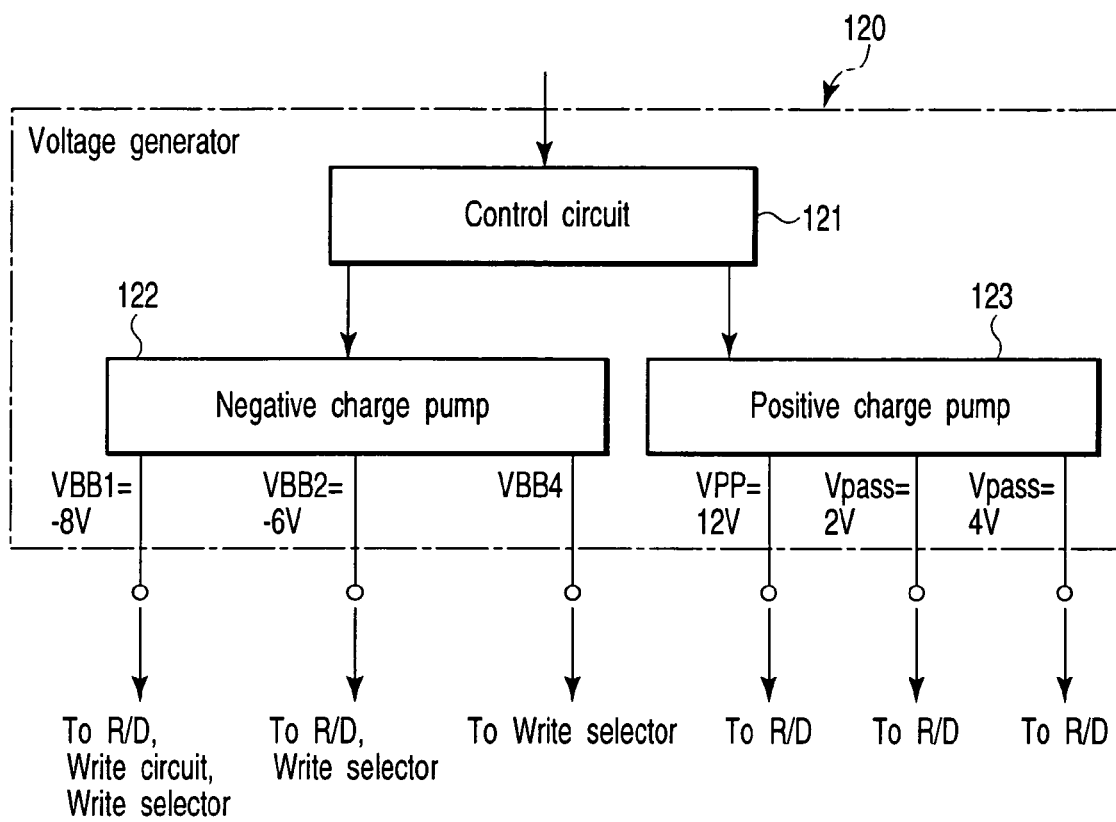
FIG. 39 is a block diagram of a voltage generator included in the NAND flash memory of the third embodiment.

FIG. 39 is a circuit diagram of the voltage generator circuit 120. As shown in FIG. 39, the configuration of the voltage generator 120 is as explained in the first embodiment. The charge pump circuit 122 generates the negative voltages VBB1 (=−8V), VBB2 (=−6V), and VBB4. The charge pump circuit 123 generates the positive voltages VPP (=12V), Vpass (=2V), and Vpass2 (=4V).

Figure 40:
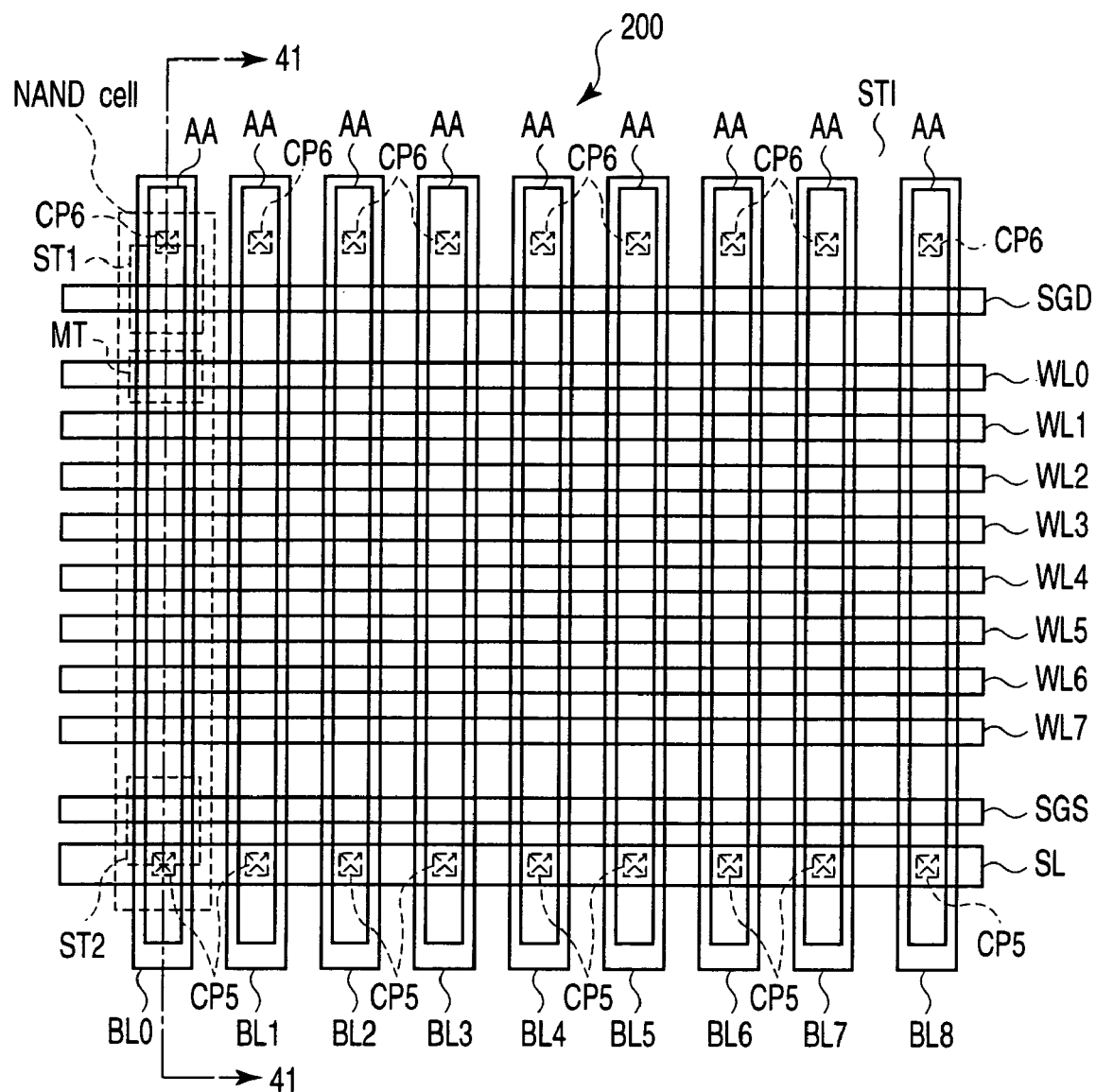
FIG. 40 is a plan view of the memory cell array included in the NAND flash memory of the third embodiment.

Next, a plane configuration and a sectional configuration of the memory cell array 10 included in the NAND flash memory 3 will be explained. FIG. 40 is a plan view of a part of the memory cell array 10.

As shown in FIG. 40, in the semiconductor substrate 200, a plurality of strip-shaped element regions AAs extending in a first direction are formed in a second direction. Strip-shaped word lines WL0 to WLm, which extend in the second direction, are formed so as to cross the plurality of element regions AAs. In addition, strip-shaped select gate lines SGD, SGS, which extend in the second direction, are formed so as to sandwich eight word lines between them. In the regions where the word lines WL0 to WLm cross the element regions AAs, memory cell transistors MTs are formed. In the regions where the select gate lines SGD, SGS cross the element regions AAs, select transistors ST1, ST2 are formed. Furthermore, in the regions where the word lines WL0 to WLm cross the element regions AAs, floating gates (not shown) isolated on a memory cell transistor MT basis are formed. Like the memory cell transistor MT, each of the select transistors ST1, ST2 has a control gate and a floating gate. However, differently from the memory cell transistor MT, the floating gate is connected to both of the select transistors STs adjacent to each other in the second direction. Then, in a shunt region (not shown), the floating gate of the select transistors ST1, ST2 is connected to their control gates.

On the source region of each of the select transistors ST2, a strip-shaped source line SL extending in the second direction is formed. The source line SL is connected to the source regions of the select transistors ST2 via contact plugs CP5. The source line SL is connected to a source line driver 80.

On the element regions AAs, strip-shaped bit lines BL0 to BLn extending in the first direction are formed. The bit lines BL0 to BLn are connected to the drain regions of the select transistors ST1 via contact plugs CP6.

Figure 41:
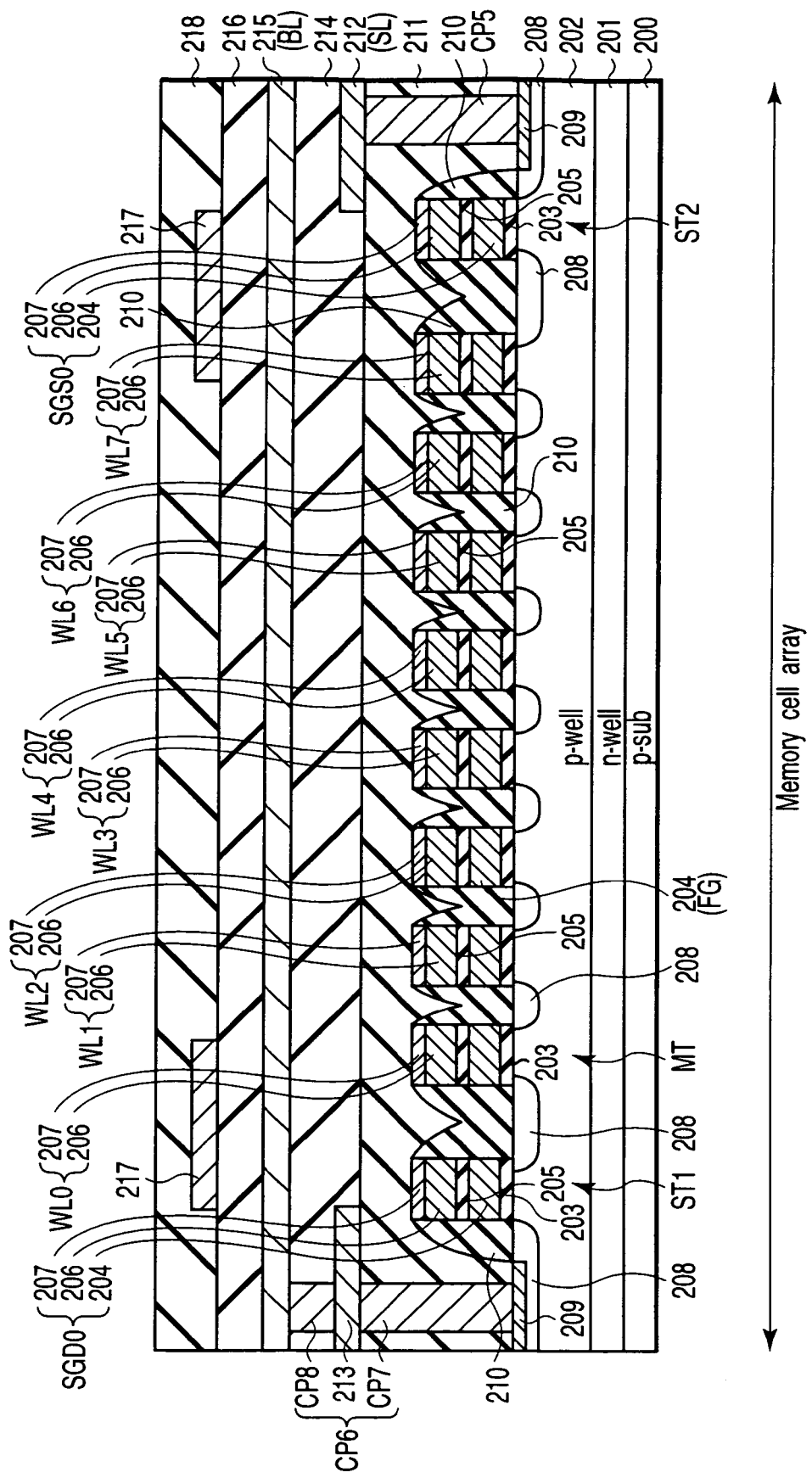
FIG. 41 is a sectional view taken along line 41—41 of FIG. 40.

FIG. 41 is a sectional view taken along line 41—41 of FIG. 40.

As shown in FIG. 41, at the surface of the element region AA of the p-type semiconductor (silicon) substrate 200, an n-well region 201 is formed. At the surface of the n-well region 201, a p-well region 202 is formed. On the p-well region 202, a gate insulating film 203 is formed. On the gate insulating film 203, the gate electrodes of memory cell transistors MTs and select transistors ST1, ST2 are formed. Each of the gate electrodes of the memory cell transistors MTs and select transistors ST1, ST2 includes a polysilicon layer 204 formed on the gate insulating film 203, an inter-gate insulating film 205 formed on the polysilicon layer 204, a polysilicon layer 206 formed on the inter-gate insulating film 205, and a silicide layer 207 formed on the polysilicon layer 206. The inter-gate insulating film 205 is formed of, for example, a silicon oxide film, or an ON film, an NO film, or an ONO film which has a stacked structure of a silicon oxide film and a silicon nitride film. In the memory cell transistor MT, the polysilicon layers 204, which are separated from one another between element regions AAs adjoining in the word line direction, function as floating gates (FG). In addition, the polysilicon layer 206 and silicide layer 207 function as control gates (word lines WLs). The polysilicon layers 206 are connected to one another between element regions AAs adjoining in the word line direction. In the select transistors ST1, ST2, a part of the intergate insulating film 205 is removed in a shunt region (not shown) and the polysilicon layers 204, 206 are connected electrically. Then, the polysilicon layers 204, 206 and the silicide layer 207 function as select gate lines SGD, SGS. In the select transistors ST1, ST2, the polysilicon layer 204 and polysilicon layer 206 are not separated between element regions AAs adjoining in the word line direction and are connected to each other.

At the surface of the semiconductor substrate 200 located between adjoining gate electrodes, impurity diffused layers 208 functioning as source or drain region are formed. Each impurity diffused layer 208 is shared by adjoining transistors. Specifically, an impurity diffused layer 208 between two adjoining select transistors ST1 functions as a drain region for the two select transistors ST1. An impurity diffused layer 208 between two adjoining select transistors ST2 functions as a source region for the two select transistors ST2. An impurity diffused layer 208 between two adjoining memory cell transistors MTs functions as source and drain regions for the two memory cell transistors MTs. Moreover, an impurity diffused layer 208 between a memory cell transistor MT and a select transistor ST1 adjacent to each other functions as the drain region of the memory cell transistor MT and the source region of the select transistor ST1. On the other hand, an impurity diffused layer 208 between a memory cell transistor MT and a select transistor ST2 adjacent to each other functions as the source region of the memory cell transistor MT and the drain region of the select transistor ST2. At the surface of the drain region 208 of the select transistor ST1 and at the surface of the source region 35 of the select transistor ST2, a silicide layer 209 is formed. In the source-drain region 208 of the memory cell transistor MT, in the source region 208 of the select transistor ST1, and in the drain region 208 of the select transistor ST2, no silicide layer is formed. On the side of the gate electrode (stacked gate) of each of the memory cell transistor MT and select transistors ST1, ST2, a sidewall insulating film 210 is formed. The sidewall insulating film 210 is formed on the side facing the source region of the stacked gate and on the side facing the drain region. The region between the stacked gates of the memory cell transistor MT and select transistors ST1, ST2 is filled with the sidewall insulating film 210. Thus, the top of the source and drain regions of the memory cell transistor MT, the top of the source region of the select transistor ST1, and the top of the drain region of the select transistor ST2 are covered with the sidewall insulating film 210.

On the semiconductor substrate 200, an interlayer insulating film 211 is formed so as to cover the memory cell transistors MTs and select transistors ST1, ST2. In the interlayer insulating film 211, a contact plug CP5 is formed which reaches the silicide layer 209 formed in the source region 208 of the select transistor ST2. On the interlayer insulating film 211, a metal wiring layer 212 to be connected to the contact plug CP5 is formed. The metal wiring layer 212 functions as a source line SL. In the interlayer insulating film 211, a contact plug CP7 is formed which reaches the silicide layer 209 formed in the drain region 208 of the select transistor ST1. On the interlayer insulating film 211, a metal wiring layer 213 to be connected to the contact plug CP7 is formed.

On the interlayer insulating film 211, an interlayer insulating film 214 is formed so as to cover the metal wiring layers 212, 213. In the interlayer insulating film 214, a contact plug CP8 reaching the metal wiring layer 213 is formed. On the interlayer insulating film 214, a metal wiring layer 215 connected in common to a plurality of contact plugs CP8 is formed. The metal wiring layer 215 functions as a bit line BL. The contact plugs CP7, CP8, and metal wiring layer 213 correspond to the contact plugs CP6 in FIG. 40.

On the interlayer insulating film 214, an interlayer insulating film 216 is formed so as to cover the metal wiring layer 215. On the interlayer insulating film 216, a metal wiring layer 217 is formed. The metal wiring layer 217, which is connected to the silicide layers 207 of the select transistors ST1, ST2 in a region (not shown), functions as the shunt wiring lines of the select gate lines SGD, SGS. On the interlayer insulating film 216, an interlayer insulating film 218 is formed so as to cover the metal wiring layer 217.

The sectional structure in the column direction of the memory cell array 10, write selector 40, latch circuit 50, and switch group 90 is almost the same as that of FIG. 8 explained in the first embodiment. Since the sectional structure is the same, except that the configuration of the memory cell array 10 is replaced with that of FIG. 41, its explanation will be omitted. In addition, the sectional structure in the row direction of the memory cell array 10, switch groups 132, 142, and row address decode circuits 29-1, 29-2 is almost the same as that of FIG. 26 explained in the second embodiment. Since the sectional structure is the same, except that the configuration of the memory cell array 10 is replaced with that of FIG. 41, its explanation will be omitted.

The threshold value of the isolating transistor 28-2 in the second row decoder 140 is so set that, when its gate is set to 0V, the transistor 28-2 turns on if Vpass (2V) is applied to its source and is cut off if Vcc1 (3V) is applied to its source.

Next, the operation of the NAND flash memory 3 configured as described above will be explained by reference to FIG. 8. FIG. 8 is a timing chart of a reset signal Reset, a data signal, VPI, and VNEGPRG explained in the first embodiment. The initial operation and data latch operation are the same as those in the first and second embodiment, explanation of them will be omitted. In addition, since the configuration that applies a voltage to the bit lines is the same as in the first embodiment, the explanation below will be given, centering on the operation of the first and second row decoders 130, 140.

<Write Operation>

Figure 42:
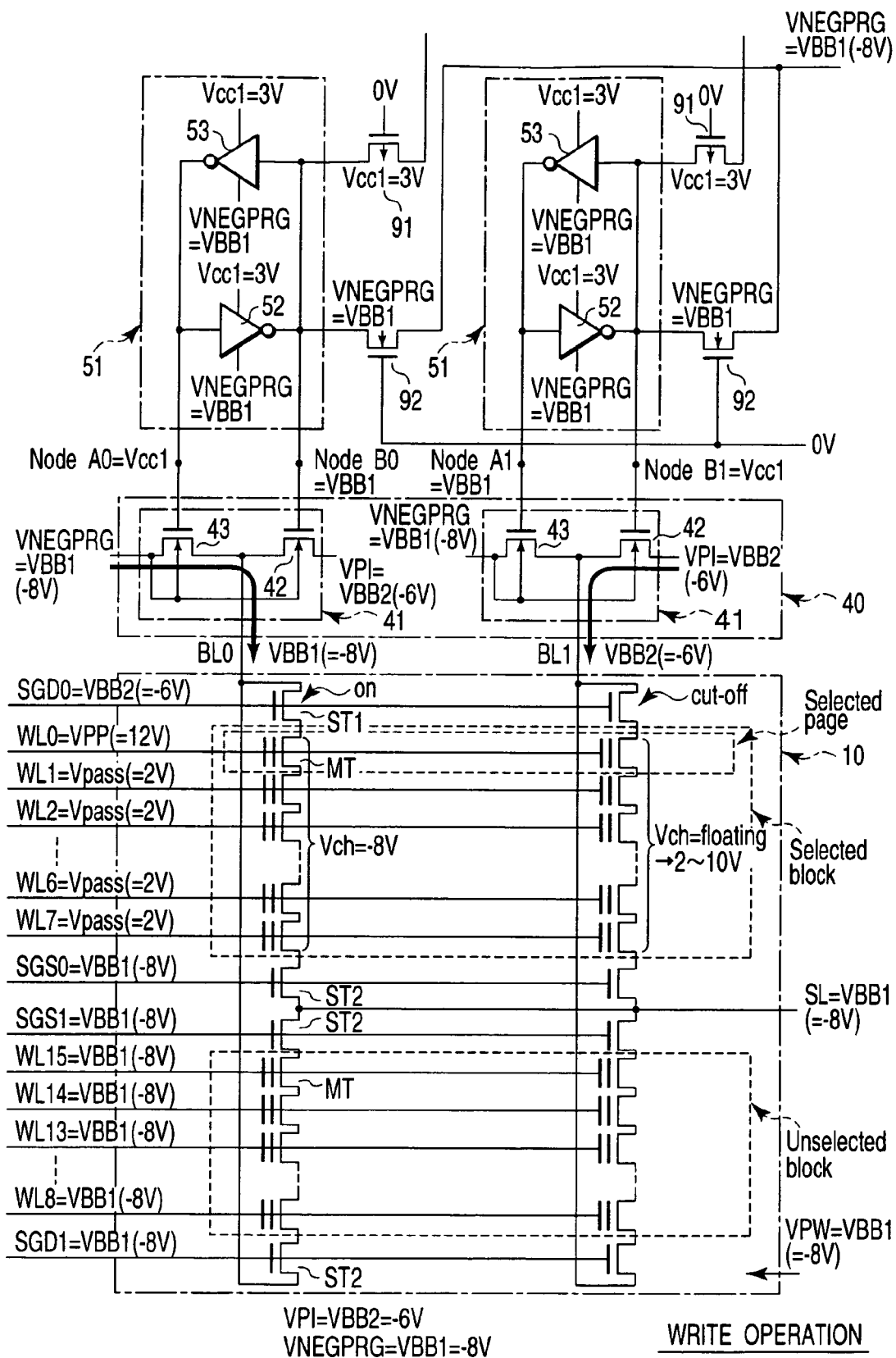
FIG. 42 is a circuit diagram of the memory cell array, write selector, write circuit, and switch group in a write operation of the NAND flash memory of the third embodiment.
Figure 43:
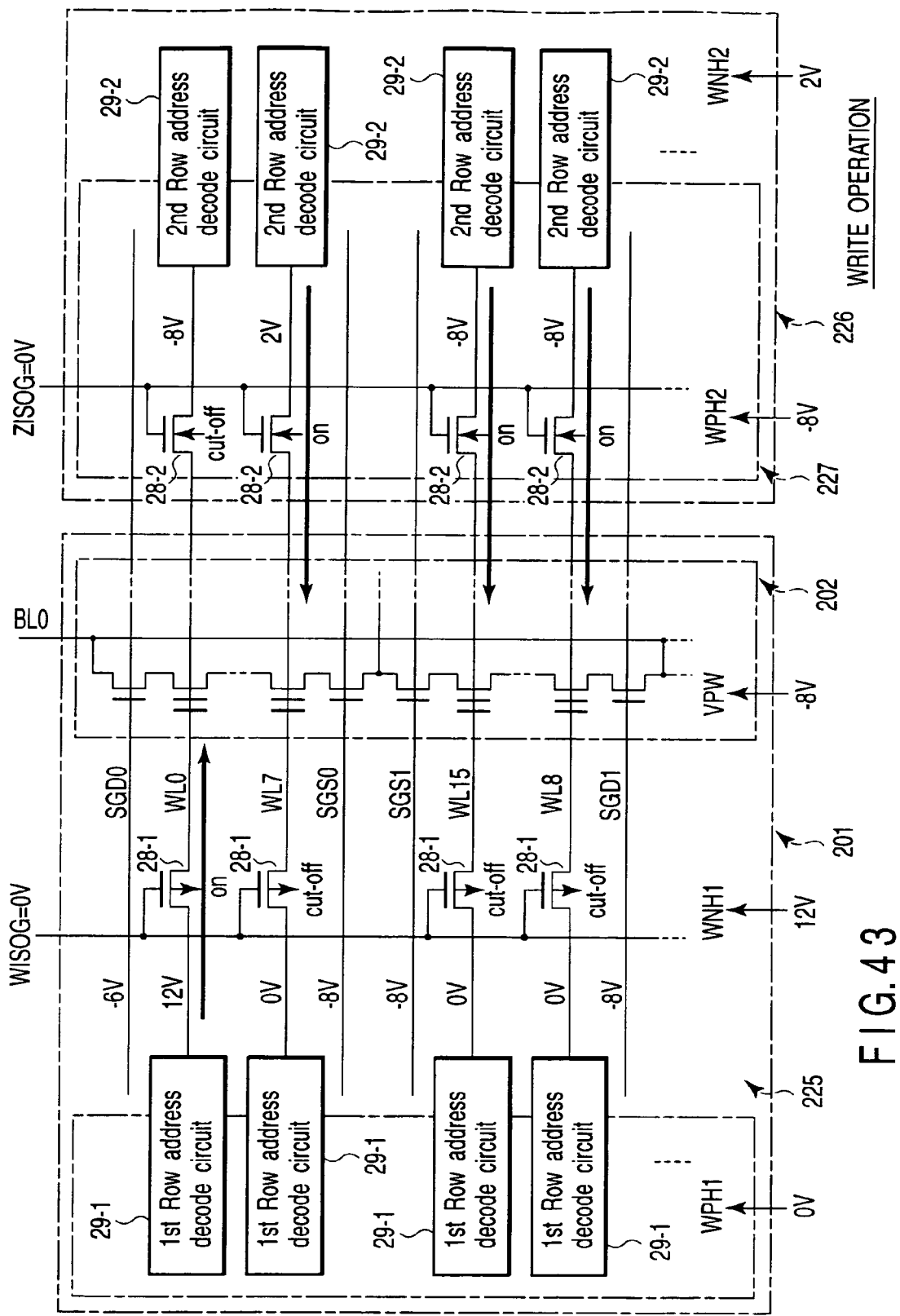
FIG. 43 is a circuit diagram of the memory cell array and the first and second row decoders in a write operation of the NAND flash memory of the third embodiment.

A write operation will be explained by reference to FIGS. 42 and 43. Data is written simultaneously into all of the memory cell transistors connected to any one of the word lines. Either "0" data or "1" data is written, depending on whether electrons are injected into the floating gate of the memory cell transistor MT. Electrons are injected into the floating gate by FN tunneling. In FIG. 8, a write operation is carried out at time t4 or later. FIG. 42 is a circuit diagram of the memory cell array 10, write selector 40, write circuit 50, and switch group 90 in a write operation. In FIG. 42, it is assumed that data is written into the memory cell transistors MTs connected to the word line WL0 and that, of the memory cell transistors MTs, "0" data is written into the one connected to the bit line BL0 and "1" data is written into the one connected to the bit line BL1. In other words, the memory cell connected to the bit line BL0 is selected and the memory cell connected to the bit line BL1 is unselected. FIG. 43 is a circuit diagram of the first and second row address decode circuits 29-1, 29-2, isolating transistors 28-1, 28-2, and the memory cell array 10 in a write operation. In FIG. 43, each region shown by a broken line indicates the same well.

First, before a write operation, VBB1 and VBB2 are supplied to the bit lines BL0 and BL1 respectively as explained in the first embodiment.

Then, the first row decoder 130 or the second row decoder 140 selects the block including the memory cell transistor into which the data is to be written. A "block" is defined as a set of NAND cells sharing the select gate lines SGD, SGS. Specifically, one of the first and second row decoders 130, 140 selects the select gate lines SGD0, SGS0 connected to the selected block, applies VBB2 and VBB1 to the selected select gate lines SGD0, SGS0, respectively. In addition, the row decoder 130 or 140 makes unselected all of the select gate lines SGD1 to SGDm and select gate lines SGS1 to SGSm connected to the unselected blocks and applies VBB1 to them. That is, as shown in FIG. 42, the block connected to the word lines WL0 to WL7 is selected and the other blocks are made unselected.

As a result, the select transistor ST1 connected to the bit line BL1 applied with VBB2 and to the selected select gate line SGD0 is cut off. On the other hand, the select transistor ST1 connected to the bit line BL0 applied with VBB1 and to the selected select gate line SGD0 is turned on.

In the first row decoder 130, the first row address decode circuit 29-1 corresponding to the word line WL0 outputs the VPP1 (12V). The first row address decode circuits 29-1 corresponding to the other word lines WL1 to WLm output 0V. WISOG is set to 0V. Thus, the isolating transistor 28-1 corresponding to the word line WL0 is turned on and the isolating transistors 28-1 corresponding to the word lines WL1 to WLm are cut off. As a result, the first row address decode circuit 29-1 applies VPP to the word line WL0.

In the second row decoder 140, the second row address decode circuits 29-2 corresponding to the word lines WL1 to WL7 in the selected block output Vpass (2V). The second row address decode circuits 29-2 corresponding to the word line WL0 in the selected block and all of the word lines WL8 to WLm in the unselected blocks output VBB1 (−8V). ZISOG is set to 0V. Thus, the isolating transistor 28-2 corresponding to the word line WL0 is cut off and the isolating transistors 28-2 corresponding to the other word lines WL1 to WLm are turned on. As a result, the second row address decode circuit 29-2 applies Vpass to the word lines WL1 to WL7 and VBB1 to the word lines WL8 to WLm. In addition, the second row address decode circuit 29-2 corresponding to the selected word line outputs VBB1. Thus, the isolating transistor 28-2 corresponding to the selected word line WL0 is cut off.

As a result, channel regions are formed in all of the memory cell transistors MTs included in the selected block. Since the select transistor ST1 connected to the selected select gate line SGD and bit line BL1 is in the cut off state, the channel potentials of the memory cell transistors MTs in the NAND cell including the select transistor ST1 go floating. As a result of coupling with the word lines WLs, the channel potentials rise to about the word line potential. On the other hand, since the select transistor ST1 connected to the selected select gate line SGD0 and bit line BL0 is in the on state, the channel potentials of the memory cell transistors MTs in the NAND cell including the select transistor ST1 are at VBB1.

The first row decoder 130 applies VBB1 to the substrate (p-channel region 202) where NAND cells are formed. The potentials WNH1, WPH1 of the n-well region 201 and p-well region 225 are set to VPP and 0V, respectively. The potentials WNH2, WPH2 of the n-well region 226 and p-well region 227 are set to Vpass and VBB1, respectively.

As a result, in the memory cell transistors MTs in the NAND cell including the cut-off select transistor ST1, since the potential difference between the gate and channel is insufficient, no electron is injected into the floating gate. That is, the threshold value of the memory cell connected to the bit line BL1 and the selected word line WL1 (or the memory cell into which "1" data is to be written) remains negative.

On the other hand, in the memory cell transistors MTs connected to the unselected word lines WLs in the NAND cell including the select transistor ST1 connected to the selected select gate line SGD0 and to the bit line BL0, since the potential difference between the gate and channel is insufficient, no electron is injected. That is, no data is written.

In the memory cell transistors MTs connected to the selected word line WL1, the potential difference between the gate and channel is 20V (=VPP−VBBL), electrons are injected into the floating gate by FN tunneling. As a result, the threshold value of the memory cell transistor MT changes to positive. That is, "0" data is written.

As described above, the data is written into one page of memory cell transistors simultaneously.

<Erase Operation>

Figure 44:
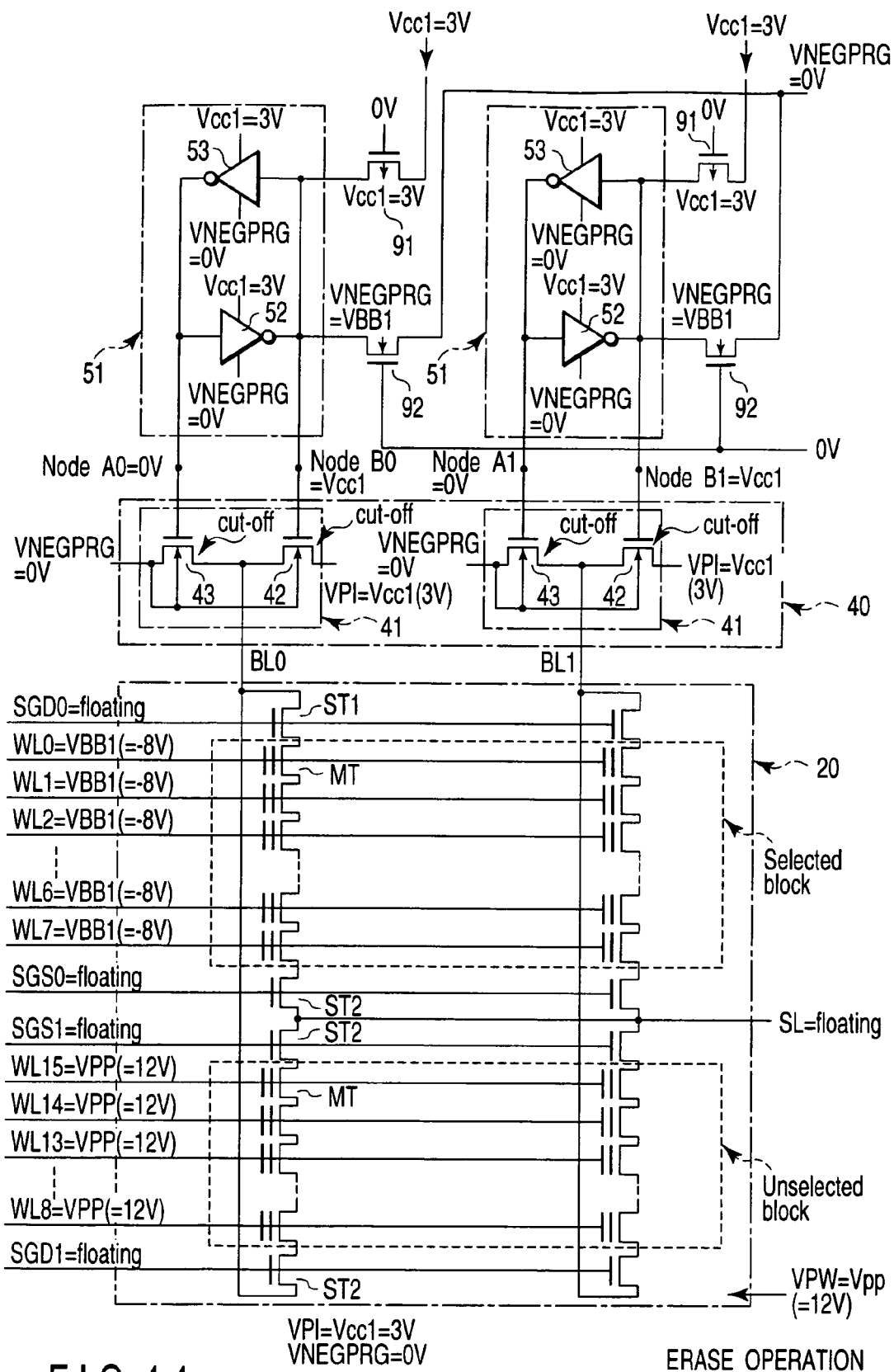
FIG. 44 is a circuit diagram of the memory cell array, write selector, write circuit, and switch group in an erase operation of the NAND flash memory of the third embodiment.
Figure 45:
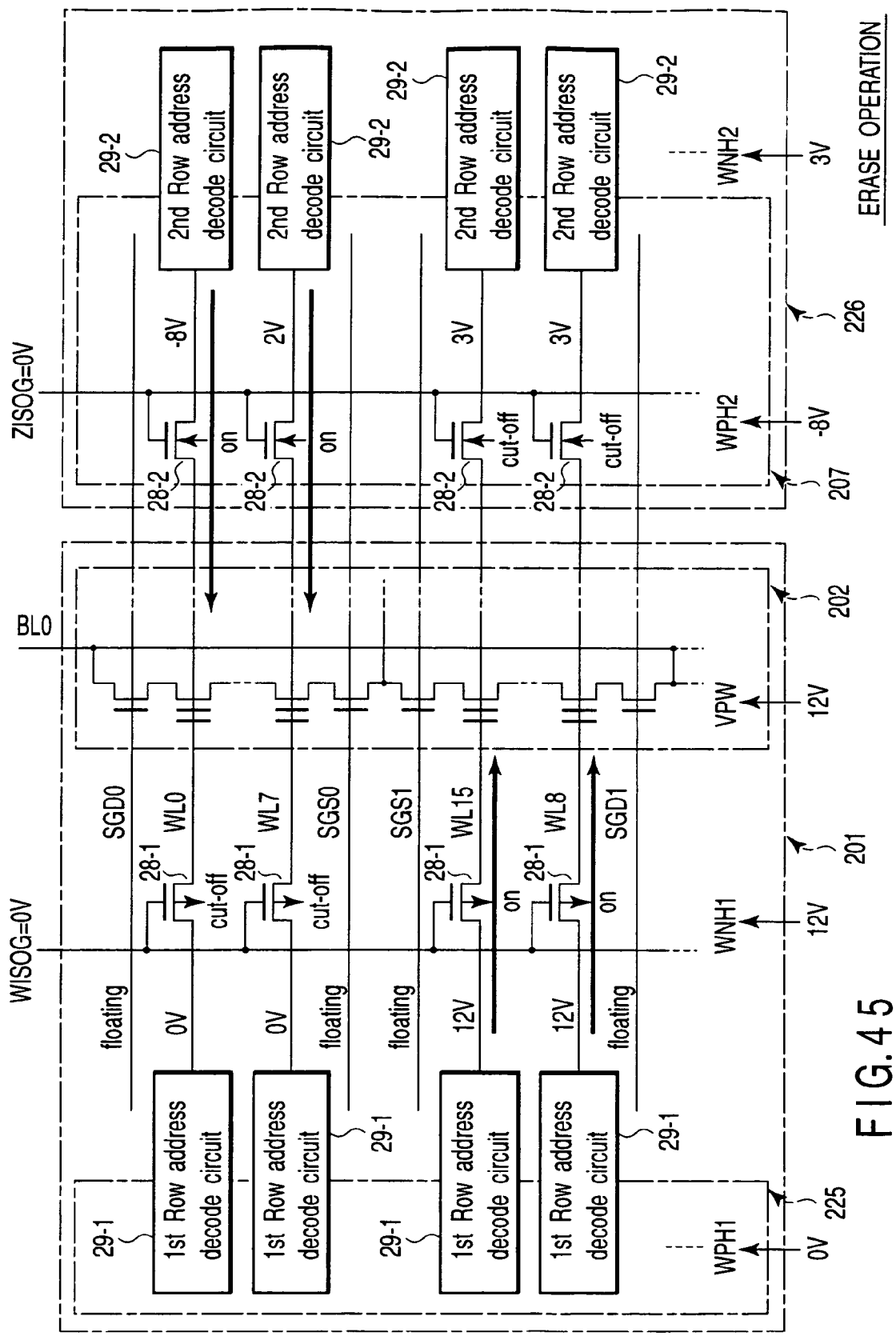
FIG. 45 is a circuit diagram of the memory cell array and the first and second row decoders in an erase operation of the NAND flash memory of the third embodiment.

Next, an erase operation will be explained by reference to FIGS. 44 and 45. FIG. 44 is a circuit diagram of the memory cell array 10, write selector 40, write circuit 50, and switch group 90 in an erase operation. FIG. 45 is a circuit diagram of the first and second row address decode circuits 29-1, 29-2, isolating transistors 28-1, 28-2, and the memory cell array 10 in an erase operation. Data is erased in blocks. An erase operation is carried out by pulling electrons out of the floating gate by FN tunneling. FIGS. 44 and 45 show a case where the data is erased from the block connected to select gate lines SGD0, SGS0.

Before an erase operation, the bit lines BL0 to BLn are separated electrically from the latch circuits 51 and VNEG-PRG and VPI, going into the floating state as explained in the first embodiment.

Then, one of the first and second row decoders 130, 140 brings all of the select gate lines SGD0 to SGDm, SGS0 to SGSm into the floating state. In addition, in the first row decoder 130, the first row address decode circuit 29-1 corresponding to the selected block (word lines WL0 to WL7) outputs 0V. The first row address decode circuits 29-1 corresponding to the unselected blocks (word lines WL8 to WLm) output VPP (12V). Then, WISOG is set to 0V. Therefore, the isolating transistor 28-1 corresponding to the selected block is cut off, whereas the isolating transistors 28-1 corresponding to the unselected blocks are turned on. As a result, the first row address decode circuits 29-1 output VPP to the word lines WL8 to WLm in the unselected blocks.

In the second row decoder 140, the second row address decode circuit 29-2 corresponding to the selected block outputs VBB1 (−8V). The second row address decode circuits 29-2 corresponding to the unselected blocks output Vcc1 (3V). Then, ZISOG is set to 0V. Therefore, the isolating transistor 28-2 corresponding to the selected block is turned on, whereas the isolating transistors 28-2 corresponding to the unselected blocks are cut off. As a result, the second row address decode circuits 29-2 output VBB1 to the word lines WL0 to WL7 in the selected block.

Furthermore, the first row decoder 130 sets the potential of the p-well region 202 where the memory cells are formed to VPP. In addition, the first row decoder 130 sets the potentials WNH1 and WPH1 of the n-well region 201 and p-well region 225 to VPP and 0V respectively and the potentials WHN2 and WPH2 of the n-well region 226 and p-well region 207 to Vcc1 and VBB1 respectively.

Then, the potential difference between all the memory cell transistors MTs and the semiconductor substrate is 20V (=VPP−VBB1), causing electrons in the floating gates to be pulled out into the semiconductor substrate by FN tunneling. As a result, the data is erased from all of the memory cell transistors MTs in the selected block, with the result that the threshold values of the memory cell transistors MTs become negative. That is, as shown in FIG. 44, electrons are pulled out of the floating gates of all of the memory cell transistors MTs connected to the word lines WL0 to WL7 into the semiconductor substrate, thereby erasing the data.

In the unselected bocks, since the potentials of the word lines WLs are made almost equal to VPW, no electron is pulled out of the floating gates, with the result that the data is not erased. In addition, the potentials of the select gate lines SGS0 to SGSm, SGD0 to SGDm rise to about VPP as a result of coupling with the semiconductor substrate, preventing stress from being applied to the gate oxide film of the select transistor ST.

As described above, the data is erased from the selected block simultaneously.

<Read Operation>

Figure 47:
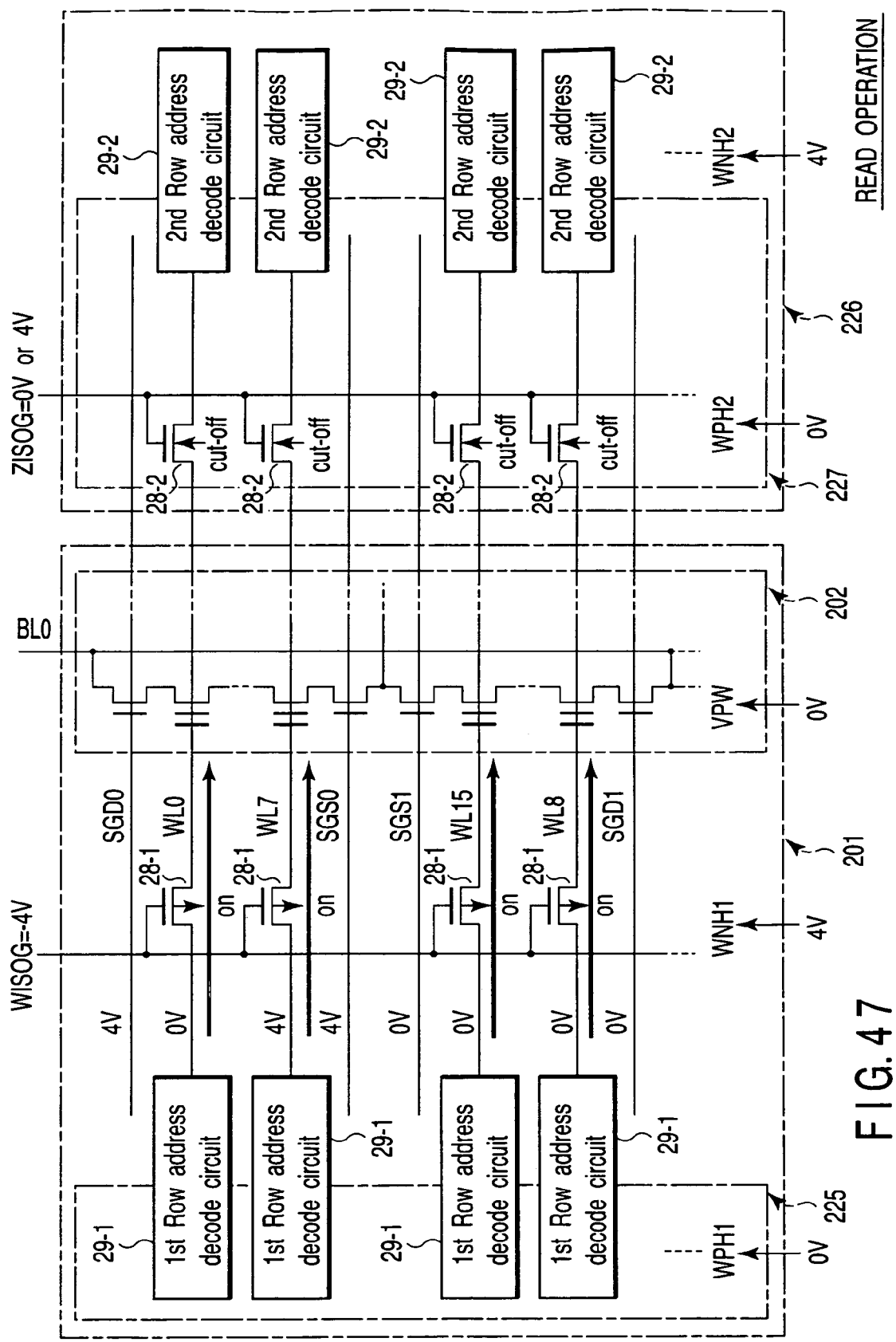
FIG. 47 is a circuit diagram of the memory cell array and the first and second row decoders in a read operation of the NAND flash memory of the third embodiment.

Next, a read operation will be explained by reference to FIGS. 46 and 47. FIG. 46 is a circuit diagram of the memory cell array 10 of the NAND flash memory 3. FIG. 47 is a circuit diagram of the first and second row address decode circuits 29-1, 29-2, isolating transistors 28-1, 28-2, and memory cell array 10 in a read operation. Explanation will be given about a case where the data is read from the memory cell transistor MT connected to the bit line BL0 and to the word line WL0.

In a read operation, the second row decoder 140 does not apply a voltage to the word lines. It is the first row decoder 130 that applies a voltage to the word lines.

One of the first and second row decoders 130, 140 selects the block including the memory cell transistor from which the data is to be read. Then, the row decoder selects the select gate lines SGD0, SGS0 connected to the selected block and applies Vpass2 (4V) to the selected select gate lines SGD0, SGS0. In addition, the row decoder makes unselected the select gate lines SGD1 to SGDM and SGS1 to SGSM connected to the unselected blocks and applies 0V to the unselected select gate lines. As a result, the select transistors ST1, ST2 connected to the selected select gate lines SGD0, SGS0 are turned on.

Then, the row decoder selects the word line WL0 in the selected block. Specifically, the first row address decode circuit 29-1 corresponding to the word line WL0 outputs 0V. The first row address decode circuits corresponding to the other word lines WL1 to WL7 output Vpass2. In addition, the first row address decode circuits corresponding to the word lines WL8 to WLm in the unselected blocks output 0V. Then, WISOG is set to −4V. Therefore, all of the isolating transistors 28-1 are turned on. As a result, 0V is applied to the word line WL0. The first row address decode circuits 29-1 apply Vpass2 to the word lines WL1 to WL7. Moreover, 0V is applied to the word lines WL7 to WLm in the unselected blocks.

Here, 0V or −4V is applied to ZISOG. All of the isolating transistors 28-2 are cut off.

Then, the memory cell transistors MTs connected to the word lines WL1 to WL7 in the selected block are all turned on, regardless of whether the written data is "0" or "1." Since the threshold value is negative if the written data is "1," the memory cell transistors MTs connected to the selected word line WL0 are in the on state. Since the threshold value is positive if the written data is "0," the memory cell transistors MTs are in the off state.

In this state, the bit lines are connected to the sense amplifier 70 via the read selector 60, with the result that, for example, 2.0V is applied to the selected bit line BL0. Then, if the data written in the memory cell transistor MT connected to the selected word line WL0 and selected bit line BL0 is "1," current flows from the bit line to the source line. In contrast, if the written data is "0," no current flows.

As described above, the bit line potential varying with the current flowing from the bit line to the source line is amplified by the sense amplifier 140, thereby reading the data. While in the example of FIGS. 46 and 47, the data has been written from one bit line, the data may be read simultaneously from a plurality of memory cell transistors by applying a potential to a plurality of bit lines. In the read operation, the MOS transistors 42, 43 in all of the select circuits 41 are turned off and the bit lines BL0 to BLn are separated electrically from the latch circuits 51 and VPI and VNEGPRG.

As described above, the NAND flash memory produces the effects in items (1) to (8) explained in the first and second embodiments.

Figure 48:
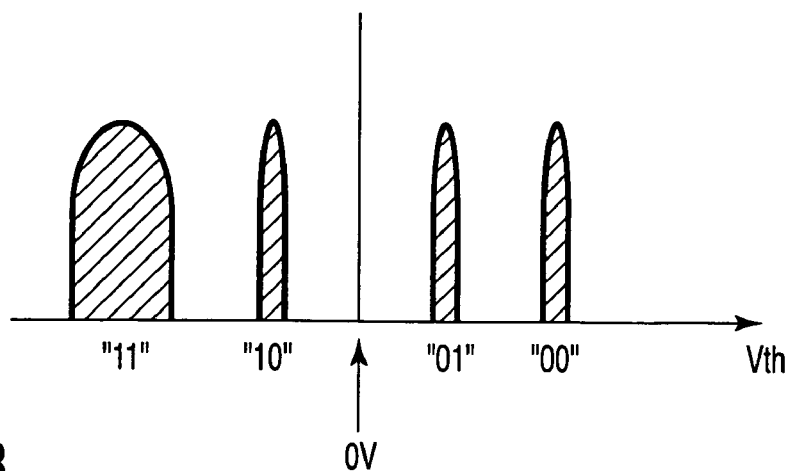
FIG. 48 is a diagram showing the threshold voltages the memory cells of a NAND flash memory according to a fourth embodiment of the present invention have.

Next, a nonvolatile semiconductor memory device according to a fourth embodiment of the present invention will be explained by reference to FIG. 48. The fourth embodiment is such that each of the memory cells is caused to have a plurality of threshold values in the NAND flash memory 3 explained in the third embodiment. FIG. 48 shows a threshold value distribution in a memory cell of the NAND flash memory of the fourth embodiment.

As shown in FIG. 48, a memory cell of the fourth embodiment has four values, "00," "01," "10," and "11." The threshold voltage of a memory cell with "11" data and that of a memory cell with "10" data are negative, whereas the threshold voltage of a memory cell with "01" data and that of a memory cell with "00" data are positive.

Figure 49:
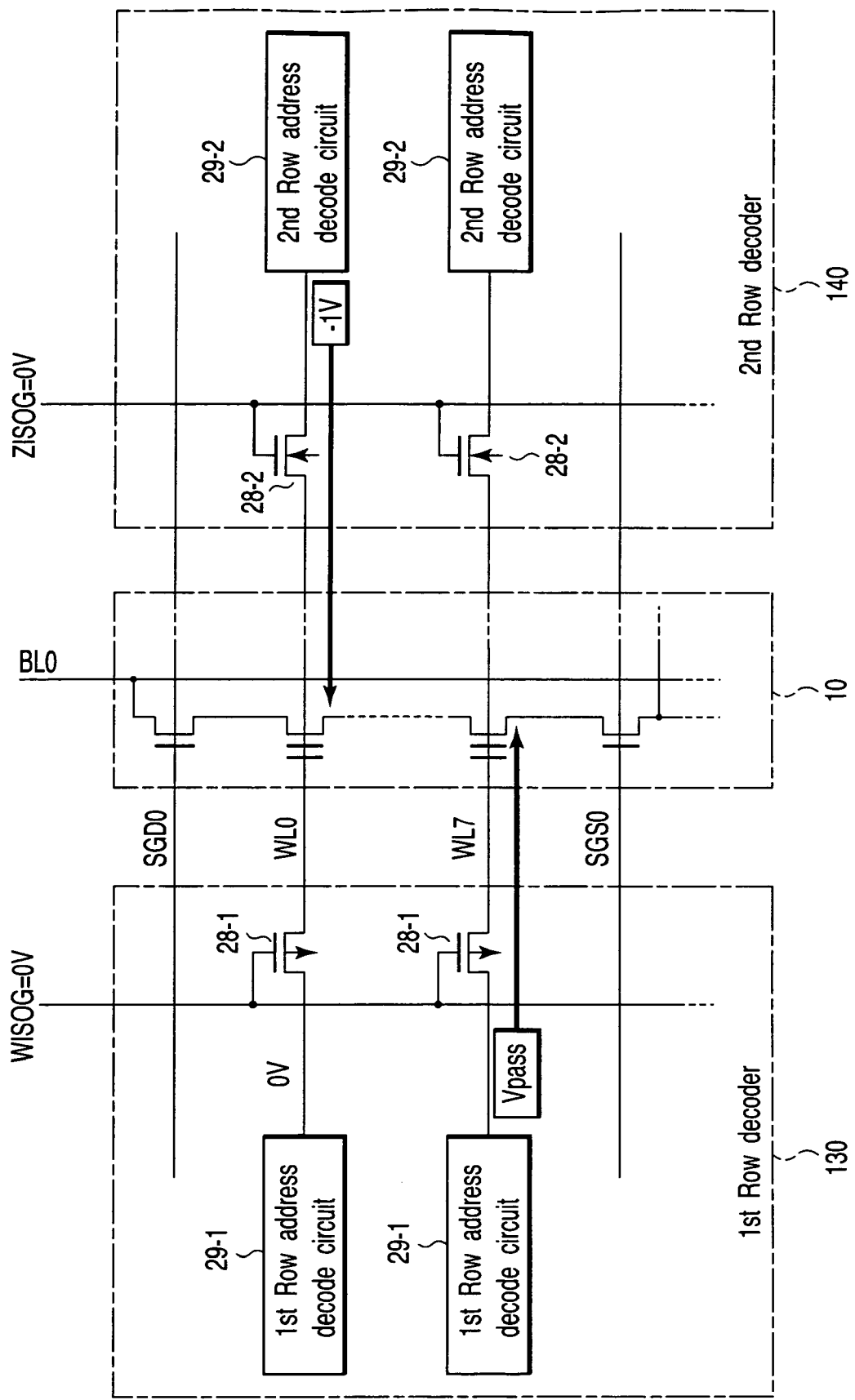
FIG. 49 is a circuit diagram of a memory cell array and a first and a second row decoder included in the NAND flash memory of the fourth embodiment, which helps explain a write operation.

A method of setting a plurality of threshold voltages in memory cells may be as disclosed in, for example, Jpn. Pat. Appln. KOKAI Publication No. 2001-93288. In the publication, the threshold values of the memory cells are set by using only positive voltages. In the fourth embodiment, however, the negative voltages supplied from the first and row decoders 130, 140 are used in a write and a verify operation as shown in FIG. 49. This makes it possible to set negative threshold voltages.

As described above, the NAND flash memory of the fourth embodiment produces not only the effects explained in the third embodiment but also the effect in the following item (9).

(9) The operation reliability of the NAND flash memory which holds three-valued data or more can be improved.

Figure 50:
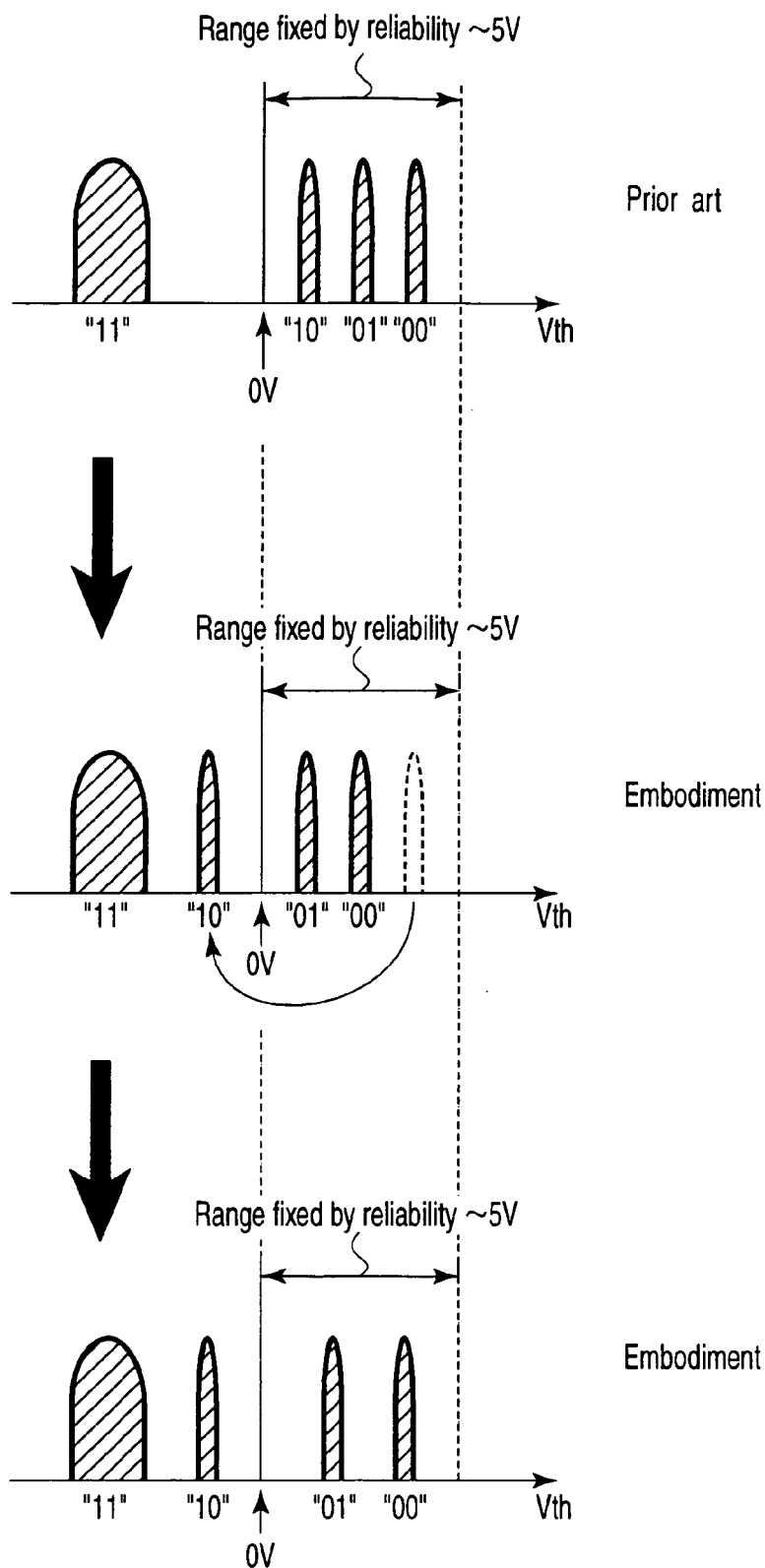
FIG. 50 is a diagram showing the threshold voltages the memory cells of the NAND flash memory of the fourth embodiment have.

This effect will be explained by reference to FIG. 50. FIG. 50 shows a threshold value distribution in a conventional NAND flash memory and that in a NAND flash memory of the fourth embodiment in a case where each memory cell has four values.

As shown in FIG. 50, in a conventional NAND flash memory with four values, the threshold voltages of the three data items excluding "11" data in the erased state were all positive. The highest voltage settable as a threshold voltage was limited to, for example, about 5V from the viewpoint of reliability. Therefore, the three threshold voltages had to be set in the range of 0V to 5V in the conventional NAND flash memory.

In the fourth embodiment, however, the threshold voltages of the memory cells can be set to negative voltages. For example, suppose the threshold voltage of one of the data items whose threshold voltages are positive in a conventional NAND flash memory is changed to negative. Then, there remain two data items whose threshold voltages are positive. Thus, two threshold voltages are set between 0V and 5V. That is, the threshold voltage difference between the two data items whose threshold voltages are positive can be made larger than that in the conventional equivalent.

Consequently, the reliability of data writing is improved and at the same time, the reliability of data reading is improved.

Figure 51:
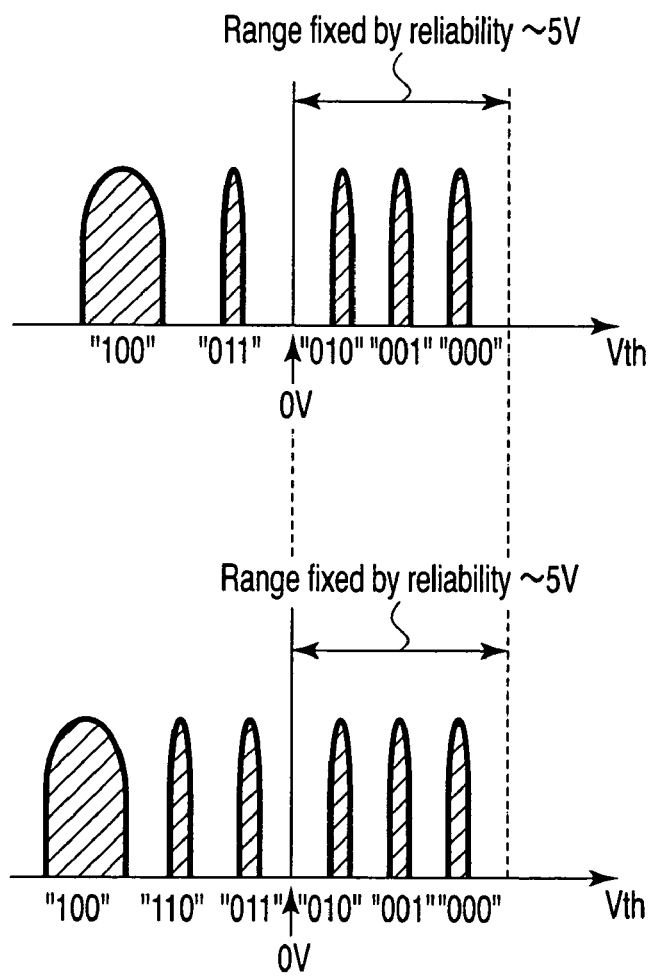
FIG. 51 is a diagram showing the threshold voltages the memory cells of the NAND flash memory of the fourth embodiment have.

In the example of FIGS. 49 and 50, the NAND flash memory has four-valued data items. Of the four-value data items, the threshold values of the two data items have been negative voltages and those of the remaining two data items have been positive voltages. However, as shown in FIG. 51, three data items whose threshold voltages are positive and two data items whose threshold voltages are negative may be set. Moreover, three data items whose threshold voltages are negative may be set.

Figure 52:
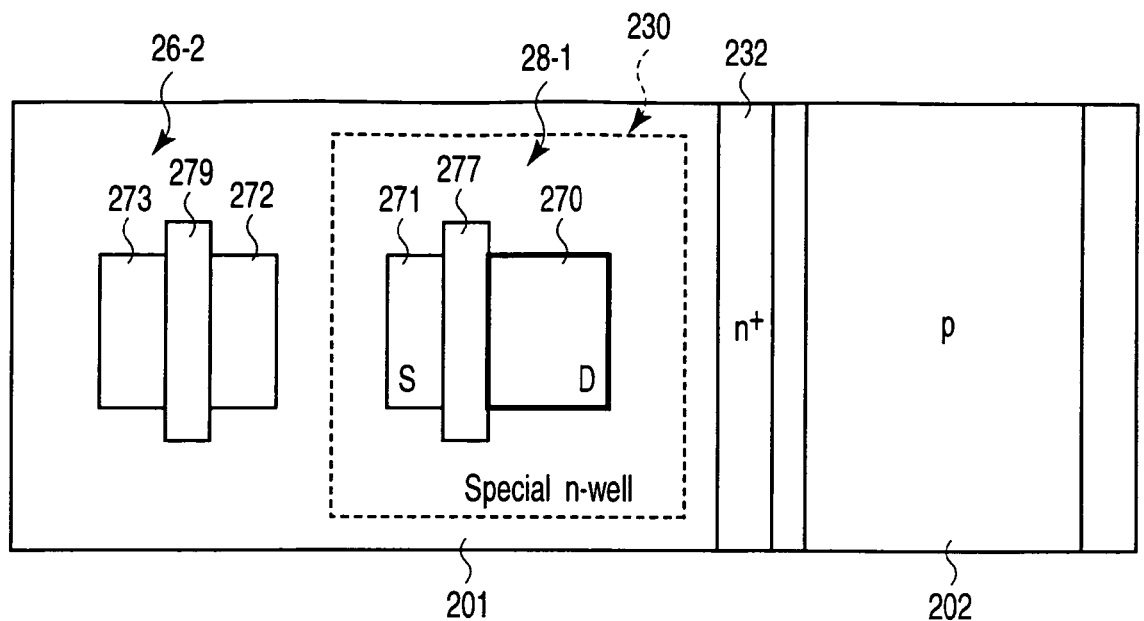
FIG. 52 is a plan view of an isolating MOS transistor included in a flash memory according to a fifth embodiment of the present invention.

Next, a semiconductor memory device according to a fifth embodiment of the present invention will be explained. The fifth embodiment relates to a method of arranging the isolating transistors 28, 28-1, 28-2 explained in the first to third embodiments. FIG. 52 is a plan view of the isolating transistors 28, 28-1.

As shown in FIG. 52, at the surface of the n-well region 201, for example, an n-well region 230 whose impurity concentration is lower than that of the n-well region 201 is formed. On the n-well region 230, the isolating transistors 28, 28-1 are formed. In the isolating transistors 28, 28-1, their drain breakdown voltage is set higher than their source breakdown voltage. The surface area of their drains is designed to be larger than that of their sources. The isolating transistors 28, 28-1 are so formed that their drains face the memory cell array and their sources face the row address decode circuits 29, 29-1. Between the p-well region 202 where the memory cell array is formed and the n-well region 230, an $n^+$-type impurity diffused layer 232 serving as a guard ring is formed.

Figure 53:
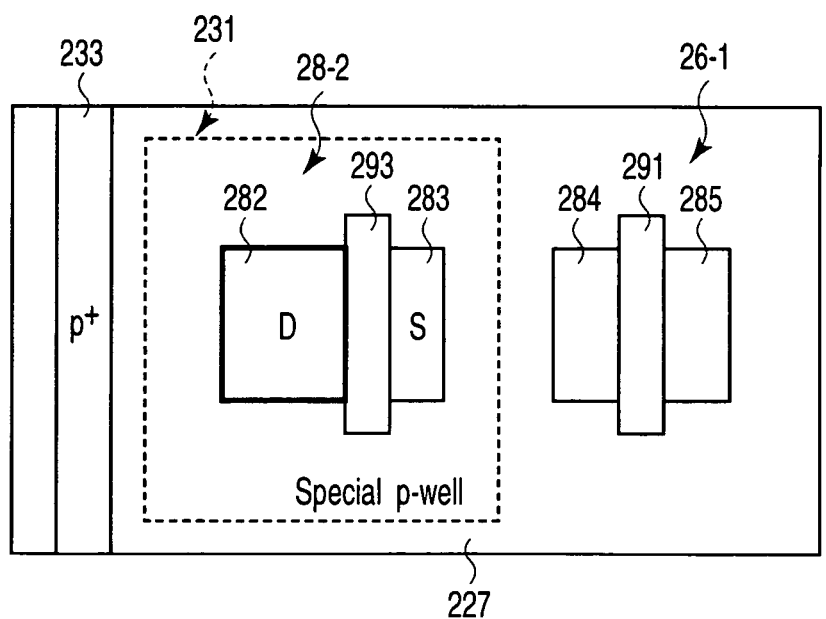
FIG. 53 is a plan view of an isolating MOS transistor included in the flash memory of the fifth embodiment.

FIG. 53 is a plan view of the isolating transistor 28-2. As shown in FIG. 53, at the surface of the p-well region 237, for example, a p-well region 231 whose impurity concentration is lower than that of the p-well region 227 is formed. On the p-well region 231, the isolating transistor 28-2 is formed. In the isolating transistor 28-2 is so formed that its drain faces the memory cell array and its source faces the row address decode circuit 29-2. Between the p-well region 202 where the memory cell array is formed and the p-well region 231, a $p^+$-type impurity diffused layer 233 serving as a guard ring is formed.

Figure 54:
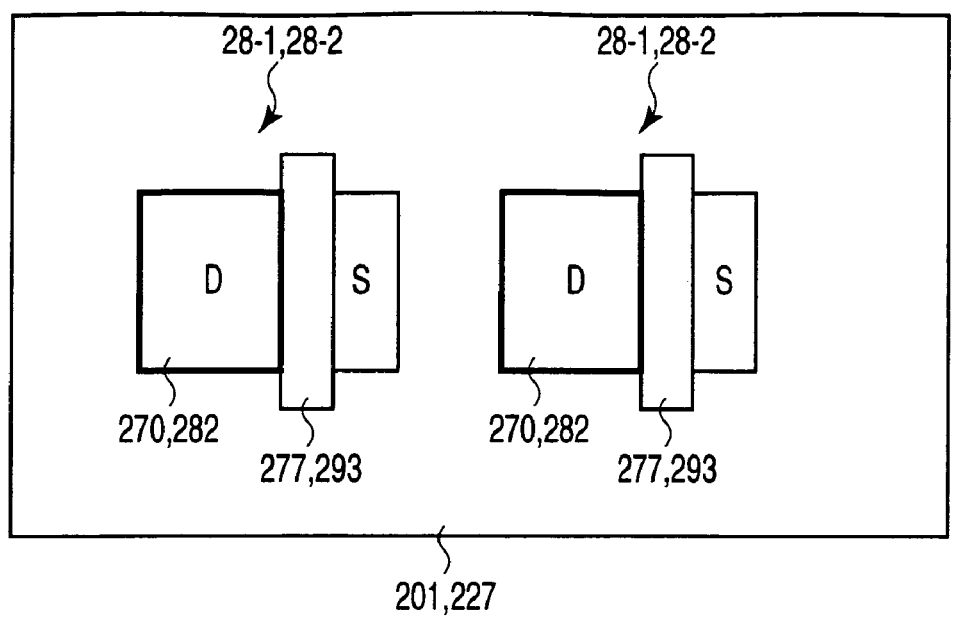
FIG. 54 is a plan view of an isolating MOS transistor included in the flash memory of the fifth embodiment.
Figure 55:
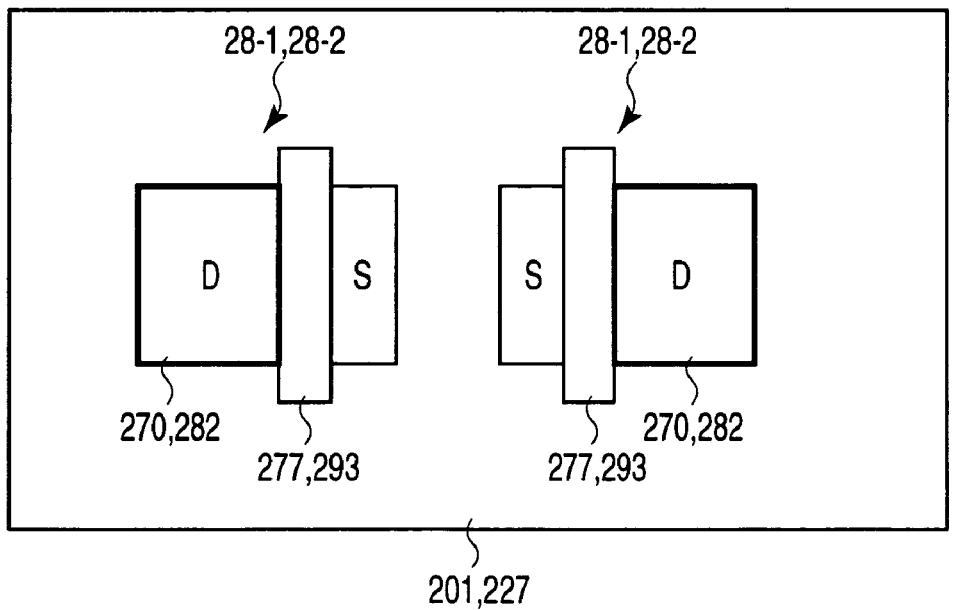
FIG. 55 is a plan view of an isolating MOS transistor included in the flash memory of the fifth embodiment.

FIGS. 54 and 55 show a method of arranging a plurality of isolating transistors 28, or a plurality of isolating transistors 28-1, or a plurality of isolating transistors 28-2.

As shown in FIGS. 54 and 55, the isolating transistors 28, 28-1, 28-2 are so arranged that their sources face each other or that their source and their drain face each other. That is, the isolating transistors are arranged in such a manner that the impurity diffused layers connected directly to the word lines do not adjoin each other.

As described above, the configuration of the fifth embodiment produces not only the effects explained in items (1) to (9) but also the effect in the following item (10).

(10) The reliability of the row decoder can be improved.

In the configurations shown in FIGS. 52 and 53, the isolating transistors 28, 28-1, 28-2 are formed on the well regions whose impurity concentration is lower than that of the well region where the row address decode circuits 29, 29-1, 29-2 are formed. Therefore, even if a high voltage is applied to the drains of the isolating transistors, the electric field concentration can be decreased. As a result, the breakdown of the drains can be prevented effectively.

Furthermore, the isolating transistors are so arranged that their sources are adjacent to the row address decode circuits. Therefore, when a high voltage is applied to the drains of the isolating transistors, the MOS transistors in the row address decode circuits are less liable to be affected by the high voltage. Accordingly, the reliability of the row address decode circuits is improved.

In addition, in the arrangements shown in FIGS. 54 and 55, the isolating transistors are so arranged that their drains are not adjacent to each other. That is, the isolating transistors are so arranged that the regions to which a high voltage is applied do not adjoin each other. Accordingly, the breakdown of the drains of the isolating transistors can be suppressed.

Figure 56:
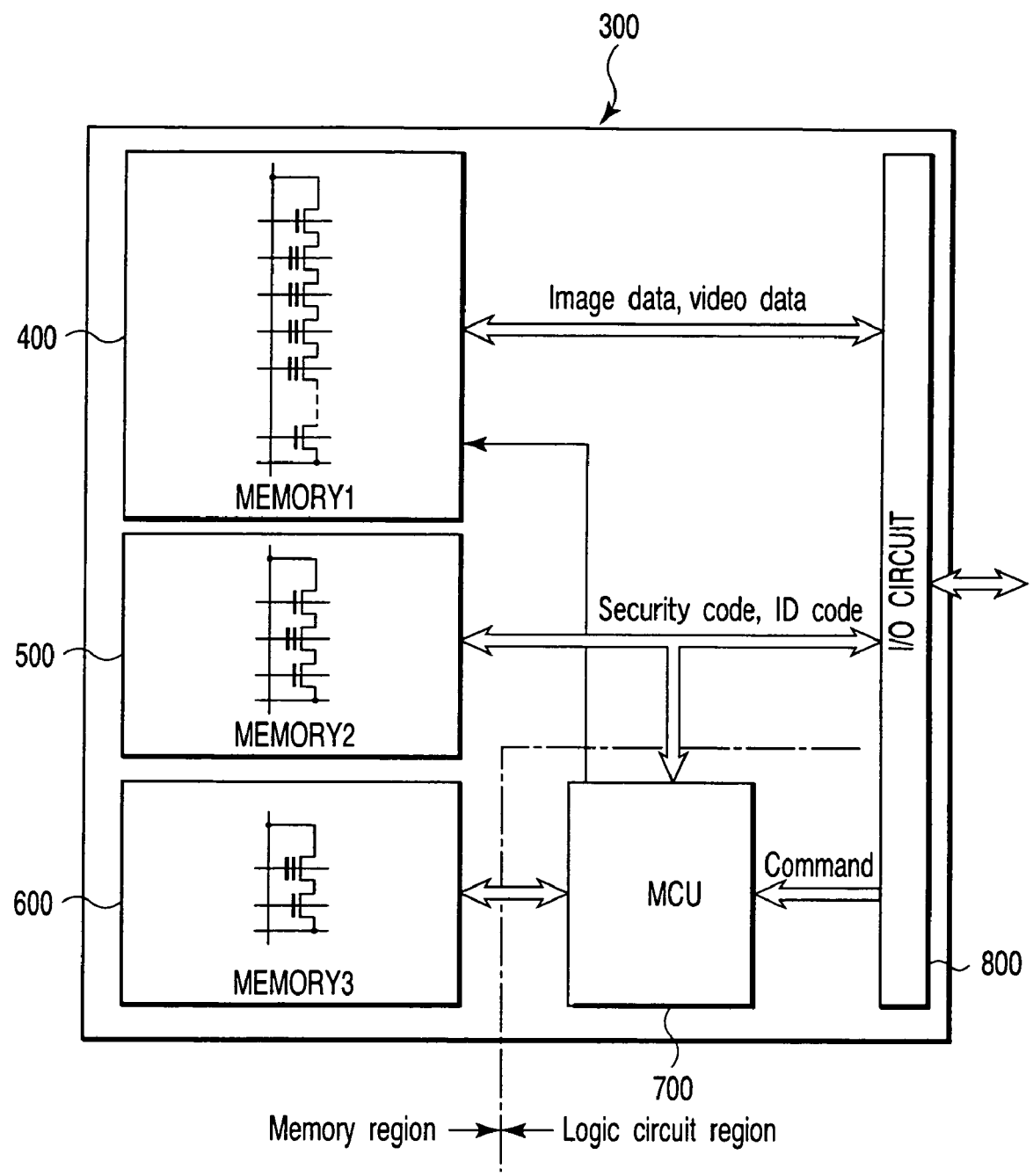
FIG. 56 is a block diagram of a system LSI according to a sixth embodiment of the present invention.

Next, a semiconductor memory device according to a sixth embodiment of the present invention will be explained by reference to FIG. 56. The sixth embodiment relates to a system LSI including a flash memory according to the first to fifth embodiments. FIG. 56 is a block diagram of a system LSI according to the sixth embodiment.

As shown in FIG. 56, a system LSI 300 comprises a NAND flash memory 400, a 3Tr-NAND flash memory 500, a 2Tr flash memory 600, an MCU 700, and an I/O circuit 800 formed on a single semiconductor substrate.

The NAND flash memory 400 is used as a storage memory for storing image data or video data. Its configuration is the same as explained in the third to fifth embodiments.

The 3Tr-NAND flash memory 500 holds an ID code or security code for accessing the LSI 300. Its configuration is the same as that explained in the first, second, fourth, and fifth embodiments.

The 2Tr flash memory 600 holds program data for the MCU 700 to operate. The configuration of the 2Tr flash memory is such that the select transistors ST1 are eliminated and the bit lines are connected directly to the drains of the memory cell transistors in a 3Tr-NAND flash memory. Hereinafter, the configuration of the 2Tr flash memory and a write operation and an erase operation will be explained.

Figure 57:
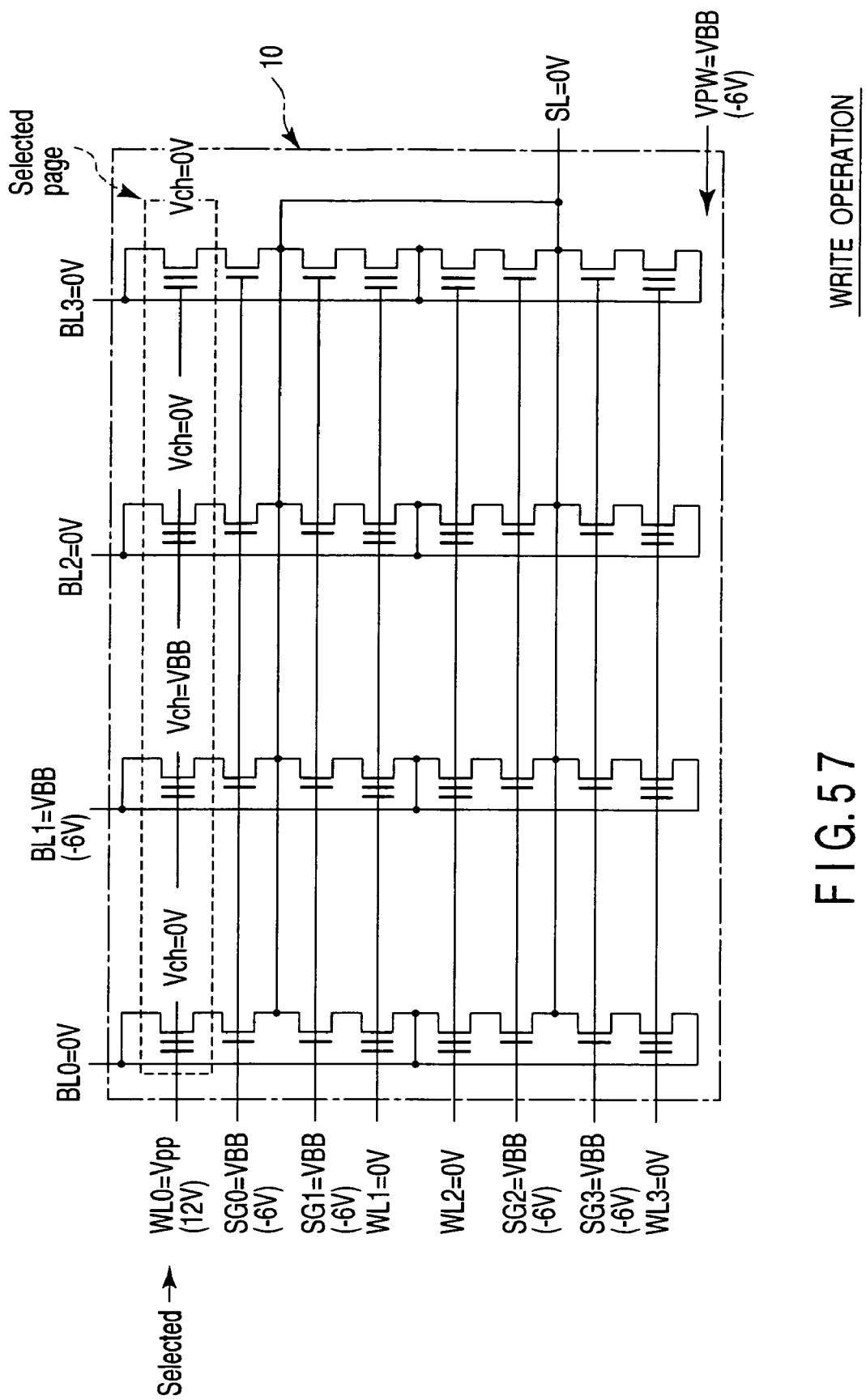
FIG. 57 is a circuit diagram of a memory cell array included in a 2Tr flash memory of the sixth embodiment in a write operation of the 2Tr flash memory.

As shown in FIG. 57, the memory cell array 10 of the 2Tr flash memory has a plurality of ((m+1)×(n+1)) memory cells MCs (m and n are natural numbers) arranged in a matrix. Each of the memory cell MCs includes a memory cell transistor MT and a select transistor ST, which have their current paths connected in series with one another. Each of the memory cell transistors MTs has a stacked gate structure that includes a floating gate formed on a semiconductor substrate with a gate insulating film interposed therebetween and a control gate on the floating gate with an inter-gate insulating film interposed therebetween. The source region of the memory cell transistor MT is connected to the drain region of the select transistor ST. Memory cells MCs adjoining each other in the column direction share the source region of the select transistor ST or the drain region of the memory cell transistor MT.

The control gates of the memory cell transistors MTs of the memory cells MCs in a same row are connected in common to any one of the word lines WL0 to WLm. The gates of the select transistors STs of the memory cells in a same row are connected in common to any one of select gate lines SGD0 to SGDm. The drains of the memory cell transistors MTs of the memory cells MCs in a same column are connected in common to any one of bit lines BL0 to BLn. The sources of the select transistors STs of the memory cells MCs are connected in common to a source line SL and then connected to the source line driver 80.

Next, the operation of the 2Tr flash memory configured as described above will be explained.

<Write Operation>

A write operation will be explained by reference to FIG. 57. FIG. 57 is a circuit diagram of the memory cell array 10 of the 2Tr flash memory 600. For the sake of simplification, a case where the number of memory cells is 4×4 will be explained. Data is written simultaneously into all of the memory cells connected to any one of the word lines. Either "0" data or "1" data is written, depending on whether electrons are injected into the floating gate of the memory cell transistor MT. Electrons are injected into the floating gate by FN tunneling. In FIG. 57, it is assumed that data is written into the memory cell transistors MTs connected to the word line WL0 and that, of the memory cell transistors MTs, "0" data is written into the one connected to the bit line BL1 and "1" data is written into the ones connected to the bit lines BL0, BL2, BL3.

First, write data ("1" or "0") is input to the latch circuits provided for the bit lines in a one-to-one correspondence. When "1" data is input, the latch circuit supplies 0V to the corresponding bit line. Conversely, when "0" data is input, VBB (e.g., –6V) is supplied to the corresponding bit line. In the example of FIG. 57, VBB is applied to the bit line BL1 and 0V is applied to the bit lines BL0, BL2, BL3.

Then, the row decoder selects any one of the word lines WL0 to WL3 and applies VPP (e.g., 12V) to the selected word line. In addition, the row decoder applies VBB to the select gate lines SG0 to SG3 and further to the substrate (p-well region) of the memory cells. Thus, all of the select transistors STs are turned off. As a result, the select transistors STs are separated electrically from the source lines SLs. In the example of FIG. 57, the row decoder applies VPP to the selected word line WL0, 0V to the unselected word lines WL1 to WL3, and VBB to all of the select gate lines SG0 to SG3.

As a result, the potential corresponding to "1" data or "0" data is supplied to the drain regions of the memory cell transistors MTs via the bit lines BL0 to BLn. Thus, VPP is applied to the selected word line WL, 0V is applied to the drain regions of the memory cell transistors MTs into which "1" data is to be written, and VBB is applied to the drain regions of the memory cell transistors MTs into which "0" data is to be written. Therefore, since the potential difference (12V) between the gate and drain of the memory cell transistor MT into which "1" data is to be written is insufficient, no electron is injected into the floating gate, with the result that the memory cell transistor MT keeps the negative threshold value. On the other hand, since the potential difference between the gate and drain of the memory cell transistor MT into which "0" data is to be written is large (18V), electrons are injected into the floating gate by FN tunneling, with the result that the threshold value of the memory cell transistor MT changes to positive. In this way, the data is written into one page of memory cells MCs simultaneously. In the example of FIG. 57, "0" data is written into the memory cell transistor MT connected to the word line WL0 and bit line BL1 (or electrons are injected into its floating gate) and "1" data is written into the memory cell transistors MTs connected to the word line WL0 and the bit lines BL0, BL2, and BL3 (or no electron is injected into their floating gates). While in FIG. 57, the potential of the source line SL is fixed to 0V, it may be made floating instead. For example, when the select transistors STs are cut off insufficiently, it is desirable that the source lines should be made floating.

<Erase Operation>

Figure 58:
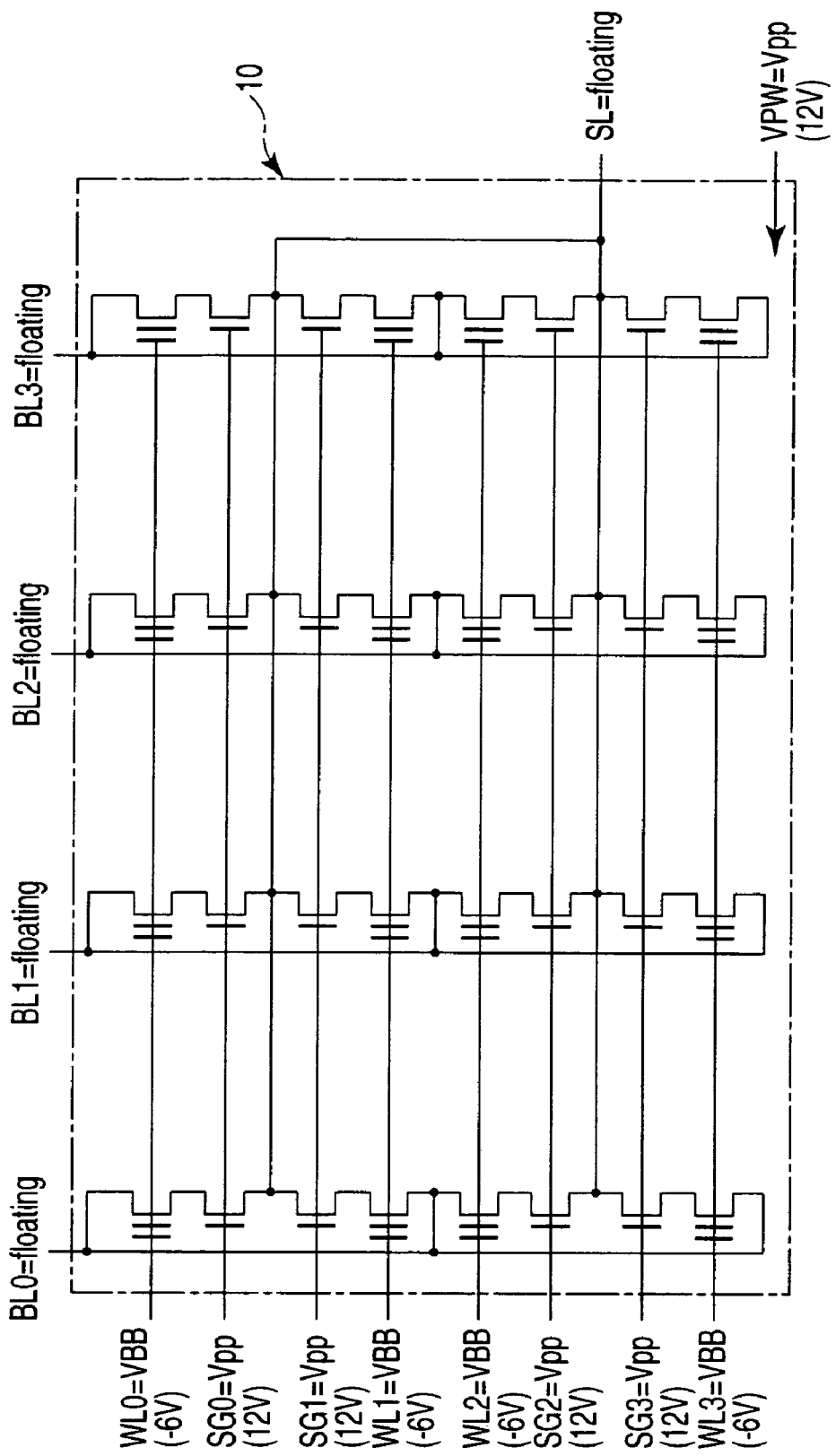
FIG. 58 is a circuit diagram of the memory cell array in an erase operation of the 2Tr flash memory of the sixth embodiment.

Next, an erase operation will be explained by reference to FIG. 58. FIG. 58 is a circuit diagram of the memory cell array 10 of the 2Tr flash memory 600. For the sake of simplification, a case where the number of memory cells is 4×4 will be explained. The data in all of the memory cells sharing a well region is erased at the same time.

In FIG. 58, the bit lines BL0 to BLn are made floating. The row decoder sets all of the word lines WL0 to WL3 to VBB and the potential VPW of the semiconductor substrate (p-well region) to VPP (12V). As a result, electrons are pulled out of the floating gates of the memory cell transistors into the semiconductor substrate by FN tunneling. Consequently, the threshold voltages of all of the memory cells MCs become negative, thereby erasing the data.

Referring to FIG. 56, the explanation is continued. The MCU 700 does processing on the basis of the program read from the 2Tr flash memory 600, in response to externally input various commands. At this time, the MCU 700 accesses the 2Tr flash memory 10 directly without intervention of an SRAM (Static Random Access Memory) or the like. The processing done by the MCU 700 includes the compression or decompression of the data input to the NAND flash memory 400 and control of an external device. In addition, the MCU 700 reads specific data from the 3Tr-NAND flash memory 500, when the data held in the NAND flash memory 400 is accessed from the outside. Then, the MCU 700 checks the read-out data against the externally input ID code or security code. If they coincide with each other, the MCU 700 permits access to the NAND flash memory 400. When access to the NAND flash memory 400 is permitted, the data in the NAND flash memory 400 is accessed from the outside (host). Specifically, the MCU 700 triggers the NAND flash memory 400 in response to the command received from the outside, thereby reading (writing) the data.

The I/O circuit 800 controls the exchange of signals between the LSI 1 and the outside.

With the LSI of the sixth embodiment, not only the effects in the above items (1) to (10) but also the following effect is obtained.

(11) It is possible to embed a plurality of types of flash memories on a single chip, while suppressing the manufacturing cost.

The memory cell transistors MTs and select transistors ST1, ST2, ST included in the NAND flash memory 400, 3Tr-NAND flash memory 500, and 2Tr flash memory 600 are formed in the same processes. That is, the individual MOS transistors can be formed in the same oxidizing process, film-forming process, impurity implanting process, and photolithographic etching process. As a result, the gate insulating film 240, inter-gate insulating film 260, the floating gates 204 and control gates 206 of the memory cell transistors MTs, and the select gates 204, 206 of the select transistors are the same in the three flash memories 400, 500, 600. In such a manufacturing method, the memory cell arrays of the three flash memories can be formed by as many processes as are required to form a single flash memory. Therefore, the manufacturing cost of a system LSI including three types of semiconductor memories can be reduced.

Furthermore, each of the NAND flash memory 400, 3Tr-NAND flash memory 500, and 2Tr flash memory 600 uses not only positive voltages but also negative voltages in a write operation and an erase operation. Therefore, the row decoders of the three flash memories can be designed to have the same configuration. They can also be made more compact and caused to operate faster than the row decoder of a flash memory using only positive voltages.

As described above, the flash memories according to the first to sixth embodiments use positive and negative voltages in a write operation and an erase operation. Using the potential difference between the positive voltage and the negative voltage, the flash memory injects electrons into the floating gate or pulls electrons out of the floating gate. Accordingly, as compared with a case where the data is written or erased using only positive voltages in a conventional flash memory, the gate breakdown voltage required for the MOS transistors in the row decoder can be lowered. Thus, the gate insulating film can be made thinner. Moreover, since the absolute value of the voltage dealt with can be lowered, the size of the row decoder can be reduced, which enables the size of the flash memory to be made smaller.

Furthermore, the row decoder is divided in two, one of which supplies a positive voltage and the other of which supplies a negative voltage. Therefore, for example, the same voltage as that of the well region can be applied directly to the unselected word lines. As a result, almost no voltage stress is applied to the gate insulating films of the memory cells connected to the unselected word lines. Accordingly, the operation reliability of the flash memory can be improved. The isolating transistor that switches between the row address decode circuit and the word line is designed to alleviate an electric field at one of its source and drain which is connected directly to the word line. Therefore, the occurrence of a breakdown can be suppressed in the isolating transistor.

In addition, use of negative voltages in a write operation enables data whose threshold voltage is negative to be written into multivalued memories. As a result, a voltage margin between individual data items can be set larger, which improves the operation reliability of the flash memory.

Figure 59:
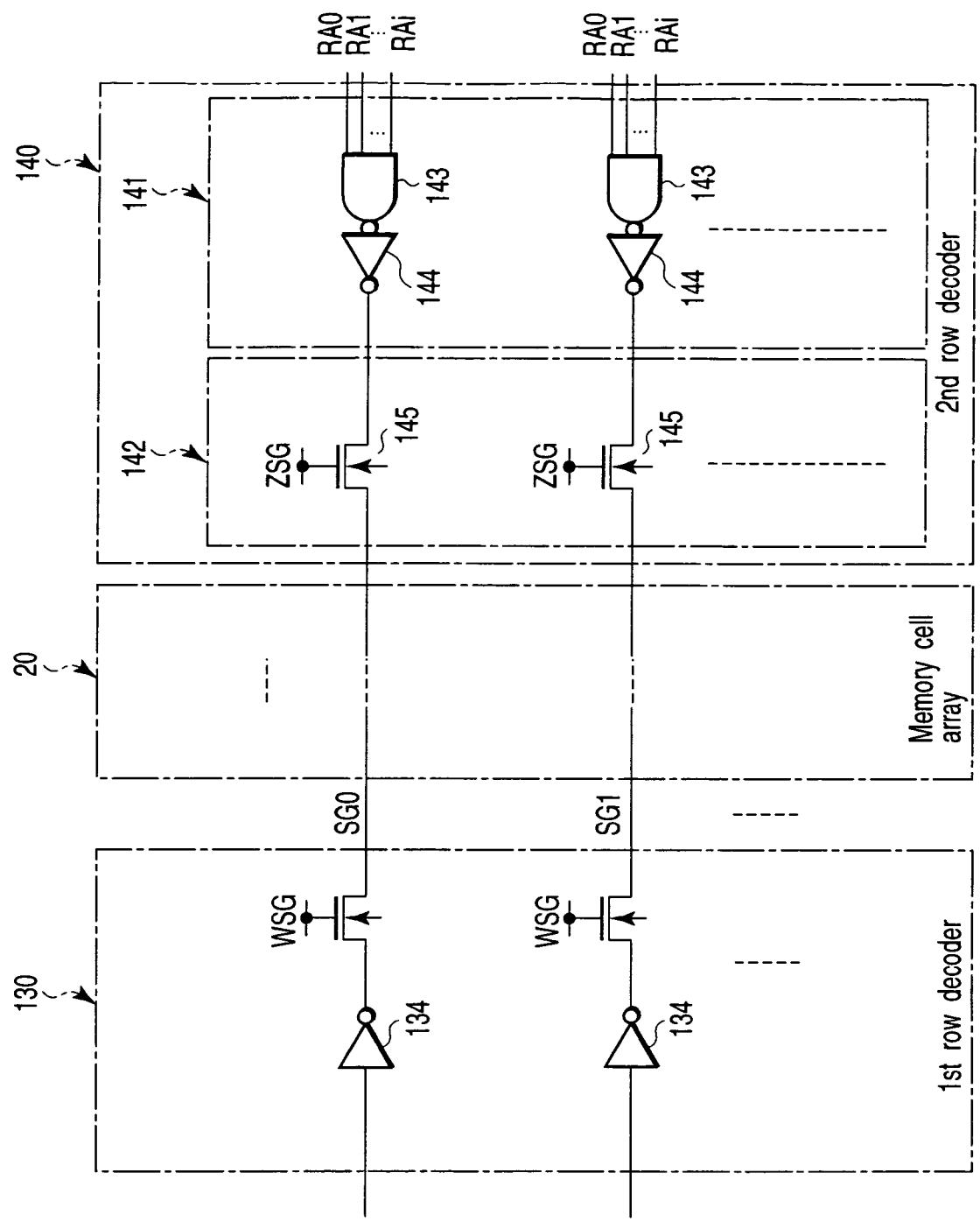
FIG. 59 is a circuit diagram of a row decoder included in a flash memory according to a first modification of the first to sixth embodiments.

In the above embodiments, the row decoders have been configured to apply voltages to the word lines. As for a configuration for selecting a select gate line, for example, a configuration as shown in FIG. 59 may be used. FIG. 59 is a circuit diagram of the first and second row decoders 130, 140, particularly showing a configuration for selecting a gate line.

First, a second row address decode circuit group 141, which has NAND gates 143 and inverters 144, decodes row address signals RA0 to RAi, thereby producing a row address signal. The outputs of the inverters 144 are outputted as a row address decode signal.

A switch element group 142 has n-channel MOS transistors 145. The n-channel MOS transistors 145 are provided for the select gate lines SG0 to SGm in a one-to-one correspondence. The outputs of the inverters 144 are supplied to the select gate lines via the current paths of the n-channel MOS transistors 145. A control signal ZSG is input to the gates of the n-channel MOS transistors 145.

The first row decoder 130 includes n-channel MOS transistors 133 and inverters 134, which are provided for the selected gate lines in a one-to-one correspondence.

In the above configuration, to select any one of the select gate lines, the second row decoder 140 decodes a row address signal. Then, the second row decoder 140 applies a voltage to the select gate line corresponding to the obtained row address decode signal. The first row decoder 130 applies a voltage to the unselected select gate lines simultaneously. When the first row decoder 130 applies a voltage to the select gate lines, the MOS transistors 133 are turned on and the MOS transistors 145 are turned off. Conversely, when the second row decoder 140 applies a voltage to the select gate lines, the MOS transistors 133 are turned off and the MOS transistors 145 are turned on.

Furthermore, the configurations of the isolating transistors 28, 28-1, 28-2 are not limited to those explained in the above embodiments. For example, as shown in FIG. 60, each of the isolating transistors 28, 28-1, 28-2 may further include an LDD region 255. Use of the LDD region 255 makes it possible to alleviate the concentration of an electric field in the source and drain region of the isolating transistor. Moreover, as shown in FIG. 61, the LDD length of one of the source and drain which is connected directly to the word line may be made longer than that of the other. This enables the concentration of an electric field to be alleviated effectively.

Figure 62:
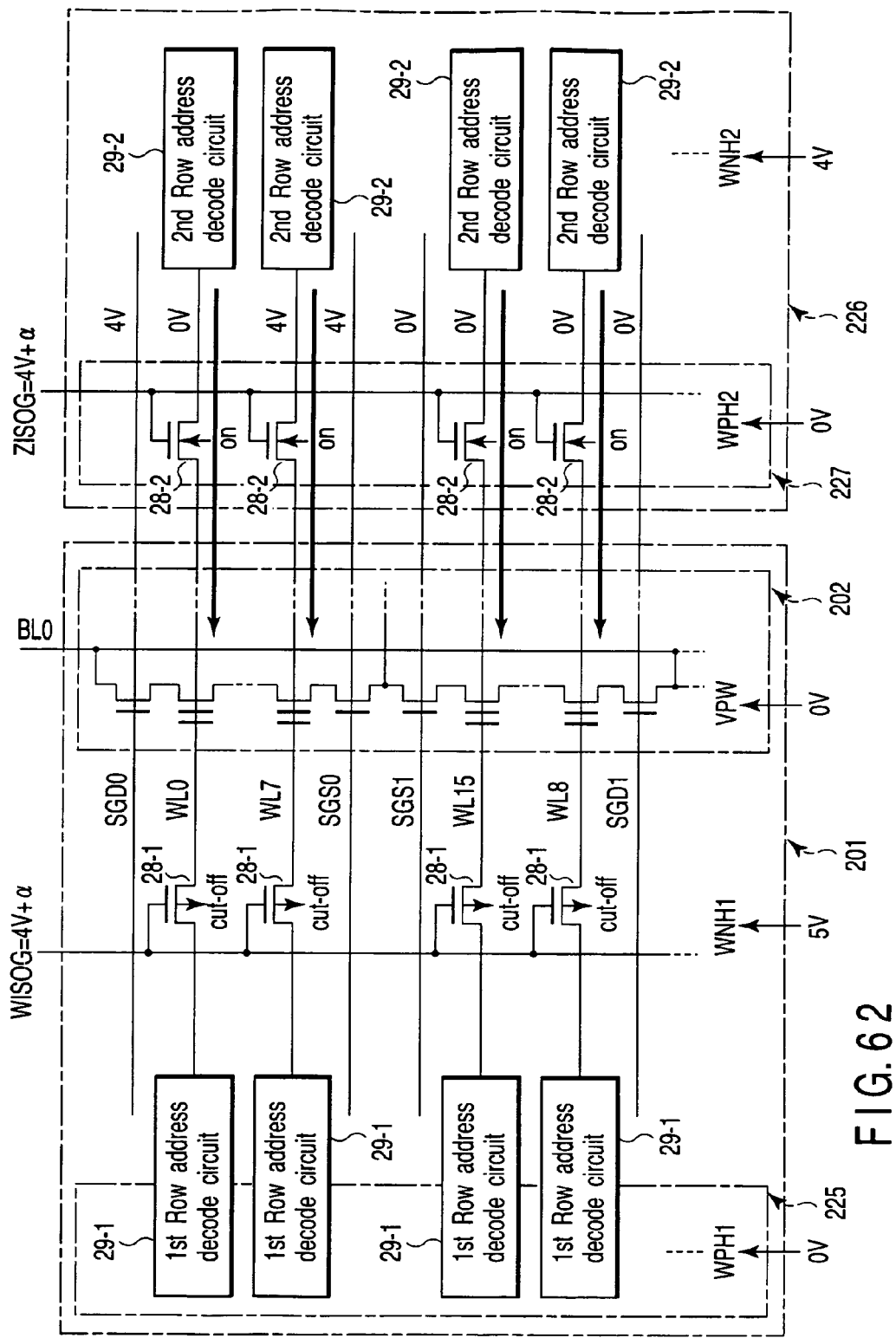
FIG. 62 is a circuit diagram of a memory cell array and a first and a second row decoder included in a NAND flash memory according to a modification of the third embodiment, which helps explain a read operation.

As for the read operation of the NAND flash memory explained in the third embodiment, the first row decoder 130 has applied a voltage to the word lines. Instead of the first row decoder 130, the second row decoder 140 may apply a voltage to the word lines as shown in FIG. 62. As shown in FIG. 62, the second row decoder 140 selects the word line WL0 in the selected block. Specifically, the second row address decode circuit 29-2 corresponding to the word line WL0 outputs 0V and the second row address decode circuits 29-2 corresponding to the other word lines WL1 to WL7 output Vpass2. The first row address decode circuits 29-1 corresponding to the word lines WL8 to WLm in the unselected blocks output 0V. Then, WISOG is set to 4V+α. Here, α is a voltage to turn on the isolating transistors 28-2. Thus, all of the isolating transistors 28-2 are turned on. As a result, 0V is applied to the word line WL0 and the first row address decode circuit 29-1 applies Vpass2 to the word lines WL1 to WL7. Here, 4V+α is also applied to ZISOG. All of the isolating transistors 28-1 are in the cut-off state.

In the above embodiments, only a negative voltage has been used as the write inhibit voltage VPI. However, not only a negative voltage but also a positive voltage or 0V may be used as the write inhibit voltage VPI. Moreover, a voltage used as the write inhibit voltage VPI may be determined by the number of times writing was done or erasing was done.

Next, an application of the flash memory will be explained. FIG. 63 shows an example of a memory card. As shown in FIG. 63, the memory card 900 includes a flash memory 3 (3Tr-NAND flash memory, NAND flash memory, or 2Tr flash memory) explained in the first to sixth embodiments. The flash memory 3 receives specific controls signals and data from an external unit (not shown). In addition, the flash memory 3 outputs specific control signals and data to the external unit.

A signal line (DAT), a command line enable signal line (CLE), an address line enable signal line (ALE) and a ready/busy signal line (R/B) are connected to the memory card 10 having the flash memory 3. The signal line (DAT) transfers data, address or command signals. The command line enable signal line (CLE) transfers a signal, which indicates that a command signal is transferred on the signal line (DAT). The address line enable signal line (ALE) transfers a signal, which indicates that an address signal is transferred on the signal line (DAT). The ready/busy signal line (R/B) transfers a signal, which indicates whether the memory device is ready, or not.

Another exemplary implementation is shown in FIG. 64. The memory card shown in FIG. 64 differs from the memory card presented in FIG. 63 in that the memory card of FIG. 64 includes, in addition to the memory device, a controller 910 which controls the flash memory 3 and receives/transfers predetermined signals from/to an external device (not shown).

The controller 910 includes interface units (I/F) 911, 912, a microprocessor unit (MPU) 913, a buffer RAM 914 and an error correction code unit (ECC) 915. The interface units (I/F) 911, 912 receives/outputs predetermined signals from/to an external device (not shown). The microprocessor unit 913 converts a logical address into a physical address. The buffer RAM 914 stores data temporarily. The error correction code unit 915 generates an error correction code. A command signal line (CMD), a clock signal line (CLK) and a signal line (DAT) are connected to the memory card 900. It should be noted that the number of the control signal lines, bit width of the signal line (DAT) and a circuit construction of the controller could be modified suitably.

Figure 65:
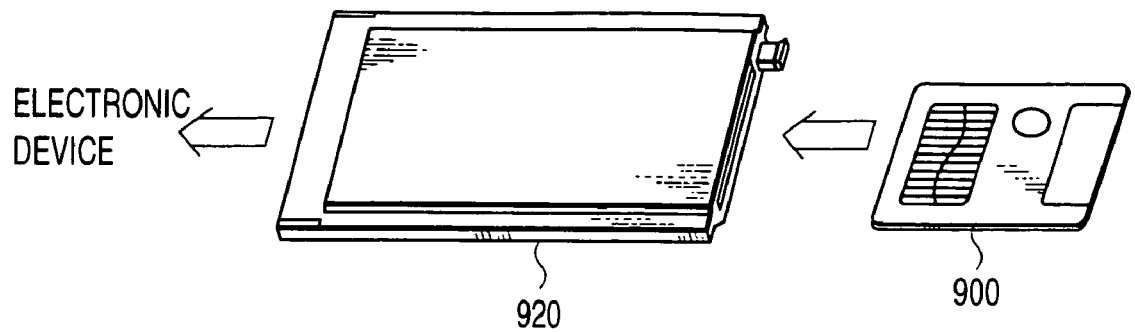
FIG. 65 shows an outward appearance of a memory card including a flash memory according to the first to sixth embodiments and a card holder.

FIG. 65 shows another application. As shown in FIG. 65, the memory card 900 is inserted into a cardholder 920, which is then connected to electronic equipment (not shown). The cardholder 920 may have a part of the function of the controller 910.

Figure 66:
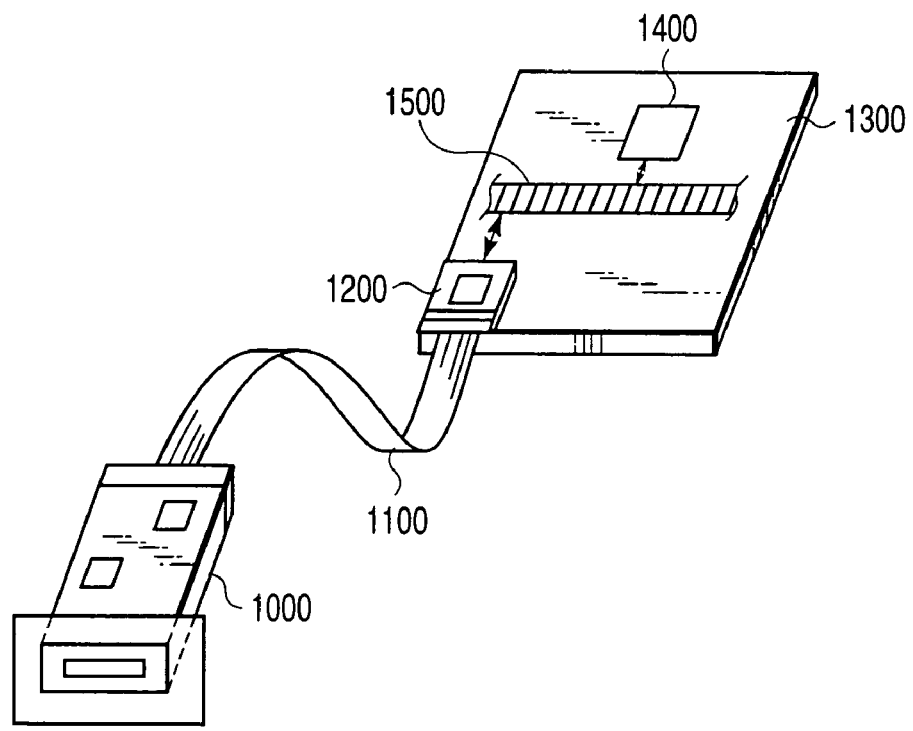
FIG. 66 shows an outward appearance of a connection unit which connects with a memory card including a flash memory according to the first to sixth embodiments.

FIG. 66 shows another application. As shown in FIG. 66, the memory card 900 or the cardholder 920 in which the memory card 900 has been inserted is inserted into a connection unit 1000. The connection unit 1000 is connected to a board 1300 via a connection cable 1100 and an interface circuit 1200. The board 1300 includes a CPU 1400 and a bus 1500.

Figure 67:
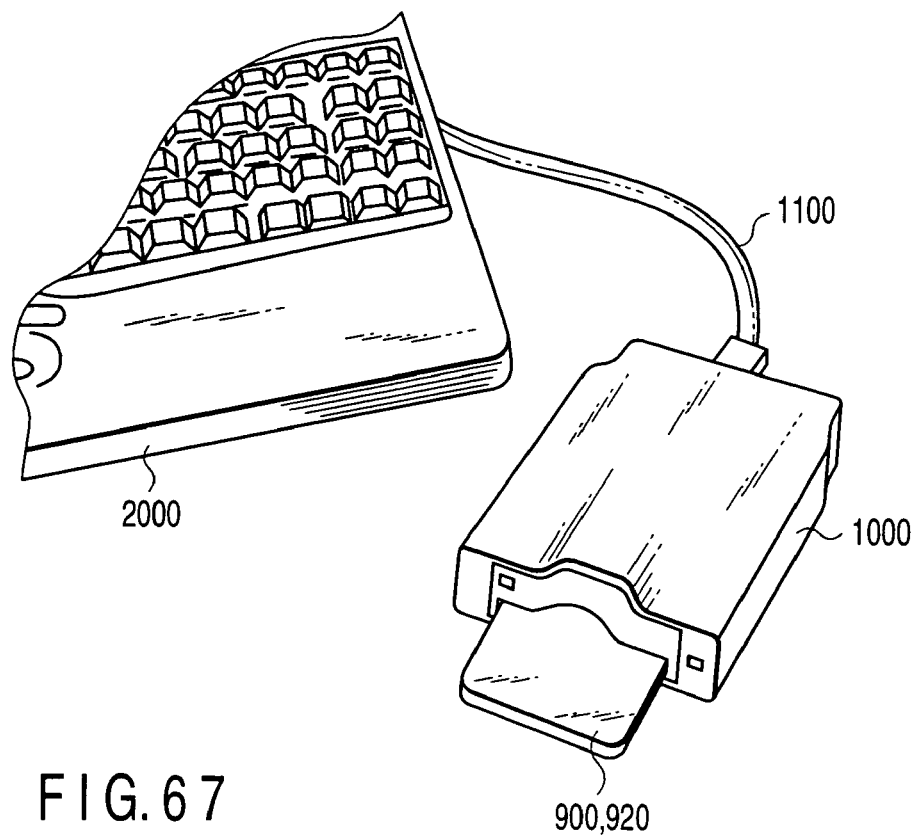
FIG. 67 shows an outward appearance of a connection unit which connects with a memory card including a flash memory according to the first to sixth embodiments.

FIG. 67 shows another application. The memory card 900 or the cardholder 920 in which the memory card 900 has been inserted is inserted into the connection unit 1000. The connection unit 1000 is connected to a personal computer 2000 via the connection cable 1100.

Figure 68:
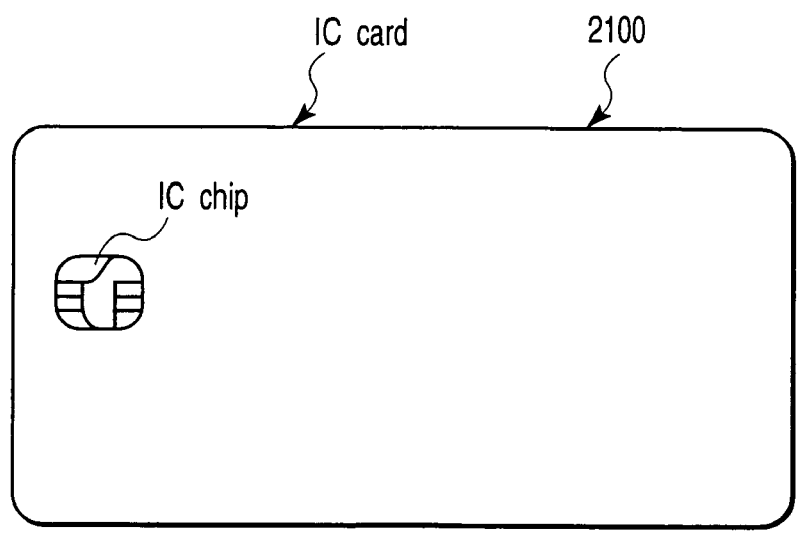
FIG. 68 shows an outward appearance of an IC card including a flash memory according to the first to sixth embodiments.
Figure 69:
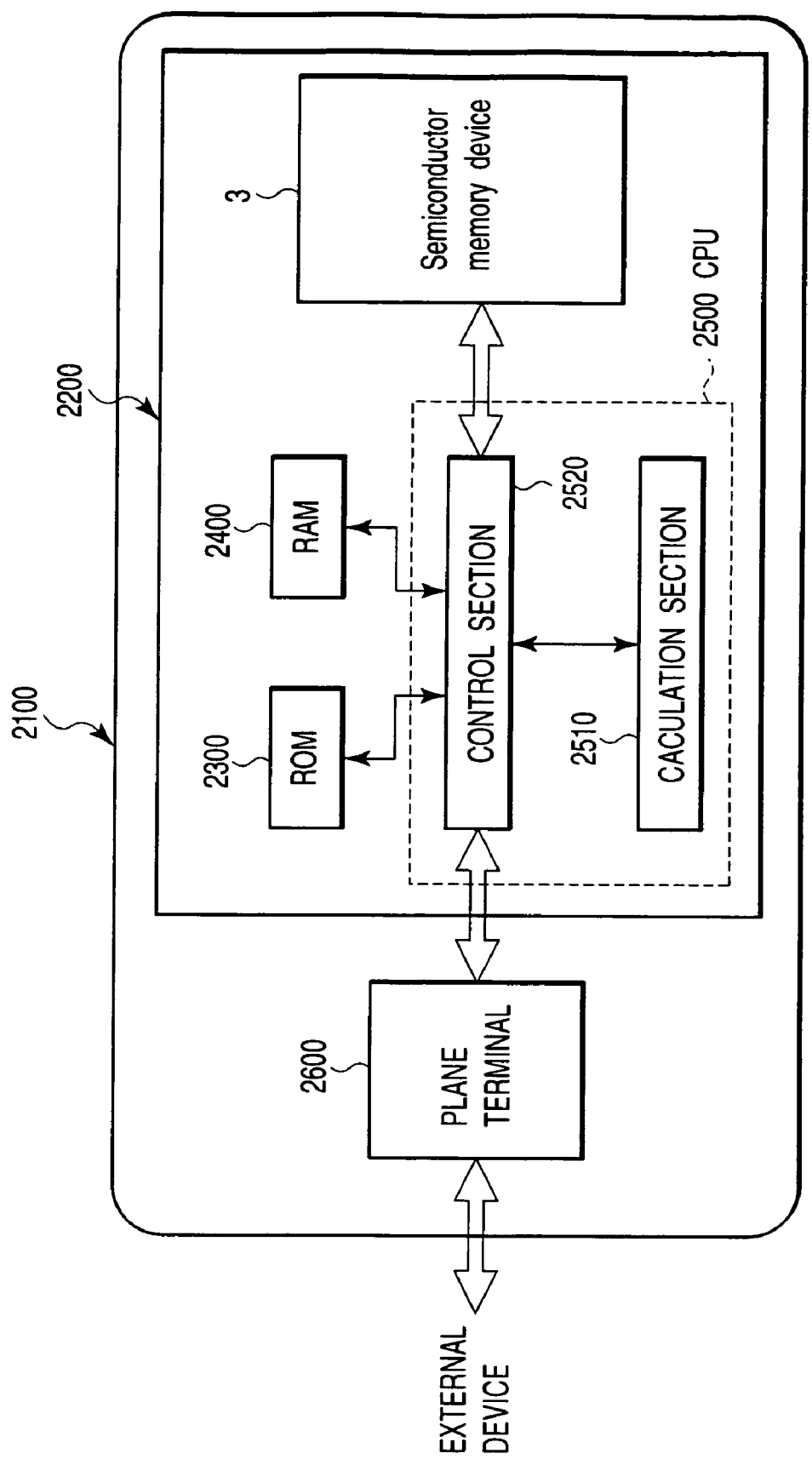
FIG. 69 is a block diagram of an IC card including a flash memory according to the first to sixth embodiments.

FIGS. 68 and 69 show another application. As shown in FIGS. 68 and 69, an IC card 2100 includes an MCU 2200. The MCU 2200 includes the flash memory 3 according to any one of the above embodiments, other circuits, including ROM 2300 and RAM 2400, and a CPU 2500. The IC card 2100 is connectable to the MCU 2200 via a plane connecting terminal 2600 connected to the MCU 2200 and provided on the IC card 2100. The CPU 2500 includes a computing section 2510 and a control section 2520 connected to the flash memory 3, ROM 2300, and RAM 2400. For example, the MPU 2200 is provided on one side of the IC card 2100 and the plane connecting terminal 2600 is provided on the other side.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   memory cells which include memory cell transistors, each of the transistors having a floating gate and a control gate;
   a memory cell array in which the memory cells are arranged in a matrix;
   bit lines each of which connects in common the drains of the memory cell transistors in a same column electrically;
   word lines each of which connects in common the control gates of the memory cell transistors in a same row;
   latch circuits which are provided for the bit lines in a one-to-one correspondence and which hold write data;
   a voltage generator which generates a negative voltage and a positive voltage;
   first row decoders which are provided for the word lines in a one-to-one correspondence and which apply the positive voltage generated by the voltage generator to the word lines in a write operation and in an erase operation;
   second row decoders which are provided for the word lines in a one-to-one correspondence and which apply the negative voltage generated by the voltage generator to the word lines in a write operation and in an erase operation;
   first isolating transistors which are provided for the word lines in a one-to-one correspondence and which switch between the first row decoders and the word lines;
   second isolating transistors which are provided for the word lines in a one-to-one correspondence and which switch between the second row decoders and the word lines;
   a first well region of a first conductivity type which is formed at the surface of a semiconductor substrate;
   a second well region of the first conductivity type which is formed at the surface of the semiconductor substrate and which is isolated from the first well region;
   a third well region of a second conductivity type which is formed at the surface of the first well region; and
   a fourth well region of the second conductivity type which is formed at the surface of the second well region,
   wherein the first isolating transistor is a MOS transistor of the second conductivity type formed on the first well region, a part of the first row decoder is formed on the first well region, the second isolating transistor is a MOS transistor of the first conductivity type formed on the fourth well region, a part of the second row decoder is formed on the fourth well region, and the memory cell array is formed on the third well region.

2. The semiconductor memory device according to claim 1, further comprising:
   first contact plugs each of which is formed on one of the source and drain of the corresponding one of the first isolating transistors and is connected to the corresponding one of the word lines; and
   second contact plugs each of which is formed on one of the source and drain of the corresponding one of the second isolating transistors and is connected to the corresponding one of the word lines,
   wherein each of the first row decoders includes a first MOS transistor and a third contact plug which is formed on one of the source and drain of the first MOS transistor and is connected electrically to the other of the source and drain of the corresponding one of the first isolating transistors, each of the second row decoders includes a second MOS transistor and a fourth contact plug which is formed on one of the source and drain of the second MOS transistor and is connected electrically to the other of the source and drain of the corresponding one of the second isolating transistors, the distance between the gate of the first isolating transistor and the first contact plug is larger than the distance between the gate of the first MOS transistor and the third contact plug, and the distance between the gate of the second isolating transistor and the second contact plug is larger than the distance between the gate of the second MOS transistor and the fourth contact plug.

3. The semiconductor memory device according to claim 2, wherein the gate length of the first isolating transistor is the same as that of the first MOS transistor, and the gate length of the second isolating transistor is the same as that of the second MOS transistor.

4. The semiconductor memory device according to claim 1, wherein each of the memory cells further includes a first select transistor which has its drain connected to the source of the corresponding one of the memory cell transistors, and a second select transistor which has its source connected to the drain of the corresponding one of the memory cell transistors and its drain connected to the corresponding one of the bit lines, and in a write operation, the first row decoder corresponding to the selected word line supplies the positive potential to the selected word line via the current path of the first isolating transistor, the second row decoder corresponding to the selected word line is separated electrically from the selected word line by the second isolating transistor, the second row decoders corresponding to the unselected word lines supply the negative voltage to the unselected word lines via the current paths of the second isolating transistors, and the first row decoders corresponding to the unselected word lines are separated electrically from the unselected word lines by the first isolating transistors, and in an erase operation, the second row decoder corresponding to the selected word line supplies the negative potential to the selected word line via the current path of the corresponding one of the second isolating transistors, the first row decoder corresponding to the selected word line is separated electrically from the selected word line by the first isolating transistor, the first row decoders corresponding to the unselected word lines supply the positive potential to the unselected word lines via the current paths of the first isolating transistors, and the second row decoders corresponding to the unselected word lines are separated electrically from the unselected word lines by the second isolating transistors.

5. The semiconductor memory device according to claim 1, wherein each of the memory cells further includes a first select transistor which has its drain connected to the source of the corresponding one of the memory cell transistors, and a second select transistor which has its source connected to the drain of the corresponding one of the memory cell transistors and its drain connected to the corresponding one of the bit lines, and the gates of the first isolating transistors are connected to one another and the gates of the second isolating transistors are connected to one another, and in a write operation and in an erase operation, 0V is applied to the gates of the first and second isolating transistors.

6. The semiconductor memory device according to claim 1, wherein each of the memory cells further includes a first select transistor which has its drain connected to the source of the corresponding one of the memory cell transistors, and a second select transistor which has its source connected to the drain of the corresponding one of the memory cell transistors and its drain connected to the corresponding one of the bit lines, and in a read operation, a row select signal related to the first and second select transistors is supplied only to either the first select transistors or the second select transistors and a voltage independent of the row select signal is applied to the others of the first and second select transistors.

7. The semiconductor memory device according to claim 1, wherein each of the memory cells includes more than one of the memory cell transistors which have current paths connected in series, a first select transistor which has its drain connected to the source at the end of the series combination of the memory cell transistors, and a second select transistor which has its source connected to the drain at the end of the series combination of the memory cell transistors and its drain connected to the corresponding one of the bit lines, and each of the memory cell transistors has a plurality of threshold voltages, at least two of which are negative voltages.

8. A semiconductor memory device comprising:

memory cells which include memory cell transistors, each of the transistors having a floating gate and a control gate;

a memory cell array in which the memory cells are arranged in a matrix;

bit lines each of which connects in common the drains of the memory cell transistors in a same column electrically;

word lines each of which connects in common the control gates of the memory cell transistors in a same row;

latch circuits which are provided for the bit lines in a one-to-one correspondence and which hold write data;

a voltage generator which generates a negative voltage and a positive voltage;

row decoders which are provided for the word lines in a one-to-one correspondence and which apply the positive and negative voltages generated by the voltage generator to the word lines in a write operation and in an erase operation and each of which includes a first MOS transistor;

isolating transistors which are provided for the word lines in a one-to-one correspondence and which switch between the row decoders and the word lines;

first contact plugs each of which is formed on one of the source and drain of the corresponding one of the isolating transistors and is connected to the corresponding one of the word lines; and second contact plugs each of which is formed on one of the source and drain of the corresponding one of the first MOS transistors and is connected electrically to the other of the source and drain of the corresponding one of the isolating transistors, the distance between the gate of the isolating transistor and the first contact plug being larger than the distance between the gate of the first MOS transistor and the second contact plug.

9. The semiconductor memory device according to claim 8, further comprising:
a first well region of a first conductivity type which is formed at the surface of a semiconductor substrate; and
a second well region of a second conductivity type which is formed at the surface of the first well region,
wherein the isolating transistor is formed on the first well region, a part of the row decoder is formed on the first well region, and the memory cell array is formed on the second well region.

10. The semiconductor memory device according to claim 8, wherein the gate length of the isolating transistor is the same as that of the first MOS transistor.

11. The semiconductor memory device according to claim 8, wherein each of the memory cells further includes a first select transistor which has its drain connected to the source of the corresponding one of the memory cell transistors, and
a second select transistor which has its source connected to the drain of the corresponding one of the memory cell transistors and its drain connected to the corresponding one of the bit lines, and
in a write operation, the row decoder corresponding to the selected word line supplies the positive potential to the selected word line via the current path of the corresponding one of the isolating transistors and the row decoders corresponding to the unselected word lines are separated electrically from the unselected word lines by the isolating transistors, and
in an erase operation, the row decoder corresponding to the selected word line supplies the negative potential to the selected word line via the current path of the corresponding one of the isolating transistors and the row decoders corresponding to the unselected word lines supply the positive potential to the unselected word lines via the current paths of the isolating transistors.

12. The semiconductor memory device according to claim 8, wherein each of the memory cells further includes a first select transistor whose drain is connected to the source of the corresponding one of the memory cell transistors, and
a second select transistor which has its source connected to the drain of the corresponding one of the memory cell transistors and its drain connected to the corresponding one of the bit lines, and
the gates of the isolating transistors are connected to one another, and
in a read operation, the negative voltage is applied to the gates of the isolating transistors.

13. The semiconductor memory device according to claim 8, wherein each of the memory cells further includes a first select transistor which has its drain connected to the source of the corresponding one of the memory cell transistors, and
a second select transistor which has its source connected to the drain of the corresponding one of the memory cell transistors and its drain connected to the corresponding one of the bit lines, and
in a read operation, a row select signal related to the first and second select transistors is supplied only to either the first select transistors or the second select transistors and a voltage independent of the row select signal is applied to the others of the first and second select transistors.

14. The semiconductor memory device according to claim 8, wherein each of the memory cells includes more than one of the memory cell transistors which have current paths connected in series,
a first select transistor which has its drain connected to the source at the end of the series combination of the memory cell transistors, and
a second select transistor which has its source connected to the drain at the end of the series combination of the memory cell transistors and its drain connected to the corresponding one of the bit lines, and
each of the memory cell transistors has a plurality of threshold voltages, at least two of which are negative voltages.

15. A semiconductor memory device comprising:
NAND cells each of which includes a first select transistor, a second select transistor, and a plurality of memory cell transistors which have current paths connected in series between the source of the first select transistor and the drain of the second select transistor, each of the memory cell transistors including a floating gate and a control gate and having a plurality of threshold voltages, at least two of which are negative;
a memory cell array in which the NAND cells are arranged in a matrix;
bit lines each of which connects in common the drains of the first select transistors in a same column;
first select gate lines each of which connects in common the gates of the first select transistors in a same row;
word lines each of which connects in common the control gates of the memory cell transistors in a same row;
second select gate lines each of which connects in common the gates of the second select transistors in a same row;
latch circuits which are provided for the bit lines in a one-to-one correspondence and which hold write data;
a voltage generator which generates a negative voltage and a positive voltage;
first row decoders which are provided for the word lines in a one-to-one correspondence and which apply the positive voltage generated by the voltage generator to the word lines in a write operation and in an erase operation;
second row decoders which are provided for the word lines in a one-to-one correspondence and which apply the negative voltage generated by the voltage generator to the word lines in a write operation and in an erase operation;
first isolating transistors which are provided for the word lines in a one-to-one correspondence and which switch between the first row decoders and the word lines;
second isolating transistors which are provided for the word lines in a one-to-one correspondence and which switch between the second row decoders and the word lines;
a first well region of a first conductivity type which is formed at the surface of a semiconductor substrate, the first isolating transistors being MOS transistors of the second conductivity type formed on the first well region, a part of the first row decoder being formed on the first well region;
a second well region of the first conductivity type which is formed at the surface of the semiconductor substrate and which is isolated from the first well region;
a third well region of a second conductivity type which is formed at the surface of the first well region, the memory cell array being formed on the third well region; and
a fourth well region of the second conductivity type which is formed at the surface of the second well region, the second isolating transistors being MOS transistors of the first conductivity type formed on the fourth well region, a part of the second row decoder being formed on the fourth well region.

16. A memory card comprising a semiconductor memory device recited in claim 1.

17. The memory card according to claim 16, further comprising a control circuit which controls the semiconductor memory device.

* * * * *